US008696808B2

(12) United States Patent
Yamazaki et al.

(10) Patent No.: US 8,696,808 B2
(45) Date of Patent: Apr. 15, 2014

(54) LASER IRRADIATION APPARATUS

(75) Inventors: Shunpei Yamazaki, Tokyo (JP); Hisashi Ohtani, Tochigi (JP); Masaaki Hiroki, Kanagawa (JP); Koichiro Tanaka, Kanagawa (JP); Aiko Shiga, Kanagawa (JP); Satoshi Murakami, Tochigi (JP); Mai Akiba, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 1197 days.

(21) Appl. No.: 11/514,969

(22) Filed: Sep. 5, 2006

(65) Prior Publication Data
US 2007/0000428 A1    Jan. 4, 2007

Related U.S. Application Data

(62) Division of application No. 10/305,367, filed on Nov. 27, 2002, now Pat. No. 7,105,048.

(30) Foreign Application Priority Data

Nov. 27, 2001    (JP) ................................. 2001-366027

(51) Int. Cl.
*C30B 1/04* (2006.01)
(52) U.S. Cl.
USPC .............. 117/4; 117/5; 117/8; 117/9; 117/10; 117/931
(58) Field of Classification Search
USPC .................................... 117/4, 5, 8, 9, 10, 931
See application file for complete search history.

(56) References Cited

U.S. PATENT DOCUMENTS

| 4,234,358 A | 11/1980 | Cellar et al. |
| 4,330,363 A | 5/1982 | Biegesen et al. |

(Continued)

FOREIGN PATENT DOCUMENTS

| JP | 62-104117 | 5/1987 |
| JP | 01-148485 | 6/1989 |

(Continued)

OTHER PUBLICATIONS

Hara, et al., High Performance Poly-Si TFTs on a Glass by a Stable Scanning CW Laser Lateral Crystallization, IEEE, IEDM, Jan. 2001, pp. 01-747 to 01-750.

(Continued)

*Primary Examiner* — Bob M Kunemund
(74) *Attorney, Agent, or Firm* — Nixon Peabody LLP; Jeffrey L. Costellia

(57) ABSTRACT

Each region, which should be left on a substrate after patterning, of a semiconductor film is grasped in accordance with a mask. Then, each region to be scanned with laser light is determined so that at least the region to be obtained through the patterning is crystallized, and a beam spot is made to hit the region to be scanned, thereby partially crystallizing the semiconductor film. Each portion with low output energy of the beam spot is shielded by a slit. In the present invention, the laser light is not scanned and irradiated onto the entire surface of the semiconductor film but is scanned such that at least each indispensable portion is crystallized to a minimum. With the construction described above, it becomes possible to save time taken to irradiate the laser light onto each portion to be removed through the patterning after the crystallization of the semiconductor film.

27 Claims, 49 Drawing Sheets

(56) References Cited

U.S. PATENT DOCUMENTS

| | | |
|---|---|---|
| 4,353,061 A | 10/1982 | Beck |
| 4,439,245 A | 3/1984 | Wu |
| 4,692,191 A | 9/1987 | Maeda et al. |
| 4,780,590 A | 10/1988 | Griner et al. |
| 4,796,964 A | 1/1989 | Connell et al. |
| 4,861,964 A | 8/1989 | Shinohara |
| 4,969,699 A | 11/1990 | Noguchi et al. |
| 5,028,102 A | 7/1991 | Ogura et al. |
| RE33,947 E | 6/1992 | Shinohara |
| 5,139,609 A | 8/1992 | Fields et al. |
| 5,144,616 A | 9/1992 | Yasukawa et al. |
| 5,175,425 A | 12/1992 | Spratte et al. |
| 5,225,886 A | 7/1993 | Koizumi et al. |
| 5,291,012 A | 3/1994 | Shimizu et al. |
| 5,309,273 A | 5/1994 | Mori et al. |
| 5,365,875 A | 11/1994 | Asai et al. |
| 5,413,958 A | 5/1995 | Imahashi et al. |
| 5,569,930 A | 10/1996 | Imai |
| 5,589,406 A | 12/1996 | Kato et al. |
| 5,591,668 A | 1/1997 | Maegawa et al. |
| 5,594,752 A | 1/1997 | Endriz |
| 5,615,198 A | 3/1997 | Kubokawa |
| 5,643,826 A | 7/1997 | Ohtani et al. |
| 5,696,003 A | 12/1997 | Makita et al. |
| 5,708,252 A | 1/1998 | Shinohara et al. |
| 5,780,207 A | 7/1998 | Mohapatra et al. |
| 5,789,763 A | 8/1998 | Kato et al. |
| 5,817,548 A | 10/1998 | Noguchi et al. |
| 5,822,292 A | 10/1998 | Akutsu et al. |
| 5,841,097 A | 11/1998 | Esaka et al. |
| 5,868,952 A | 2/1999 | Hatakeyama et al. |
| 5,943,593 A | 8/1999 | Noguchi et al. |
| 5,998,759 A | 12/1999 | Smart |
| 6,059,873 A * | 5/2000 | Yamaguchi et al. ............... 117/7 |
| 6,071,765 A | 6/2000 | Noguchi et al. |
| 6,096,581 A | 8/2000 | Zhang et al. |
| 6,136,632 A | 10/2000 | Higashi |
| 6,149,988 A | 11/2000 | Shinohara et al. |
| 6,172,820 B1 * | 1/2001 | Kuwahara ..................... 359/719 |
| 6,176,922 B1 | 1/2001 | Aklufi et al. |
| 6,180,992 B1 | 1/2001 | Gobel et al. |
| 6,261,856 B1 | 7/2001 | Shinohara et al. |
| 6,278,680 B1 | 8/2001 | Miyauchi et al. |
| 6,341,042 B1 | 1/2002 | Matsunaka et al. |
| 6,365,933 B1 | 4/2002 | Yamazaki et al. |
| 6,372,039 B1 | 4/2002 | Okumura et al. |
| 6,391,690 B2 | 5/2002 | Miyasaka |
| 6,393,042 B1 | 5/2002 | Tanaka |
| 6,407,012 B1 | 6/2002 | Miyasaka et al. |
| 6,504,650 B1 | 1/2003 | Alfrey |
| 6,509,212 B1 | 1/2003 | Zhang et al. |
| 6,516,009 B1 | 2/2003 | Tanaka |
| 6,576,919 B1 | 6/2003 | Yoshida |
| 6,583,381 B1 | 6/2003 | Duignan |
| 6,590,698 B1 | 7/2003 | Ohtsuki et al. |
| 6,632,749 B2 | 10/2003 | Miyasaka et al. |
| 6,657,154 B1 | 12/2003 | Tanabe et al. |
| 6,660,085 B2 | 12/2003 | Hara et al. |
| 6,700,096 B2 | 3/2004 | Yamazaki et al. |
| 6,723,590 B1 | 4/2004 | Zhang et al. |
| 6,737,672 B2 | 5/2004 | Hara et al. |
| 6,841,797 B2 | 1/2005 | Isobe et al. |
| 6,861,614 B1 | 3/2005 | Tanabe et al. |
| 6,952,510 B1 | 10/2005 | Karlsen et al. |
| 7,015,118 B2 | 3/2006 | Wakayama |
| 7,037,809 B2 | 5/2006 | Yamazaki et al. |
| 7,050,878 B2 | 5/2006 | Yamazaki et al. |
| 7,113,527 B2 | 9/2006 | Tanaka |
| 7,135,389 B2 | 11/2006 | Yamazaki et al. |
| 7,214,573 B2 | 5/2007 | Yamazaki et al. |
| 7,439,115 B2 | 10/2008 | Yamazaki et al. |
| 7,466,735 B2 | 12/2008 | Tanaka |
| 7,615,424 B2 | 11/2009 | Tanaka et al. |
| 2001/0038127 A1 | 11/2001 | Yamazaki et al. |
| 2001/0055830 A1 | 12/2001 | Yoshimoto |
| 2002/0000426 A1 | 1/2002 | Mead et al. |
| 2002/0031876 A1 | 3/2002 | Hara et al. |
| 2002/0047580 A1 | 4/2002 | Kunii et al. |
| 2002/0054231 A1 | 5/2002 | Masuyuki |
| 2002/0094008 A1 | 7/2002 | Tanaka |
| 2002/0145711 A1 | 10/2002 | Magome et al. |
| 2002/0146873 A1 | 10/2002 | Tanaka |
| 2002/0182785 A1 | 12/2002 | Miyairi |
| 2003/0021014 A1 | 1/2003 | Barenburg et al. |
| 2003/0024905 A1 | 2/2003 | Tanaka |
| 2003/0048819 A1 | 3/2003 | Nagano et al. |
| 2003/0052105 A1 | 3/2003 | Nagano et al. |
| 2003/0211714 A1 | 11/2003 | Yamazaki et al. |
| 2003/0228723 A1 | 12/2003 | Yamazaki et al. |
| 2004/0040938 A1 | 3/2004 | Yamazaki et al. |
| 2004/0060515 A1 | 4/2004 | Tanabe et al. |
| 2004/0161913 A1 | 8/2004 | Kawasaki et al. |
| 2005/0277028 A1 | 12/2005 | Yamazaki et al. |
| 2006/0165141 A1 | 7/2006 | Kopf et al. |

FOREIGN PATENT DOCUMENTS

| | | |
|---|---|---|
| JP | 01-239837 | 9/1989 |
| JP | 02-181419 | 7/1990 |
| JP | 03-042819 | 2/1991 |
| JP | 04-282869 | 10/1992 |
| JP | 05-175235 | 7/1993 |
| JP | 05-226790 | 9/1993 |
| JP | 05-315278 | 11/1993 |
| JP | 07-092501 | 4/1995 |
| JP | 07-130652 | 5/1995 |
| JP | 07-249592 | 9/1995 |
| JP | 08-078329 | 3/1996 |
| JP | 08-213629 | 8/1996 |
| JP | 09-172181 | 6/1997 |
| JP | 09-253879 | 9/1997 |
| JP | 09-260681 | 10/1997 |
| JP | 09-270393 | 10/1997 |
| JP | 09-320961 | 12/1997 |
| JP | 10-135468 | 5/1998 |
| JP | 10-135469 | 5/1998 |
| JP | 10-199808 | 7/1998 |
| JP | 11-283933 | 10/1999 |
| JP | 11-345783 | 12/1999 |
| JP | 11-354463 | 12/1999 |
| JP | 2000-277450 | 10/2000 |
| WO | WO-97/23806 | 7/1997 |

OTHER PUBLICATIONS

Sposili et al., Sequential lateral solidification of thin silicon films on $SiO_2$, Appl. Phys. Lett. Nov. 4, 1996, pp. 2864-2866, vol. 69 (19), American Institute of Physics.

* cited by examiner

FIG. 8A
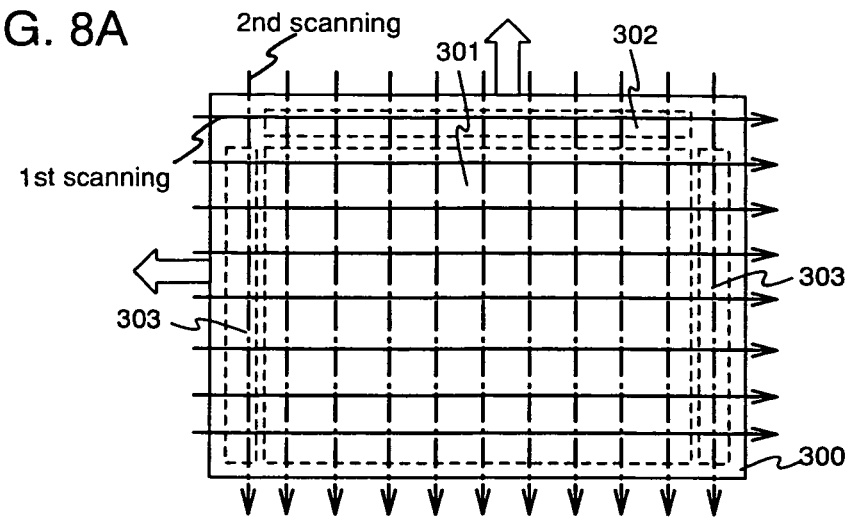
FIG. 8B 1st scanning
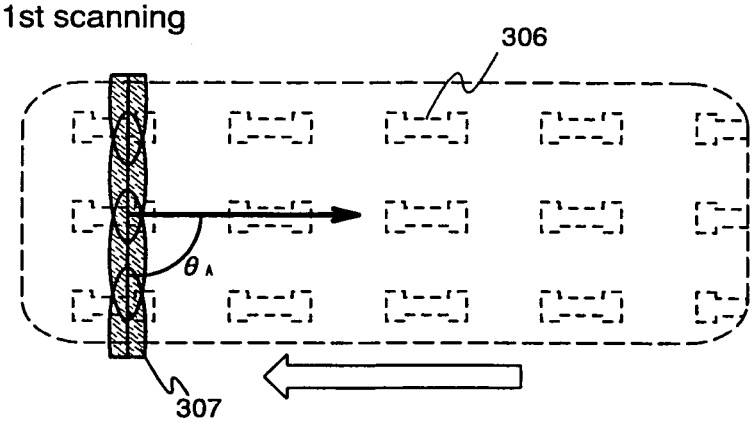
FIG. 8C 2nd scanning
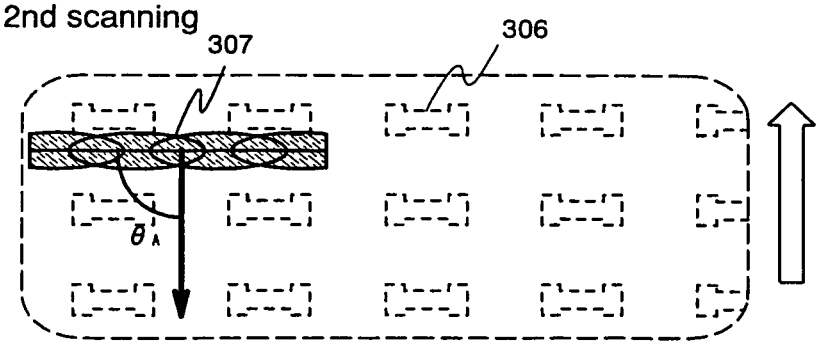

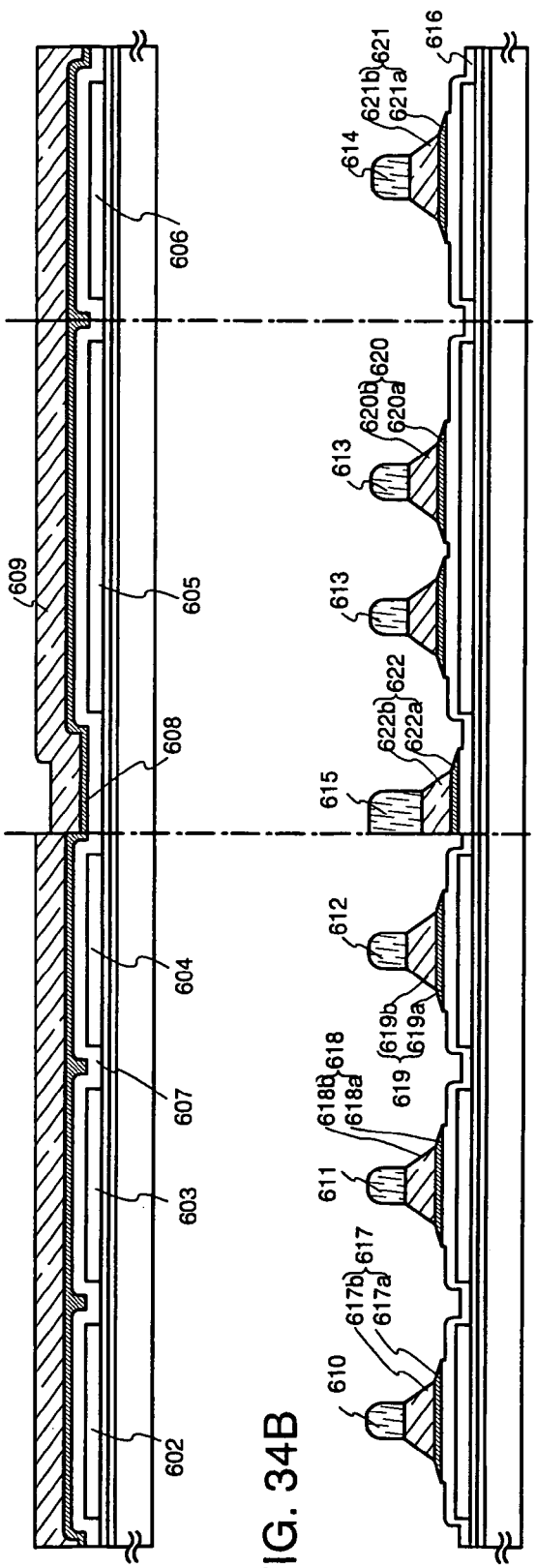
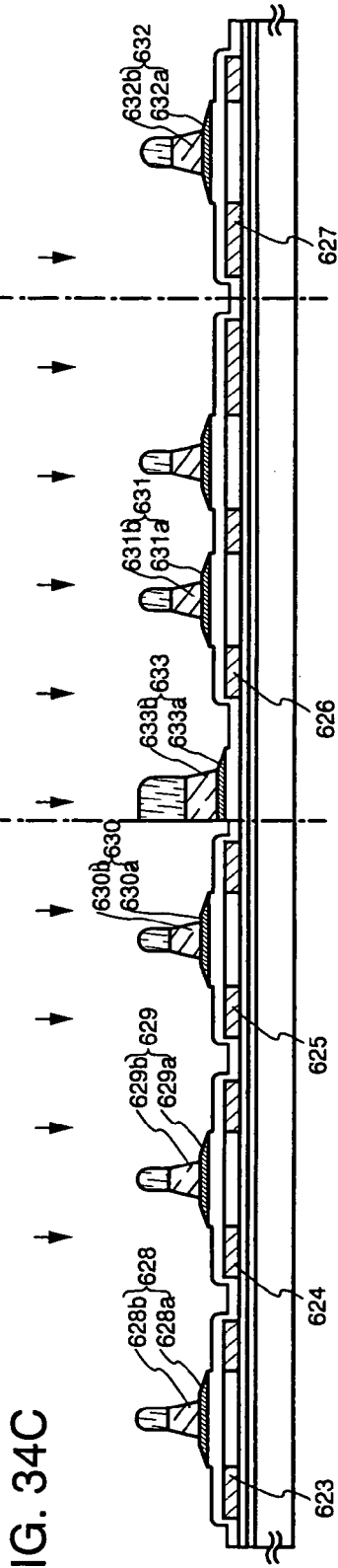
FIG. 34A
FIG. 34B
FIG. 34C

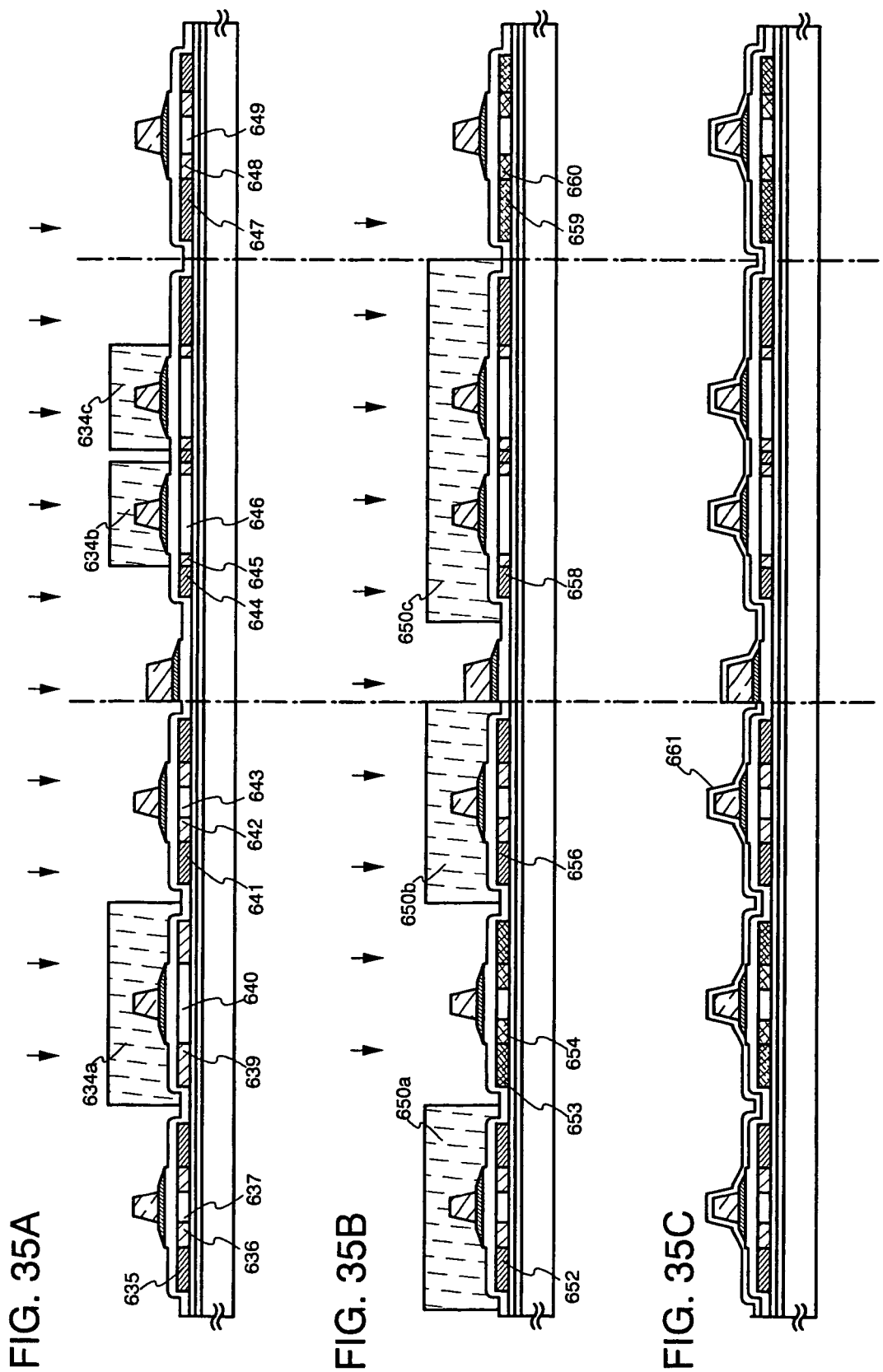

LASER IRRADIATION APPARATUS

BACKGROUND OF THE INVENTION

1. Field of the Invention

The present invention relates to a laser irradiation equipment that crystallize a semiconductor film using laser light and activate after an ion implantation.

2. Description of the Related Art

In recent years, a technique of forming a TFT on a substrate has greatly progressed, and its application and development for active matrix semiconductor display device has been advanced. In particular, since a TFT using a polycrystalline semiconductor film has higher field-effect mobility than a TFT using a conventional amorphous silicon film, it enables high speed operation. Therefore, although the pixel is conventionally controlled on a driving circuit provided outside the substrate, it is possible to control the pixel on the driving circuit formed on the same substrate.

Incidentally, as the substrate used in the semiconductor device, a glass substrate is expected hopefully as the substrate in comparison with a single crystal silicon substrate in terms of the cost. Since a glass substrate is inferior in heat resistance and is susceptible to heat-deformation, in the case where a polysilicon TFT is formed on the glass substrate, laser annealing is used for crystallization of the semiconductor film in order to avoid heat-deformation of the glass substrate.

Characteristics of laser annealing are as follows: it can greatly reduce a processing time in comparison with an annealing method using radiation heating or conductive heating; and it hardly causes thermal damage to the substrate by selectively and locally heating a semiconductor or the semiconductor film.

Note that the laser annealing method here indicates a technique of recrystallizing the damaged layer formed on the semiconductor substrate or the semiconductor film, and a technique of crystallizing the amorphous semiconductor film formed on the substrate. Also, the laser annealing method here includes a technique applied to leveling or surface reforming of the semiconductor substrate or the semiconductor film. A laser oscillation apparatus applied is a gas laser oscillation apparatus represented by an excimer laser or a solid laser oscillation apparatus represented by a YAG laser. It is known as the apparatus which performs crystallization by heating a surface layer of the semiconductor by irradiation of the laser beam in an extremely short period of time of about several ten nanoseconds to several hundred microseconds.

Lasers are roughly divided into two types: pulse oscillation and continuous oscillation, according to an oscillation method. In the pulse oscillation laser, an output energy is relatively high, so that mass productivity can be increased assuming the size of a beam spot to be several $cm^2$ or more. In particular, when the shape of the beam spot is processed using an optical system and made to be a linear shape of 10 cm or more in length, it is possible to efficiently perform irradiation of the laser beam to the substrate and further enhance the mass productivity. Therefore, for crystallization of the semiconductor film, the use of a pulse oscillation laser is becoming mainstream.

However, in recent years, in crystallization of the semiconductor film, it is found that grain size of the crystal formed in the semiconductor film is larger in the case where the continuous oscillation laser is used than the case where the pulse oscillation laser is used. When the crystal grain size in the semiconductor film becomes large, the mobility of the TFT formed using the semiconductor film becomes high and variation of the TFT characteristics due to a grain boundary is suppressed. Therefore, a continuous oscillation laser is recently attracting attention.

However, since the maximum output energy of the continuous oscillation laser is generally small in comparison with that of the pulse oscillation laser, the size of the beam spot is small, which is about $10^{-3}$ $mm^2$. Accordingly, in order to treat one large substrate, it is necessary to move a beam irradiation position on the substrate upward and downward, and right and left, it results in increasing the processing time per one substrate. Thus, processing efficiency is poor and it is an important object to improve the processing speed of the substrate.

A technique for high processing efficiency of substrate by overlapping and condensing a plurality of beam spots to form one beam spot is well known (For example, Patent Literatures 1 and 2).

Patent Literature 1: Japanese Publication of Laid-Open Patent Application No. Hei. 5-315278 (FIG. 11)

Patent Literature 2: Japanese Publication of Laid-Open Patent Application No. Hei. 4-282869 (second to third pages, FIG. 1A)

SUMMARY OF THE INVENTION

The present invention has been made in view of the above problems, and therefore it is an object of the present invention to provide a laser irradiation equipment using the laser crystallizing method, which can enhance a processing efficiency of a substrate and the mobility of a semiconductor film in comparison with the conventional example.

The laser irradiation apparatus of the present invention includes: a plurality of first means (laser oscillation apparatuses) for oscillating laser lights; a second means (optical system) for condensing the laser lights oscillated from the plurality of laser oscillation apparatuses and having beam spots on an object to be processed partially overlap each other, thereby synthesizing the beam spots; a slit that is capable of shielding a part of a beam spot obtained as a result of the synthesizing; a third means for controlling a position of the beam spot irradiated through the slit on the object to be processed; and a fourth means for controlling oscillation by each of the plurality of first means and synchronizing the plurality of laser oscillation apparatuses and the third means so that the beam spot irradiated through the slit covers each region that has been determined in accordance with data (pattern information) concerning the shape of a mask and should be crystallized.

It should be noted here that it does not matter whether the region that has been determined in accordance with the pattern information and should be crystallized is a region of a semiconductor film that will be obtained through patterning after the crystallization or a region thereof that will become the channel formation region of a TFT. In the present invention, the fourth means grasps the region that should be crystallized, determines the scanning path of the laser lights so that the laser lights are scanned onto at least the region that should be crystallized, and controls the third means so that the beam spot moves in accordance with the scanning path. That is, in the present invention, the laser lights are not irradiated onto the entire surface of the semiconductor film but are scanned so that at least each indispensable portion is crystallized to a minimum. With the construction described above, it becomes possible to save a time taken to irradiate the laser lights onto each portion to be removed through patterning after the crystallization of the semiconductor film.

As described above, in the present invention, the laser lights are not scanned and irradiated onto the entire surface of the semiconductor film but are scanned so that at least each indispensable portion is crystallized, which makes it possible to save a time taken to irradiate the laser lights onto each portion to be removed through the patterning after the crystallization of the semiconductor film. As a result, it becomes possible to shorten a time taken to irradiate the laser lights and also to improve the speed at which a substrate is processed.

Also, by synthesizing the laser lights oscillated from the plurality of laser oscillation apparatuses, it becomes possible to have the laser lights complement each other in each portion having a low energy density. Further, by performing the laser light irradiation through the slit, it becomes possible to shield each portion, which has a low energy density, of the beam spot obtained as a result of the synthesizing. As a result, it becomes possible to irradiate laser light, whose energy density is relatively uniform, onto the semiconductor film and to uniformly perform the crystallization. Also, by providing the slit, it becomes possible to partially change the width of the beam spot in accordance with the pattern information and to reduce limitations imposed on the layout of active layers of TFTs. Note that, the width of a beam spot refers to the length of the beam spot in a direction vertical to a scanning direction.

Further, in the present invention, in order to irradiate the laser lights in accordance with the pattern information concerning the mask, after the formation of the semiconductor film, markers are given to the semiconductor film with a laser light prior to the crystallization with the laser lights. Following this, with reference to positions of the markers, each position, at which the laser lights should be scanned, is determined based on the mask.

It should be noted here that the irradiation of the laser lights may be performed twice or more. In the case where the irradiation of the laser lights is performed twice, the scanning path of the laser lights during the first irradiation operation is determined so that the laser lights are irradiated onto the region that has been determined in accordance with the pattern information and should be crystallized, and the third means is controlled so that the beam spot moves in accordance with the scanning path. Next, the scanning direction is changed by controlling the third means, the scanning path of the laser lights during the second irradiation operation is determined so that the laser lights are irradiated onto the region that has been determined in accordance with the pattern information and should be crystallized, and the third means is controlled so that the beam spot moves in accordance with the scanning path. At this time, it is preferable that the scanning direction during the first laser light irradiation operation and the scanning direction during the second laser light irradiation operation form an angle that is closer to 90°.

With the construction described above, some crystal grains obtained by the first laser light irradiation operation are converted into a single larger crystal grain by the second laser light irradiation operation whose scanning direction has been changed. This may be because the crystal grains that have grown in a specific direction during the first laser light irradiation operation function as seed crystals and crystal growing is performed during the second laser light irradiation operation in a direction that differs from the specific direction. As a result, a semiconductor film that has high crystallinity in part is obtained through the laser light irradiation performed twice while changing the scanning direction. Therefore, by producing the active layers of TFTs using the regions, whose crystallinity has been further enhanced, of the semiconductor film, it becomes possible to obtain TFTs having high mobility.

Also, after the formation of the semiconductor film, the irradiation of the laser lights for crystallizing the semiconductor film may be performed under a state where the exposure to the atmosphere is prevented (for instance, the laser light irradiation is performed under a specific gas atmosphere (such as a rare gas atmosphere, a nitrogen atmosphere, or an oxygen atmosphere) or under a reduced pressure atmosphere). With this construction, it becomes possible to prevent the mixing of a contaminant (boron contained in a filter used to enhance the cleanness of the air, for instance) at a molecule level within a clean room into the semiconductor film during the crystallization using the laser lights.

BRIEF DESCRIPTION OF THE DRAWINGS

In the accompanying drawings:

FIGS. 8A to 8C show directions in which laser lights move on an object to be processed;

FIGS. 34A to 34C also show the method of producing the semiconductor device using the laser irradiation apparatus of the present invention;

FIGS. 35A to 35C also show the method of producing the semiconductor device using the laser irradiation apparatus of the present invention;

DETAILED DESCRIPTION OF THE PREFERRED EMBODIMENTS

Figure 1:
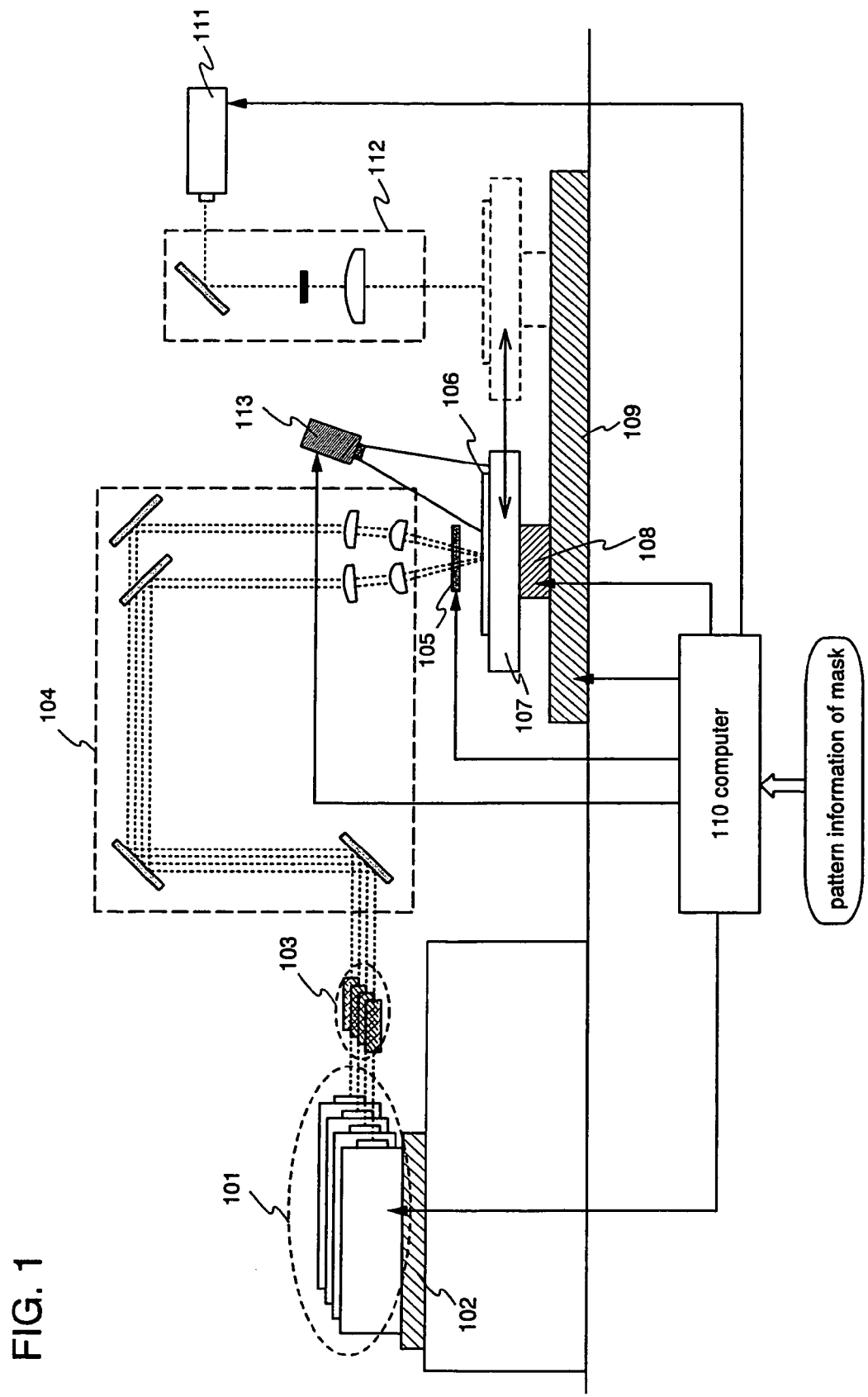
FIG. 1 shows a construction of a laser irradiation apparatus of the present invention.

Hereinafter, a construction of the laser irradiation apparatus of the present invention will be described with reference to FIG. 1. Reference numeral 101 denotes laser oscillation apparatuses. Four laser oscillation apparatuses are used in FIG. 1, although the number of laser oscillation apparatuses possessed by the laser irradiation apparatus of the present invention is not limited to this.

It is possible to change the laser as appropriate depending on the purpose of processing. In the present invention, it is possible to use a publicly known laser. As the laser, it is possible to use a gas laser or solid-state laser of pulse oscillation or continuous oscillation. As the gas laser, it is possible to cite an excimer laser, an Ar laser, a Kr laser, and the like. As the solid-state laser, it is possible to cite a YAG laser, a $YVO_4$ laser, a YLF laser, a $YAlO_3$ laser, a glass laser, a ruby laser, an alexandrite laser, a Ti: sapphire laser, a $Y_2O_3$ laser, and the like. As the solid-state laser, there is applied a laser that uses a crystal such as YAG, $YVO_4$, YLF, $YAlO_3$, or the like doped with Cr, Nd, Er, Ho, Ce, Co, Ti, Yb, or Tm. The fundamental wave of the laser differs depending on a material to be doped with and there is obtained a laser light having a fundamental wave in the neighborhood of 1 µm. It is possible to obtain a harmonic wave with respect to the fundamental wave using a nonlinear optical element.

Also, it is further possible to use an ultraviolet laser light obtained by converting an infrared laser light emitted from a solid-state laser into a green laser light using a nonlinear optical element and by further processing the green laser light using another nonlinear optical element.

It should be noted here that the laser oscillation apparatuses 101 may be constructed so that their temperatures are maintained constant using a chiller 102. It is not necessarily required to use the chiller 102, although by maintaining the temperatures of the laser oscillation apparatuses 101 constant, it becomes possible to suppress variations in energy of laser lights to be outputted that varies depending on the temperatures.

Also, reference numeral 104 denotes an optical system that is capable of condensing the laser lights by changing the optical paths of the lights outputted from the laser oscillation apparatuses 101 and processing the shapes of beam spots of the lights. Further, the important point concerning the optical system 104 of the present invention is that it is possible to synthesize the beam spots of the laser lights outputted from the plurality of laser oscillation apparatuses 101 by having the beam spots partially overlap each other.

It should be noted here that AO modulators 103 that change the traveling directions of the laser lights within an extremely short time period may be provided on the optical path between a substrate 106 that is an object to be processed and the laser oscillation apparatuses 101.

A beam spot obtained by synthesizing the beam spots is irradiated onto the substrate 106 that is an object to be processed through a slit 105. It is preferable that this slit 105 is formed using a material that is capable of blocking the laser lights and is not deformed or damaged by the laser lights. In addition, the width of the slit 105 is changeable, which makes it possible to change the width of the beam spot on the substrate 106 in accordance with the width of the slit.

It should be noted here that in the case where the laser lights oscillated from the laser oscillation apparatuses 101 do not pass through the slit 105, the shape of the beam spot obtained from the laser lights on the substrate 106 varies depending on the kind of the laser and it is possible to shape the beam spot with an optical system.

The substrate 106 is placed on a stage 107. In FIG. 1, position control means 108 and 109 correspond to means for controlling the position of the beam spot on the object to be processed, and the position of the stage 107 is controlled by these position control means 108 and 109. Note that it is possible to move (scan) the beam spot and to change the scanning direction of the laser lights by changing the position of the substrate using the position control means 108 and 109 in FIG. 1, although the present invention is not limited to this construction. For instance, the irradiation direction of the laser lights may be changed using an optical system. In this case, it is possible to interpret that the position control means are included in this optical system. Also, the irradiation direction may be changed using both of the moving of the substrate and the optical system.

In FIG. 1, the position control means 108 controls the position of the stage 107 in an X direction, while the position control means 109 controls the position of the stage 107 in a Y direction.

Also, the laser irradiation apparatus of the present invention includes a computer 110 that has both of a central processing unit and a storage means such as a memory. This computer 110 is capable of controlling the oscillation operation of the laser oscillation apparatuses 101, controlling the position control means 108 and 109 so that the beam spot of the laser lights cover an area determined in accordance with pattern information concerning masks, and setting the substrate at a predetermined position.

In the present invention, the computer 110 is also capable of controlling the width of the slit 105, thereby changing the width of the beam spot in accordance with the pattern information concerning the masks.

The laser irradiation apparatus may further include a means for adjusting the temperature of the object to be processed. Also, the laser lights are light having directivity and a high energy density, so that a dumper may be provided in order to prevent a situation where reflection light is irradiated onto an inappropriate area. It is preferable that the dumper has a property of absorbing the reflection light. Also, by circulating a coolant in the dumper, there may be prevented a situation where the temperature of a partition wall rises due to the absorption of the reflection light. Also, the stage 107 may be provided with a means (substrate heating means) for heating the substrate.

It should be noted here that in the case where the markers are formed with a laser, there may be provided a laser oscillation apparatus 111 for forming the markers. In this case, the oscillation by the laser oscillation apparatus 111 may be controlled by the computer 110. Further, in the case where the laser oscillation apparatus 111 is provided, there is provided an optical system 112 that condenses the laser light outputted from the laser oscillation apparatus 111.

Also, in order to perform alignment using the markers, there may be provided one CCD camera 113. Alternatively, a plurality of CCD cameras may be provided according to circumstances.

Next, there will be described the shape of a beam spot formed by synthesizing a plurality of beam spots through overlapping.

Figure 2A:
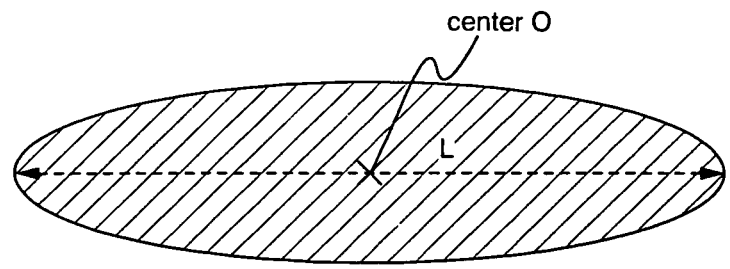
FIGS. 2A and 2B respectively show a shape of a laser beam and a distribution of an energy density thereof.

FIG. 2A shows an example of the shape of a beam spot of the laser light oscillated from each of the plurality of laser oscillation apparatuses on the object to be processed in the case where the laser light does not pass through the slit. The beam spot shown in FIG. 2A has an elliptic shape. Note that in the laser irradiation apparatus of the present invention, the beam spots of the laser lights oscillated from the laser oscillation apparatuses are not limited to the elliptic shape. The shapes of the beam spots vary depending on the kind of the laser and it is possible to shape the beam spots with an optical system. For instance, the laser light emitted from the XeCl excimer laser (whose wavelength is 308 nm and pulse width is 30 ns) L3308 manufactured by Lambda K.K. has a rectangular shape whose size is 10 mm×30 mm (both of which are the half width in a beam profile). Also, the laser light emitted from the YAG laser has a circular shape if a rod has a cylindrical shape, and has a rectangular shape if the rod has a slab shape. Also, by further shaping such a laser light with an optical system, it is also possible to generate a laser light having a desired size.

Figure 2B:
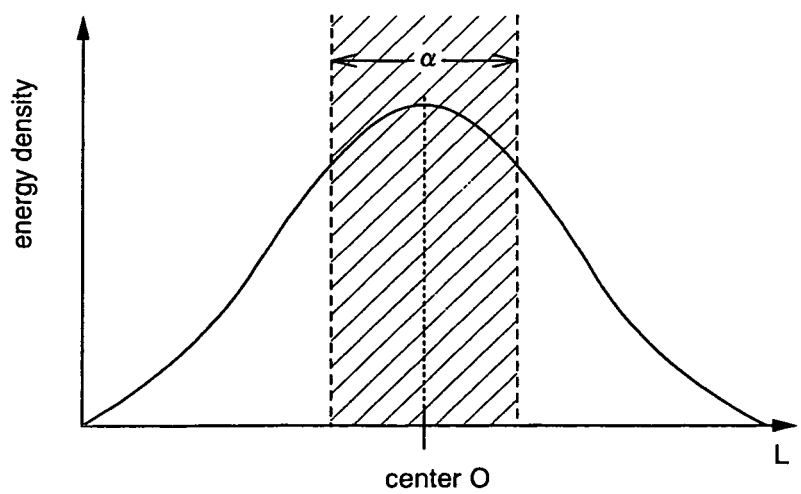

FIG. 2B shows the distribution of the energy density of the laser light in a major axis L direction of the beam spot shown in FIG. 2A. As to the distribution of the energy density of the laser light whose beam spot has the elliptic shape, the energy density is increased in accordance with the reduction of a distance to the center "O" of the ellipse. The range specified by "α" corresponds to a width in the major axis y direction where the energy density exceeds a value that is necessary to obtain a desired crystal.

Figure 3A:
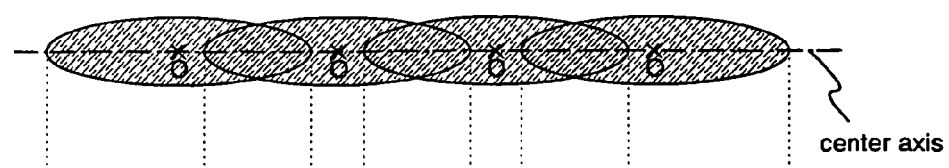
FIGS. 3A and 3B respectively show a shape of a laser beam and a distribution of an energy density thereof.

Next, FIG. 3A shows the shape of a beam spot obtained by synthesizing laser lights that each have the beam spot shown in FIGS. 2A and 2B. Note that a case where one beam spot is formed by having beam spots of four laser lights overlap each other is shown in FIG. 3A, although the number of beam spots that are made to overlap each other is not limited to this.

As shown in FIG. 3A, the beam spots of respective laser lights are synthesized by arranging the major axes of respective ellipses on the same straight line and having the beam spots partially overlap each other. In this manner, there is formed one beam spot. Note that a straight line obtained by connecting the centers "O" of respective ellipses will be hereinafter referred to as the "center axis".

Figure 3B:
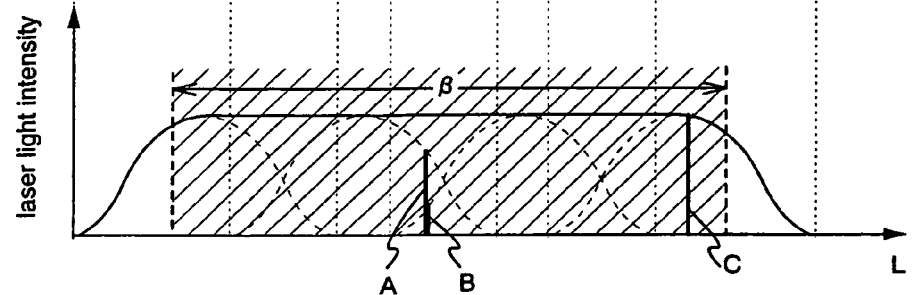

FIG. 3B shows the distribution of energy densities of the laser lights in a direction of the center axis of the beam spot shown in FIG. 3A obtained as a result of the synthesizing. There is increased the energy density in each portion in which respective beam spots before the synthesizing overlap each other. For instance, if the energy densities A and B of beams that overlap each other in the illustrated manner are added to each other, the addition result becomes approximately equal to the peak value C of the energy density of the beam and the energy density is flattened in each portion between the centers "O" of respective ellipses.

It should be noted here that it is ideal that a result obtained by adding A to B becomes equal to C, although the actual addition result does not necessarily become a value that is equal to C. It is sufficient that the difference between the value obtained by adding A to B and the value of C is in a range of ±10% of the value of C, more preferably, in a range of ±5% thereof. However, it is possible for a designer to set the permissible range as appropriate.

As can be seen from FIG. 3B, by having a plurality of laser lights overlap each other and having the laser lights complement each other in each portion having a low energy density, it becomes possible to enhance the crystallinity of a semiconductor film with efficiency in comparison with a case where the plurality of laser lights are not made to overlap each other and are used independently of each other. For instance, it is assumed that in FIG. 2B, the energy density exceeds a value that is necessary to obtain the desired crystal only in the area specified by the sloped lines and the energy densities in other areas are below the desired value. In this case, the desired crystal is obtained with each beam spot only in the sloped-line area whose width in the center axis direction is indicated by "α". However, as shown in FIG. 3B, by having the beam spots overlap each other, it becomes possible to obtain the desired crystal in an area whose width in the center axis direction is shown by β (β>4α). As a result, it becomes possible to crystallize a semiconductor film with more efficiency.

It should be noted here that even if the laser lights are made to overlap each other, there still exist areas in which the energy density does not reach the desired value. In the laser irradiation apparatus of the present invention, each region of the synthesized beam spots with a low energy density is shielded by the slit 105, thereby preventing a situation where such a region is irradiated onto the substrate 106. A positional relation between the beam spot obtained as a result of the synthesizing and the slit will be described with reference to FIGS. 4A to 4C.

Figure 4A:
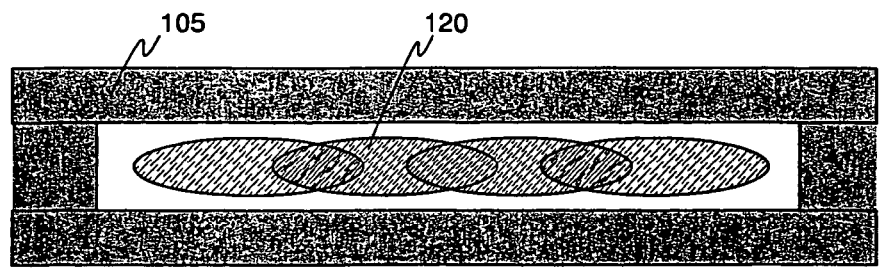
FIGS. 4A to 4C each show a positional relation between a beam spot and a slit.

The slit 105 used in the present invention has a changeable slit width that is controlled by the computer 110. In FIG. 4A, reference numeral 120 designates the shape of the beam spot shown in FIG. 3A that has been obtained as a result of the synthesizing, while reference numeral 105 indicates the slit. In FIG. 4A, there is shown a state where the beam spot 120 is not shielded by the slit.

Figure 4B:
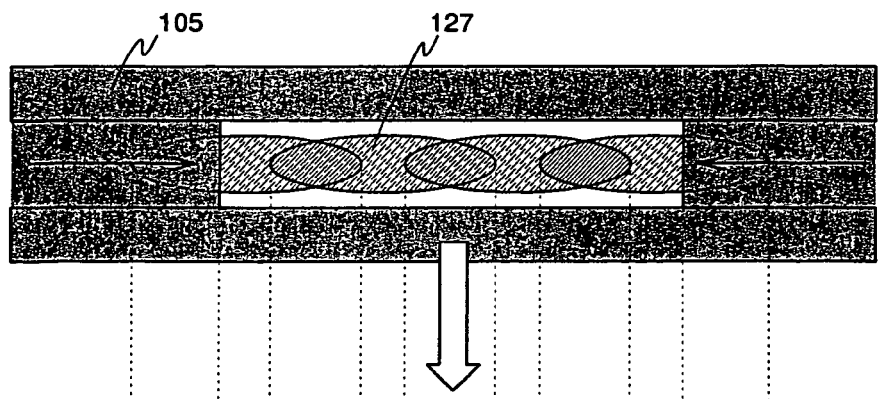
Figure 4C:
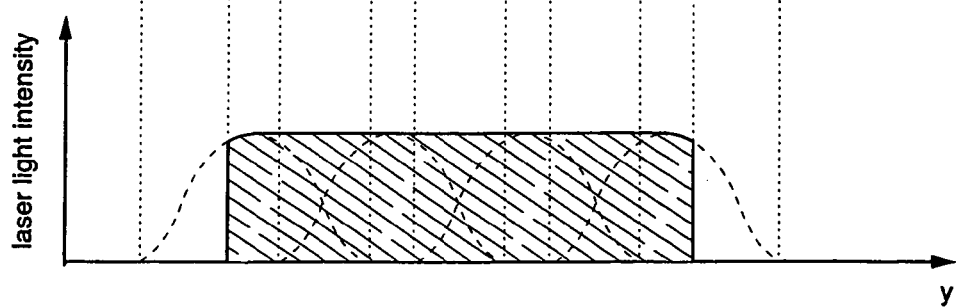

FIG. 4B shows a state where a beam spot 127 is shielded in part by the slit 105. Also, FIG. 4C shows the distribution of the energy density of the beam spot shown in FIG. 4B in the center axis L direction. In contrast to the case shown in FIG. 3B, each region with a low energy density is cut by the slit 105.

Figure 5A:
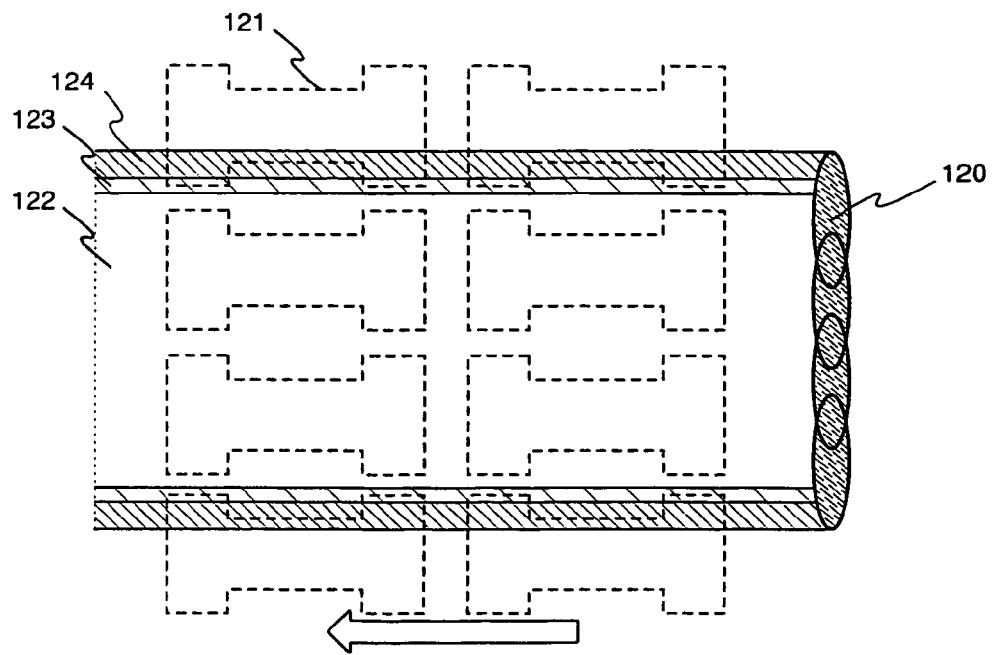
FIGS. 5A and 5B each show a positional relation between a portion to be irradiated with laser lights and masks.

An area of a semiconductor film irradiated with such a region with a low energy density has poor crystallinity. Specifically, in comparison with an area irradiated with a region filled with an energy density, crystal grains become small or grow in different directions. FIG. 5A shows the scanning path of the beam spot 120 shown in FIG. 3B and a positional relation with the pattern of masks. In FIG. 5A, the beam spot 120 is scanned by moving the substrate in the direction shown by an arrow. Reference numeral 122 denotes an area irradiated with a region having a desired energy density. On the other hand, reference numerals 123 and 124 each represent an area irradiated with a region whose energy density does not reach the desired value, and the crystal grains in such an area are smaller than those in the area 122. Further, in the area 123, the crystal grows in a direction vertical to the substrate. On the other hand, in the area 124, the crystal grows in a plane parallel to the substrate and the crystal grains in this area 124 are smaller than those in the area 123. Note that the crystallinity in an area irradiated with a region with a low energy density varies depending on the thickness of a semiconductor film, the kind of a laser, an irradiation condition, and the like and areas irradiated with a region having a low energy density are not necessarily classified into the two areas described above.

In FIG. 5A, the areas 123 and 124 overlap patterns 121 of active layers and this is not a preferable situation. As a result, it becomes necessary to determine the scanning path of the laser lights and the layout of active layers so that there is prevented a situation where the regions whose energy density is low overlap the active layers or their channel formation regions.

Figure 5B:
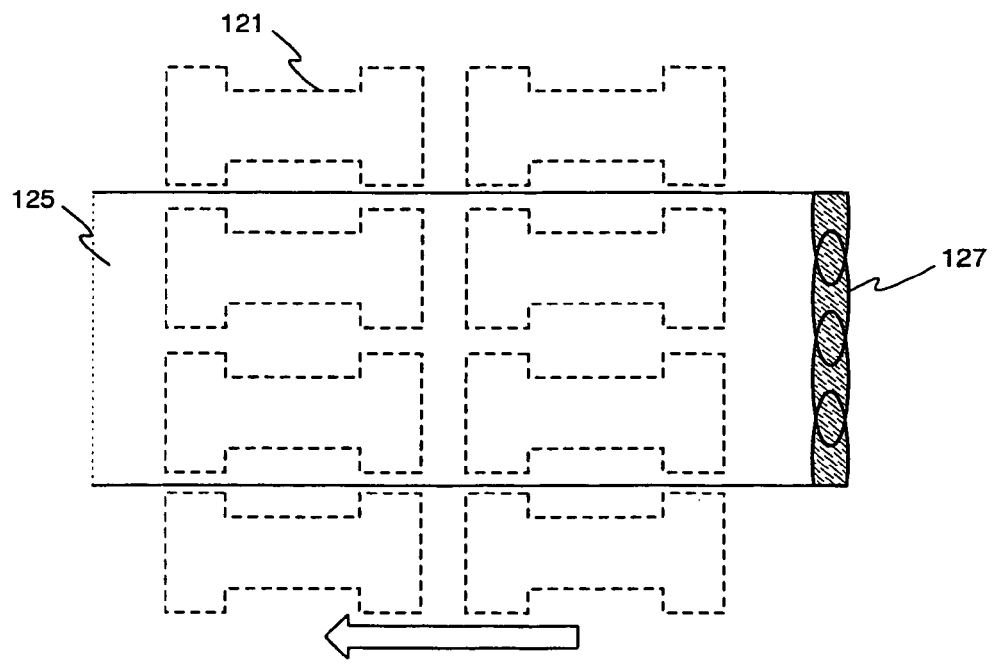

In FIG. 5B, there is shown a state where the beam spot 127, whose regions with a low energy density is shielded, is scanned by moving the substrate in the arrow direction. Reference numeral 125 denotes a region whose energy density reaches the desired value, and the crystallinity in an area irradiated with this laser light region becomes uniform. Also, in contrast to the case shown in FIG. 5A, the areas 123 and 124 irradiated with the regions having a low energy density do not exist or the widths thereof are reduced in comparison with the case shown in FIG. 5A, so that it becomes easier to prevent a situation where the edge portions of the laser lights overlap the patterns 121 of the active layers. As described above, each region with a low energy density is cut by providing the slit, so that it becomes possible to reduce limitations imposed on the scanning path of the laser lights and the layout of the active layers.

Also, it is possible to change the width of the beam spot while maintaining the energy density constant without terminating the output from the laser oscillation apparatuses, which makes it possible to prevent a situation where edges of the laser lights overlap the active layers or their channel formation regions. Also, there is prevented a situation where the laser lights are irradiated onto unnecessary portions and the substrate is damaged.

It should be noted here that in FIGS. 5A and 5B, the center axis direction of the beam spot and the scanning direction are set vertical to each other, although the center axis of the beam spot is not necessarily required to be set vertical to the scanning direction. For instance, the center axis of the beam spot and the scanning direction may form an acute angle $\theta_A$ of 45°±35°, more preferably, 45° In the case where the center axis of the beam spot extends vertically to the scanning direction, efficiency in the processing of a substrate is maximized. On the other hand, by performing scanning so that the center axis of the beam spot after the synthesizing and the scanning direction forms an angle of 45°±35° (preferably, an angle closer to 45°), it becomes possible to intentionally increase the number of crystal grains existing in the active layers and to reduce variations in characteristics resulting from the orientation of a crystal and crystal grains in comparison with a case where scanning is performed so that the scanning direction and the center axis of the beam spot are set vertical to each other. Also, in comparison with a case where scanning is performed so that the scanning direction and the center axis of the beam spot are set vertical to each other, it becomes possible to elongate a laser light irradiation time per substrate.

Figure 6A:
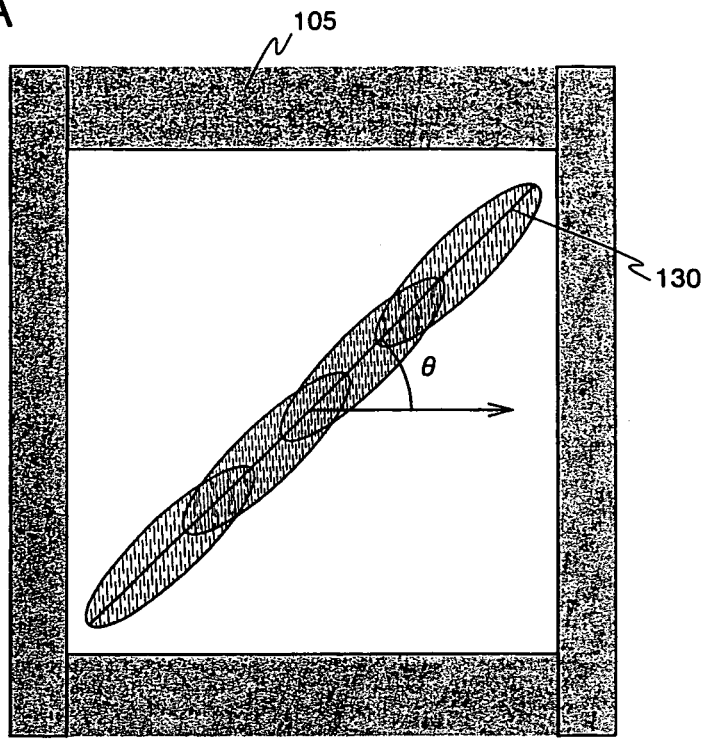
FIGS. 6A and 6B each show a positional relation between a beam spot and a slit.

A positional relation between the slit and the beam spot in the case where the center axis of the beam spot is set to form an angle of 45° with the scanning direction will be described with reference to FIGS. 6A and 6B. Reference numeral 130 denotes a beam spot after the synthesizing and reference numeral 105 represents a slit. The slit 105 does not overlap the beam spot 130. The arrow indicates the scanning direction and an angle $\theta$ with the center axis of the beam spot 130 is maintained at 45°.

Figure 6B:
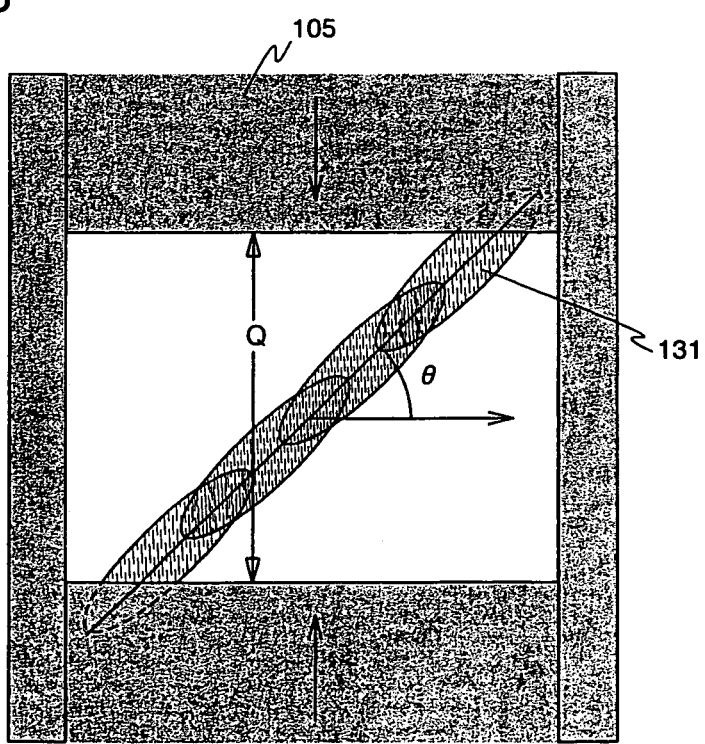

FIG. 6B shows a state where a beam spot 131 is shielded in part by the slit 105 and is reduced in width. In the present invention, the slit 105 controls the width Q of the beam spot in a direction vertical to the scanning direction and realizes the uniform irradiation of the laser lights.

Figure 7A:
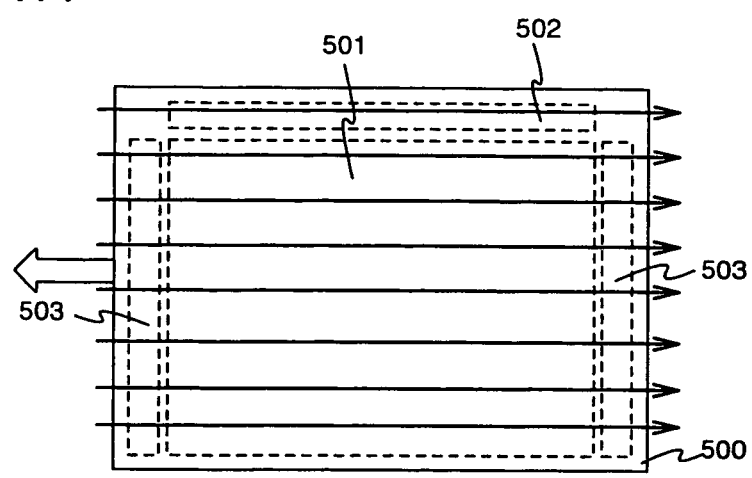
FIGS. 7A and 7B show a direction in which laser lights move on an object to be processed.

Next, the scanning direction of the laser lights on a semiconductor film 500 formed to produce a semiconductor device of active matrix type will be described with reference to FIG. 7A. In FIG. 7A, the portion surrounded by a broken line 501 corresponds to a portion in which there will be formed a pixel portion, the portion surrounded by a broken line 502 corresponds to a portion in which there will be formed a signal line driving circuit, and the portion surrounded by a broken line 503 corresponds to a portion in which there will be formed a scanning line driving circuit.

Figure 7B:
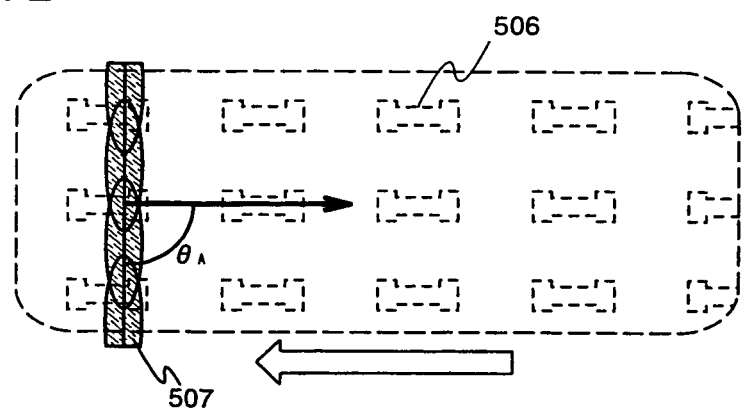

In FIG. 7A, there is shown an example where the laser lights are scanned only once onto each portion that will become active layers. A substrate is moved in the direction shown by a hollow arrow and the solid-line arrows specify a relative scanning direction of the laser lights. FIG. 7B is an enlarged view of a beam spot 507 in the portion 501 in which the pixel portion will be formed. Active layers will be formed in the area irradiated with the laser lights.

Next, the scanning direction of the laser lights on a semiconductor film 300 in the case where the laser lights are scanned twice by changing the scanning direction will be described with reference to FIG. 8A. In FIG. 8A, the portion surrounded by a broken line 301 corresponds to a portion in which there will be formed a pixel portion, the portion surrounded by a broken line 302 corresponds to a portion in which there will be formed a signal line driving circuit, and the portion surrounded by a broken line 303 corresponds to a portion in which there will be formed a scanning line driving circuit.

In FIG. 8A, a substrate is moved in the direction shown by hollow arrows and the solid-line arrows specify relative scanning directions of the laser lights. In FIG. 8A, laser lights are irradiated onto a semiconductor film in two different scanning directions, the solid-line arrows show a relative scanning direction of the first laser light irradiation operation, and the broken-line arrows show a relative scanning direction of the second laser light irradiation operation. Also, an active layer is formed in each area at the intersection of the laser lights irradiated by the first irradiation operation and the laser lights irradiated by the second irradiation operation.

FIG. 8B is an enlarged view of a beam spot 307 during the first scanning operation, while FIG. 8C is an enlarged view of the beam spot 307 during the second scanning operation. Note that in FIGS. 8A to 8C, the relative scanning direction of the first laser light irradiation operation and the relative scanning direction of the second laser light irradiation operation form an angle of approximately 90°, although the angle between them is not limited to this.

Also, it is preferable that the laser lights are irradiated so that there is prevented a situation where the edge portions of the beam spots overlap portions (portions 506 in FIG. 7B and portions 306 in FIGS. 8B and 8C) that correspond to island-like semiconductor films that will be obtained by patterning the semiconductor film after crystallization.

It should be noted here that in FIG. 8A, the laser lights are irradiated twice onto all of the pixel portion 301, the signal line driving circuit 302, and the scanning line driving circuit 303. However, the present invention is not limited to this.

Then, in the present invention, each portion to be scanned with the laser lights is determined in accordance with the pattern information concerning masks inputted into the computer 110. Note that the masks to be used are selected according to each portion that should be crystallized. In the case where each active layer will be crystallized in its entirety, for instance, there are used masks for patterning a semiconductor film. On the other hand, in the case where only each channel formation region will be crystallized, there are used the masks for patterning a semiconductor film and masks for performing impurity doping.

Then, each portion to be scanned with the laser lights is made to cover portions of a semiconductor film to be obtained through patterning after crystallization. The computer 110 determines the portion to be scanned with the laser lights so that at least each portion of the semiconductor film to be obtained through the patterning will be crystallized. Also, the computer 110 controls the position control means 108 and 109 so that the beam spot, that is, the irradiation position coincides with the portion to be scanned. In this manner, the semiconductor film is partially crystallized.

Figure 9A:
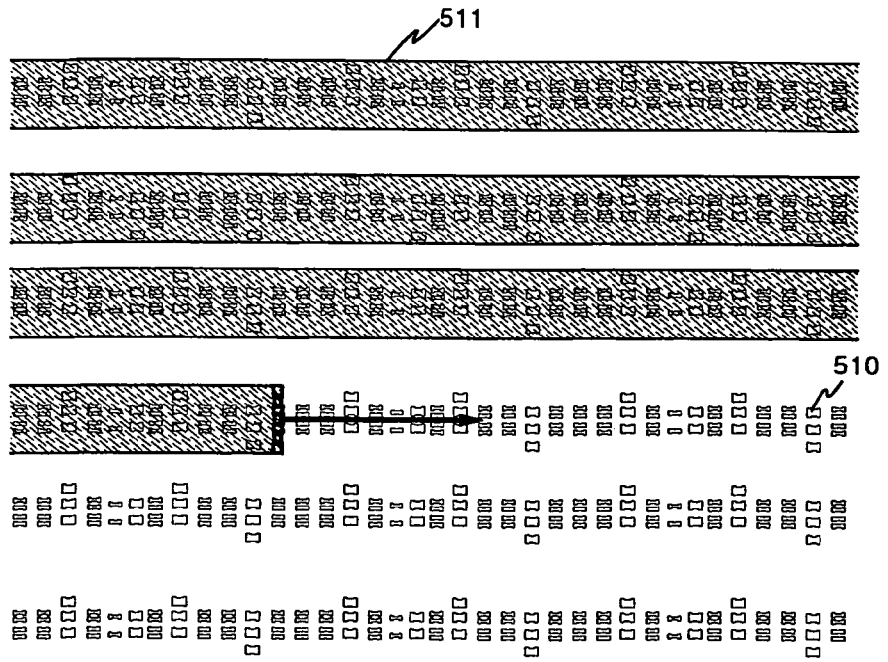
FIGS. 9A and 9B each show a positional relation between portions to be irradiated with laser lights and masks.
Figure 9B:
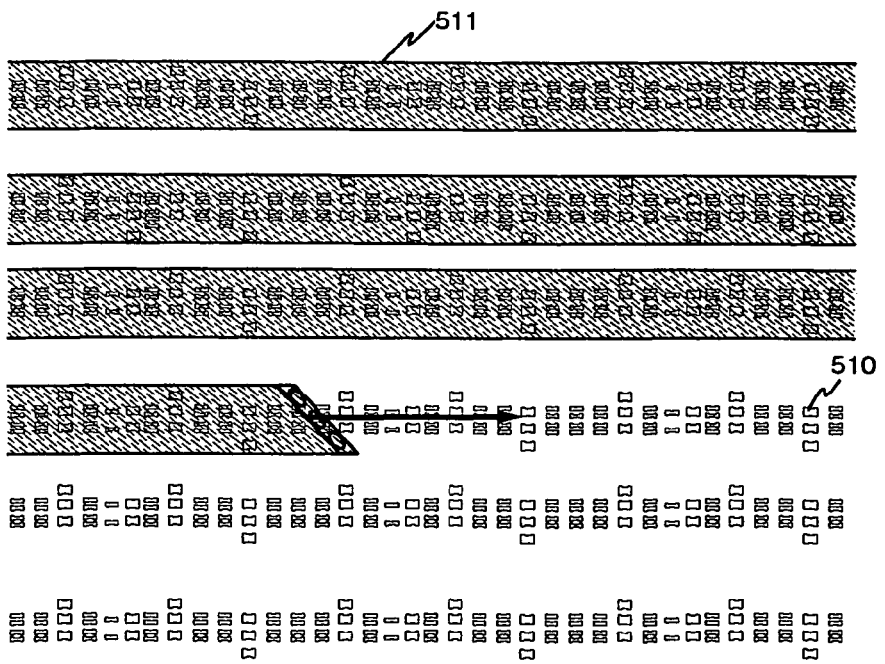

In FIG. 9A, there is shown a relation between portions to be scanned with the laser lights and the masks in the case where the irradiation of the laser lights is performed once. Note that in FIG. 9A, the center axis of the beam spot extends approximately vertically to the scanning direction. In FIG. 9B, there is shown a relation between the portions to be scanned with the laser lights and the masks in the case where the center axis of the beam spot and the scanning direction forms an angle of 45°. Reference numeral 510 denotes each island-like semiconductor film, which will be obtained through patterning, of a semiconductor film, and the portions to be scanned with the laser lights are determined so that these island-like semiconductor films 510 are covered with the portions to be scanned. Reference numeral 511 represents each portion to be scanned with the laser lights, with the island-like semiconductor films 510 being covered with the portions to be scanned. As shown in FIGS. 9A and 9B, in the present invention, the laser lights are not irradiated onto the entire surface of the semiconductor film but are scanned so that at least each indispensable portion is crystallized to a minimum.

It should be noted here that in the case where the semiconductor film after the crystallization is used as the active layers of TFTs, it is preferable that the scanning direction of the laser lights is set parallel to the direction in which carriers in channel formation regions move.

Figure 10A:
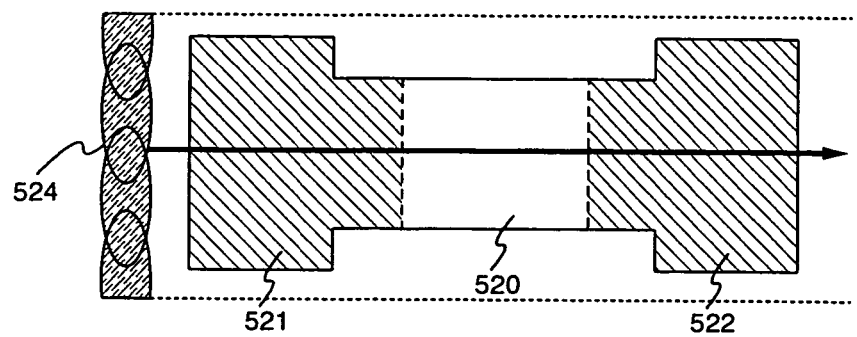
FIGS. 10A and 10B each show a direction in which laser lights move on an active layer of a TFT.
Figure 10B:
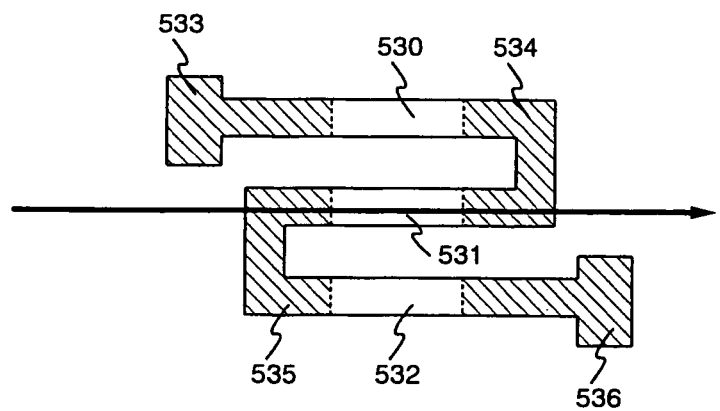

FIGS. 10A and 10B each show an example of the layout of the active layer of a TFT in the case where the laser lights are irradiated once. FIG. 10A shows an active layer in which one channel formation region is provided and impurity regions 521 and 522 that will become a source region and a drain region are provided so that a channel formation region 520 is sandwiched therebetween. When the semiconductor film is crystallized using the laser irradiation apparatus of the present invention, the scanning direction of the laser lights is set parallel to a direction in which the carriers in the channel formation region move, as indicated by the arrow. Reference numeral 524 indicates a region of the beam spot that has an energy density that is necessary to obtain a favorable crystal. By irradiating the laser lights onto the entire surface of the active layer, it becomes possible to further enhance the crystallinity of the active layer.

Also, FIG. 10B shows an active layer that is provided with three channel formation regions. In this drawing, impurity regions 533 and 534 are provided so that a channel formation region 530 is sandwiched therebetween. Also, impurity regions 534 and 535 are provided so that a channel formation region 531 is sandwiched therebetween. Further, impurity regions 535 and 536 are provided so that a channel formation region 532 is sandwiched therebetween. In addition, when the semiconductor film is crystallized using the laser irradiation apparatus of the present invention, the scanning direction of the laser lights is set parallel to the direction in which carriers in the channel formation regions move, as indicated by the arrow. Note that in FIGS. 10A and 10B, it does not matter whether the scanning of the beam spot is performed by moving the substrate or is performed using an optical system. Alternatively, the scanning of the beam spot may be performed using both of the moving of the substrate and the optical system.

Figure 11A:
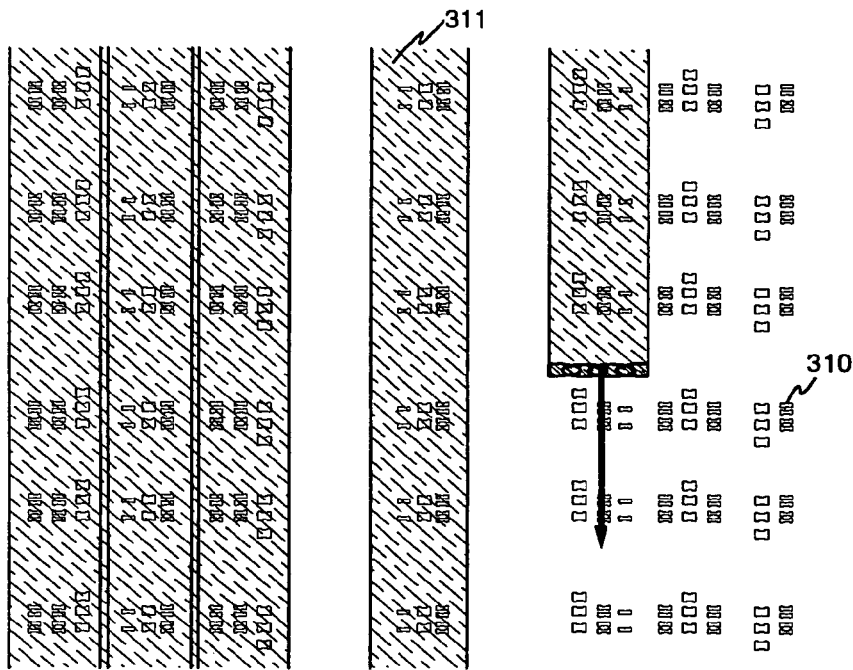
FIGS. 11A and 11B each show a positional relation between portions to be irradiated with laser lights and masks.

Next, a relation between each portion to be scanned by the first laser light irradiation operation and masks in the case where the laser light irradiation is performed twice is shown in FIG. 11A. Note that in FIG. 11A, the center axis of the beam spot extends approximately vertically to the scanning direction. Reference numeral 310 denotes each island-like semiconductor film, which will be obtained through patterning, of the semiconductor film and each portion to be scanned with the laser lights is determined so that these island-like semiconductor films 310 will be covered with this portion to be scanned. Reference numeral 311 represents each portion to be scanned with the laser lights and covers the island-like semiconductor films 310. As shown in FIG. 11A, in the present invention, during the first irradiation operation, the laser lights are not irradiated onto the entire surface of the semiconductor film but are scanned so that at least each indispensable portion is crystallized to a minimum.

Figure 11B:
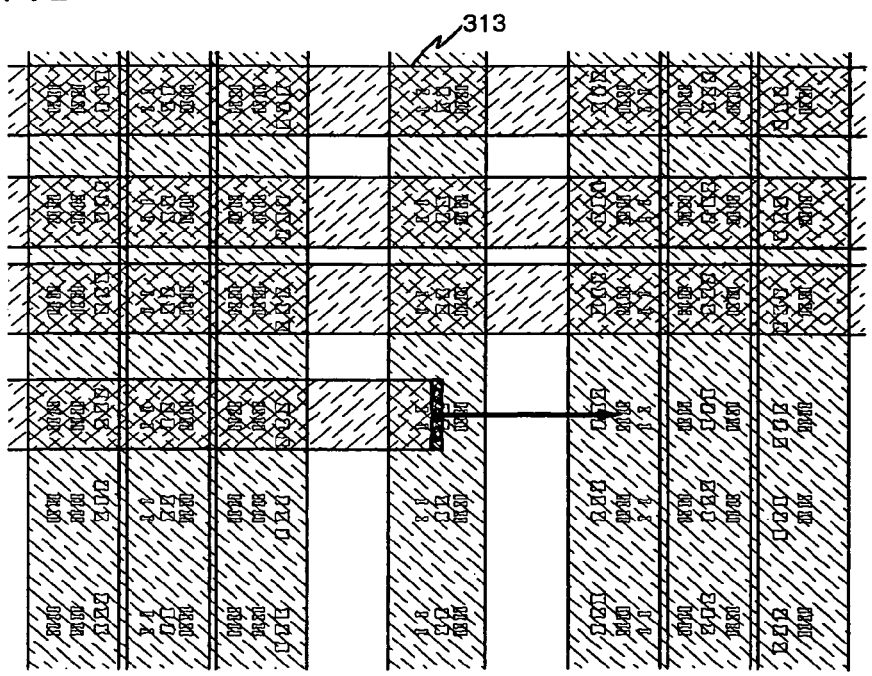

Next, FIG. 11B shows a relation between each portion to be scanned by the laser lights and masks in the case where laser light irradiation is performed twice and the second laser light irradiation operation is performed for the semiconductor film shown in FIG. 11A. In FIG. 11B, the scanning direction of the second laser light irradiation operation differs from the scanning direction of the first laser light irradiation operation, with the difference therebetween being 90°. Also, during the second laser light irradiation operation, each portion to be scanning with the laser lights is determined so that each portion 310 that will become an island-like semiconductor film will be covered with the portion to be scanned. Also, during the second laser light irradiation operation, it is required to change the direction of the slit in a like manner. Reference numeral 313 denotes each portion to be scanned with the laser lights during the second laser light irradiation operation and covers the island-like semiconductor films 310. As shown in FIG. 11B, in the present invention, during the second laser light irradiation operation, the laser lights are not irradiated onto the entire surface of the semiconductor film but are scanned so that at least each indispensable portion is crystallized to a minimum.

Accordingly, each portion 310 that will become an island-like semiconductor film is irradiated twice by laser lights while changing the scanning direction, so that the crystallinity is further enhanced. Also, the laser lights are not irradiated onto the entire surface of the substrate but are irradiated onto a minimum portion required to crystallize the portions, which are determined by the masks, of the semiconductor film. This makes it possible to suppress a time taken to process one substrate and to enhance the efficiency in the processing of a substrate.

Figure 12A:
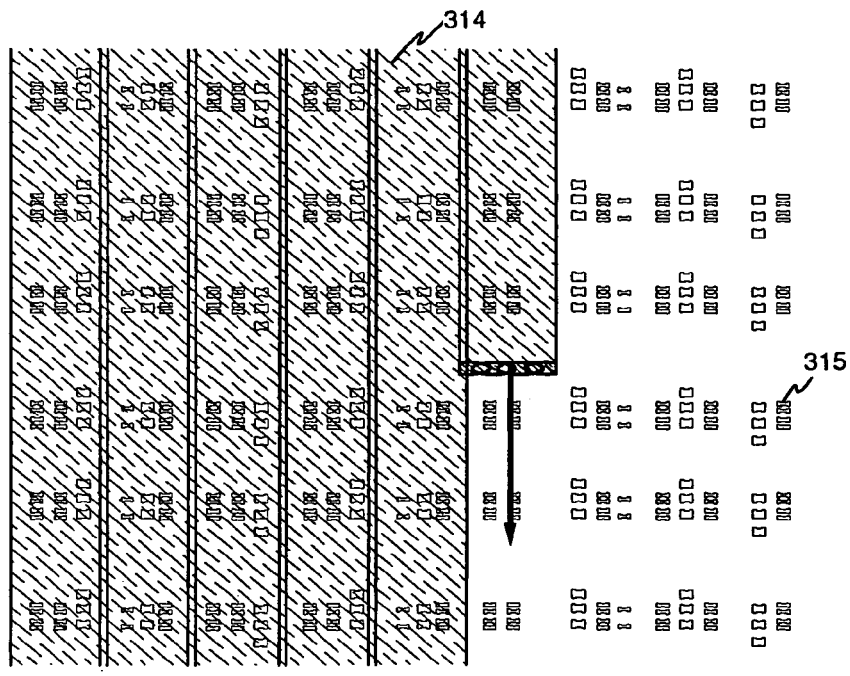
FIGS. 12A and 12B each show a positional relation between portions to be irradiated with laser lights and masks.
Figure 12B:
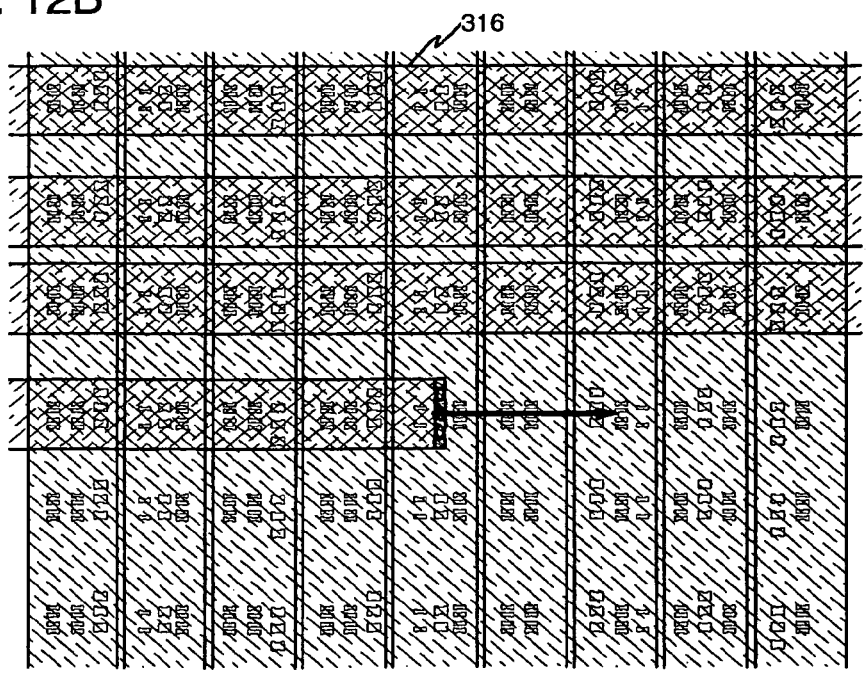

It should be noted here that in FIGS. 11A and 11B, during both of the first and second laser light irradiation operations, the laser lights are not irradiated onto the entire surface of the semiconductor film but are irradiated onto a minimum portion required to crystallize the portions, which are determined by the masks, of the semiconductor film. However, the present invention is not limited to this construction and the laser lights may be irradiated onto the entire surface of the semiconductor film during the first laser light irradiation operation and the laser lights may be partially irradiated during the second laser light irradiation operation. Conversely, the laser lights may be partially irradiated during the first laser light irradiation operation and the laser lights may be irradiated onto the entire surface of the substrate during the second laser light irradiation operation. FIG. 12A shows a state during the first laser light irradiation operation where the laser lights are irradiated onto the entire surface of the semiconductor film, while FIG. 12B shows a state during the second laser light irradiation operation where the laser lights are irradiated onto the semiconductor film shown in FIG. 12A. Reference numeral 314 denotes each portion to be scanned with the laser lights during the first laser light irradiation operation, with the entire surface of the semiconductor film being covered with the portion to be scanned. Also, reference numeral 315 indicates the shape of each island-like semiconductor film to be obtained through patterning, with the island-like semiconductor film being arranged at a position at which this semiconductor film does not overlap the edges of the portion to be scanned with the laser lights during the first laser light irradiation operation. Also, reference numeral 316 represents each portion to be scanned with the laser lights during the second laser light irradiation operation, with the island-like semiconductor films 315 to be obtained through patterning being covered with the portion to be scanned. Further, the laser lights are not irradiated onto the entire surface of the semiconductor film during the second laser light irradiation operation but are partially irradiated so that at least the island-like semiconductor films 315 are irradiated with the laser lights.

It should be noted here that in the case where the semiconductor film after the crystallization is used as the active layers of TFTs, it is preferable that the scanning direction of the laser lights is set parallel to the direction, in which carriers in channel formation regions move, during either of the first laser light irradiation operation and the second laser light irradiation operation.

Figure 13A:
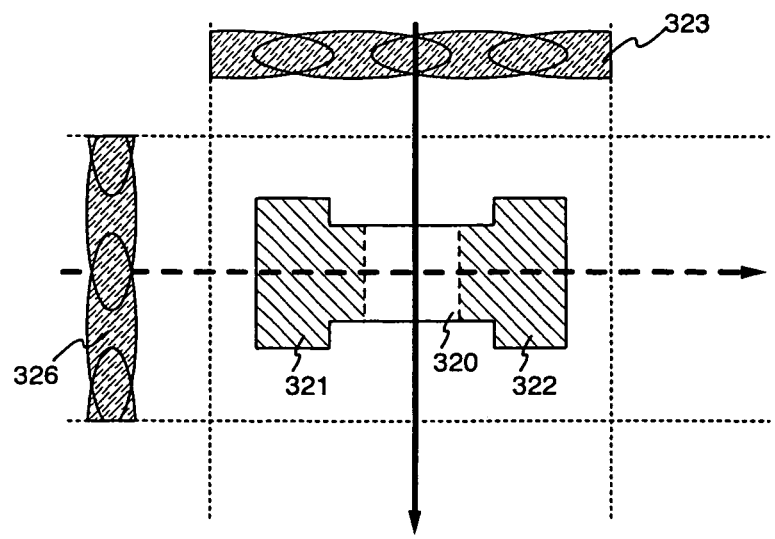
FIGS. 13A and 13B each show directions in which laser lights move on an active layer of a TFT.
Figure 13B:
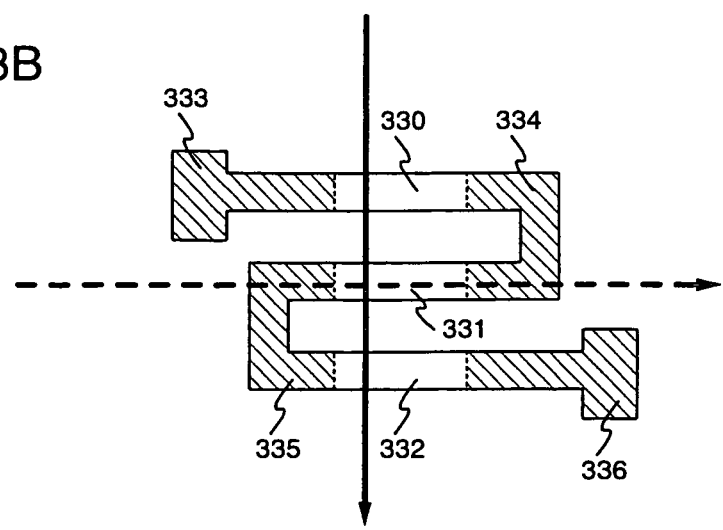

FIGS. 13A and 13B each show an example of an active layer of a TFT. FIG. 13A shows an active layer that is provided with one channel formation region and impurity regions 321 and 322 that will become a source region and a drain region are provided so that a channel formation region 320 is sandwiched therebetween. When the semiconductor film is crystallized using the laser irradiation apparatus of the present invention, the scanning direction of the laser lights during the first or second laser light irradiation operation is set parallel to a direction in which carriers in the channel formation region move, as shown by the arrow. Note that in FIGS. 13A and 13B, it does not matter whether the scanning of the beam spot is performed by moving the substrate or is performed using an optical system. Alternatively, the scanning of the beam spot may be performed using both of the moving of the substrate and the optical system.

Reference numeral 323 denotes a region, whose energy density falls within a range of values that are necessary to obtain the favorable crystal, of the beam spot of the laser lights during the first laser light irradiation operation, with the beam spot being scanned in the direction shown by the solid-line arrow. By irradiating the region 323 of the laser lights onto the whole of the active layer, it becomes possible to further enhance the crystallinity of the active layer.

Also, reference numeral 326 denotes a region, whose energy density falls within the range of values that are necessary to obtain the favorable crystal, of the beam spot of the laser lights during the second laser light irradiation operation, with this beam spot being scanned in the direction shown by the broken-line arrow. As shown in FIG. 13A, the scanning direction during the first laser light irradiation operation and the scanning direction during the second laser light irradiation operation differ from each other. By irradiating the region 326 of the laser lights onto the whole of the active layer, it becomes possible to further enhance the crystallinity of the active layer.

Also, FIG. 13B shows an active layer provided with three channel formation regions. In this drawing, impurity regions 333 and 334 are provided so that a channel formation region 330 is sandwiched therebetween. Also, impurity regions 334 and 335 are provided so that a channel formation region 331 is sandwiched therebetween. Further, impurity regions 335 and 336 are provided so that a channel formation region 332 is sandwiched therebetween. In addition, the laser lights irradiated by the first laser light irradiation operation are scanned in the direction shown by the solid-line arrow, the laser lights irradiated by the second laser light irradiation operation are scanned in the direction shown by the broken-line arrow, and the scanning direction during the first or second laser light irradiation operation is set parallel to the direction in which the carriers in the channel formation regions move.

It should be noted here that it is sufficient that the scanning direction of the laser lights is set parallel to the moving direction of the carriers during either of the first and second laser light irradiation operations, although it is more preferable that the scanning direction of laser lights having a higher energy density is set parallel to the moving direction because the direction in which a crystal grows is more strongly influenced by the scanning direction of the laser lights having a higher energy density.

Also, in the case where the major axis direction of a beam spot having a linear or elliptic shape does not extend vertically to the scanning direction, it is not necessarily required that the moving direction of the carriers coincides with the scanning direction. In this case, it is conceived that a crystal grows in a direction vertical to the major axis direction, so that it is preferable that this direction is made to coincide with the moving direction of the carriers.

A relation between the scanning direction of laser lights on a semiconductor film formed to produce a semiconductor device of active matrix type and the layout of active layers in respective circuits in the case where the irradiation of the laser lights is performed twice will be described with reference to FIG. 14.

Figure 14:
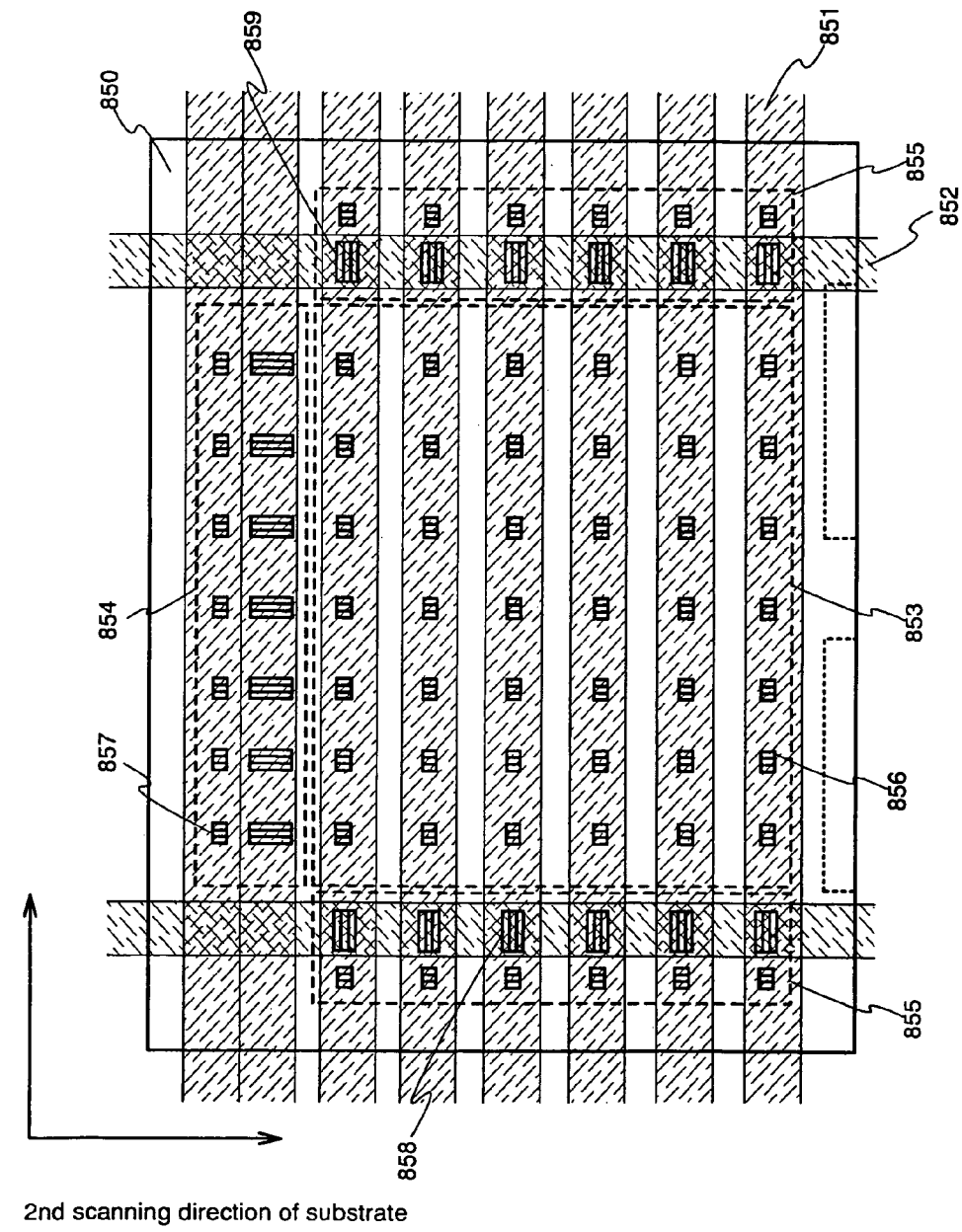
FIG. 14 shows a positional relation between portions to be irradiated with laser lights and masks for respective circuits.

In FIG. 14, a semiconductor film 850 is formed on a substrate. The portion surrounded by a broken line 853 is a portion in which there will be formed a pixel portion, and portions 856 that will become a plurality of active layers are provided in this pixel portion 853. The portion surrounded by a broken line 854 is a portion in which there will be formed a signal line driving circuit, and portions 857 that will become a plurality of active layers are provided in this signal line driving circuit 854. The portion surrounded by a broken line 855 is a portion in which there will be formed a scanning line driving circuit, and portions 858 that will become a plurality of active layers are provided in this scanning line driving circuit 855.

It should be noted here that the portions 856, 857, and 858 that will become active layers possessed by respective circuits have a small size (in units of several ten μm) in actual cases, although these portions are intentionally illustrated using a size that is larger than the real size in FIG. 14 in order to make it easier to understand the drawing. The portions 856, 857, and 858 that will become the active layers possessed by respective circuits are laid out so that the directions in which carriers in their channel formation regions move are broadly divided into two directions (the first direction and the second direction).

Reference numeral 851 denotes each portion that will be crystallized by the first laser light irradiation operation and covers all of the portions 856, 857, and 858 that will become the active layers. Also, the first laser light irradiation operation is performed so that its scanning direction becomes parallel to the first direction.

Also, reference numeral 852 represents each portion that will be crystallized by the second laser light irradiation operation. The scanning direction during the second laser light irradiation operation differs from the scanning direction of the first laser light irradiation operation and becomes parallel to the second direction. Further, the laser lights irradiated by the second scanning operation do not cover all of the portions 856, 857, and 858 that will become the active layers but cover only each active layer whose moving direction of carriers in the channel formation region is parallel to the second direction. In FIG. 14, the second laser light irradiation operation is performed only on each active layer in which the moving direction of carriers in its channel formation region becomes parallel to the scanning direction of the second laser light irradiation operation, among the plurality of active layers 858.

Figure 15A:
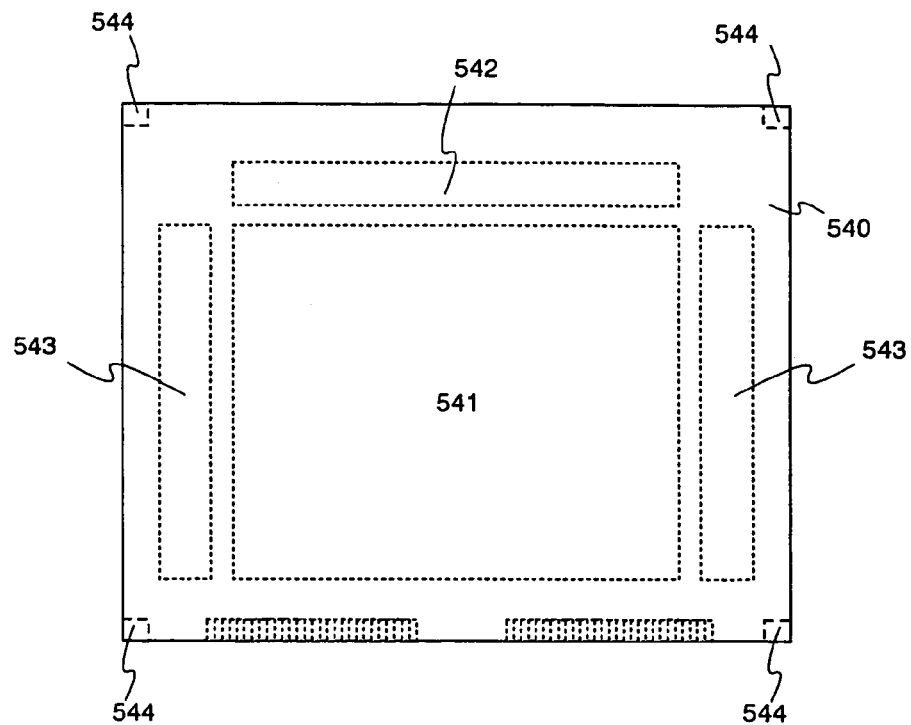
FIGS. 15A and 15B each show positions of markers.
Figure 15B:
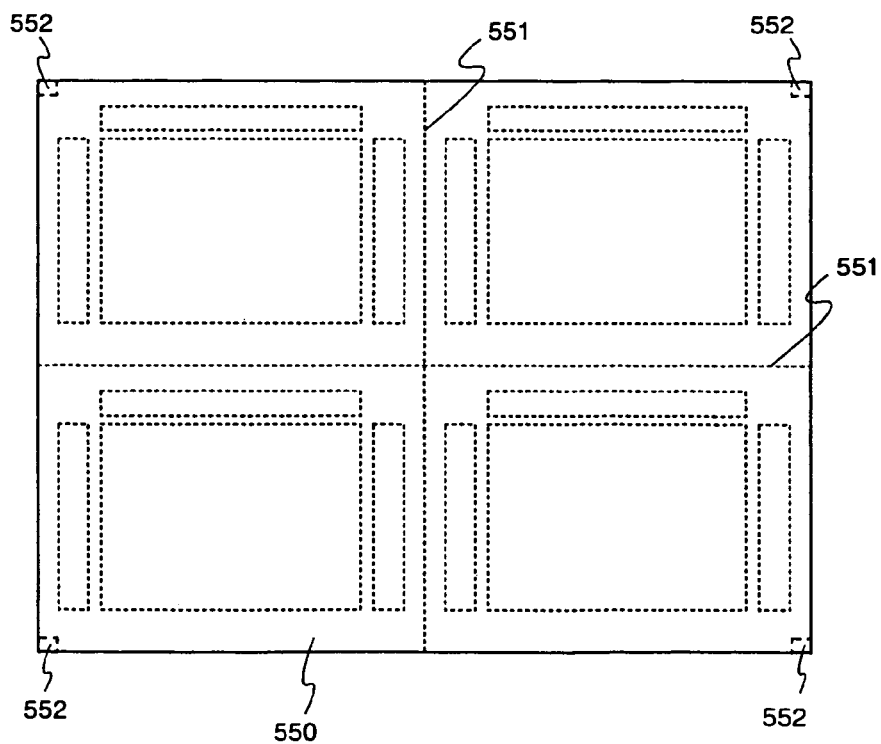

It should be noted here that in order to determine each portion to be scanned with the laser lights, it is necessary to form, on the semiconductor film, markers for determining the positions of masks with respect to the semiconductor film. FIGS. 15A and 15B show positions at which the markers will be formed on a semiconductor film formed to produce a semiconductor device of active matrix type. Note that FIG. 15A shows an example where one semiconductor device will be produced from one substrate, while FIG. 15B shows an example where four semiconductor devices will be produced from one substrate.

In FIG. 15A, reference numeral 540 denotes a semiconductor film formed on a substrate, the portion surrounded by a broken line 541 corresponds to a portion (hereinafter referred to as the "pixel-portion-forming portion" in which there will be formed a pixel portion, the portion surrounded by a broken line 542 corresponds to a portion (hereinafter referred to as the "signal-line-driving-circuit-forming portion" in which there will be formed a signal line driving circuit, and the portion surrounded by a broken line 543 corresponds to a portion (hereinafter referred to as the "scanning-line-driving-circuit-forming portion") in which there will be formed a scanning line driving circuit. Reference numeral 544 represents portions (marker-forming portions) in which there will be formed the markers, with these portions being provided and positioned at four corners of the semiconductor film.

It should be noted here that the four marker-forming portions 544 are respectively provided at the four corners in FIG. 15A, although the present invention is not limited to this construction. The positions of the marker-forming portions and the number thereof are not limited to the form described above so long as it is possible to align the portions of the semiconductor film which will be scanned with the laser lights with the masks for patterning the semiconductor film.

In FIG. 15B, reference numeral 550 denotes a semiconductor film formed on a substrate and broken lines 551 indicate scribe lines along which the substrate will be divided in a subsequent step. In FIG. 15B, it is possible to produce four semiconductor devices by dividing the substrate along the scribe lines 551. Note that the number of semiconductor devices obtained through the division is not limited to this.

Reference numeral 552 represents marker-forming portions, with these portions being provided and positioned at four corners of the semiconductor film. It should be noted here that the four marker-forming portions 552 are respectively provided at the four corners in FIG. 15B, although the present invention is not limited to this construction. The positions of the marker-forming portions and the number thereof are not limited to the form described above so long as it is possible to align the portions of the semiconductor film which will be scanned with the laser lights, with the masks for patterning the semiconductor film.

It is possible to cite a YAG laser, $CO_2$ laser, and the like as representative examples of the laser used to form the markers. Needless to say, however, it is possible to form the markers using another laser.

Next, there will be described a production flow of a semiconductor device using the laser irradiation apparatus of the present invention.

Figure 16:
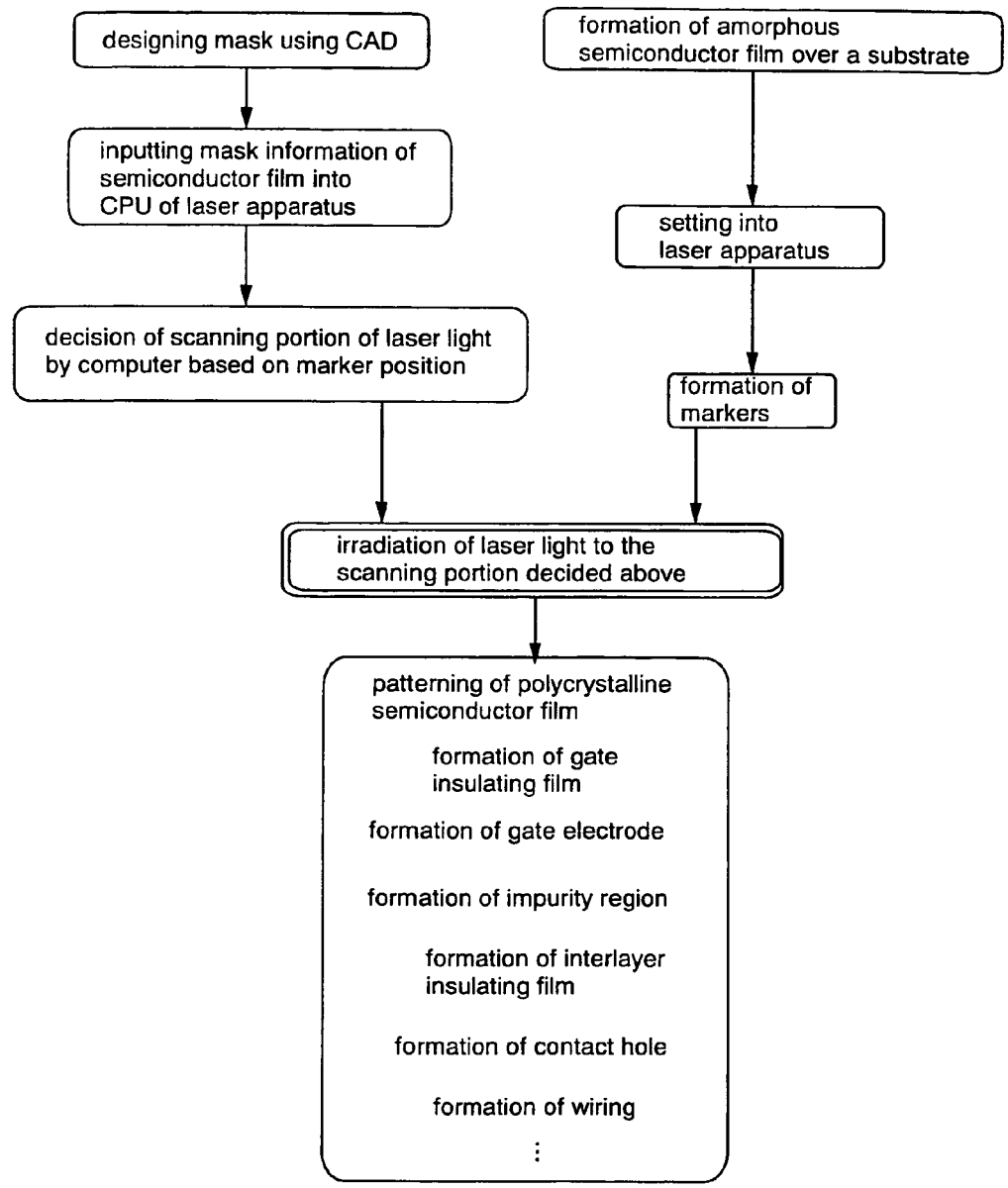
FIG. 16 shows a production flow of the present invention.

A production flow in the case where the irradiation of the laser lights is performed once is shown in FIG. 16 as a flowchart. First, there is performed the designing of a semiconductor device using CAD. Then, information concerning the shape of masks for patterning the designed semiconductor film is inputted into the computer possessed by the laser irradiation apparatus. On the other hand, after an amorphous semiconductor film is formed on a substrate, the substrate, on which the amorphous semiconductor film has been formed, is placed in the laser irradiation apparatus. Then, the markers are formed on the surface of the semiconductor film using a laser.

On the basis of the mask information inputted by the computer, each portion to be scanned with the laser lights is determined with reference to the positions of the markers. Then, with reference to the formed markers, the laser lights are irradiated onto the portion to be scanned with the laser lights, thereby partially crystallizing the semiconductor film.

Then, after the irradiation of the laser lights, a polycrystalline semiconductor film obtained by the irradiation of the laser lights is patterned and etched, thereby forming island-like semiconductor films. Following this, there is performed a step for producing TFTs from these island-like semiconductor films. The concrete step for producing the TFTs varies depending on the shape of the TFTs. Representatively, however, gate insulating films are formed and impurity regions are formed in the island-like semiconductor films. Then, interlayer insulating films are formed so as to cover the gate insulating films and gate electrodes, and contact holes are established in the interlayer insulating films. In this manner, there are obtained exposed parts of the impurity regions. Then, wiring is formed on the interlayer insulating films so as to contact the impurity regions through the contact holes.

Figure 17:
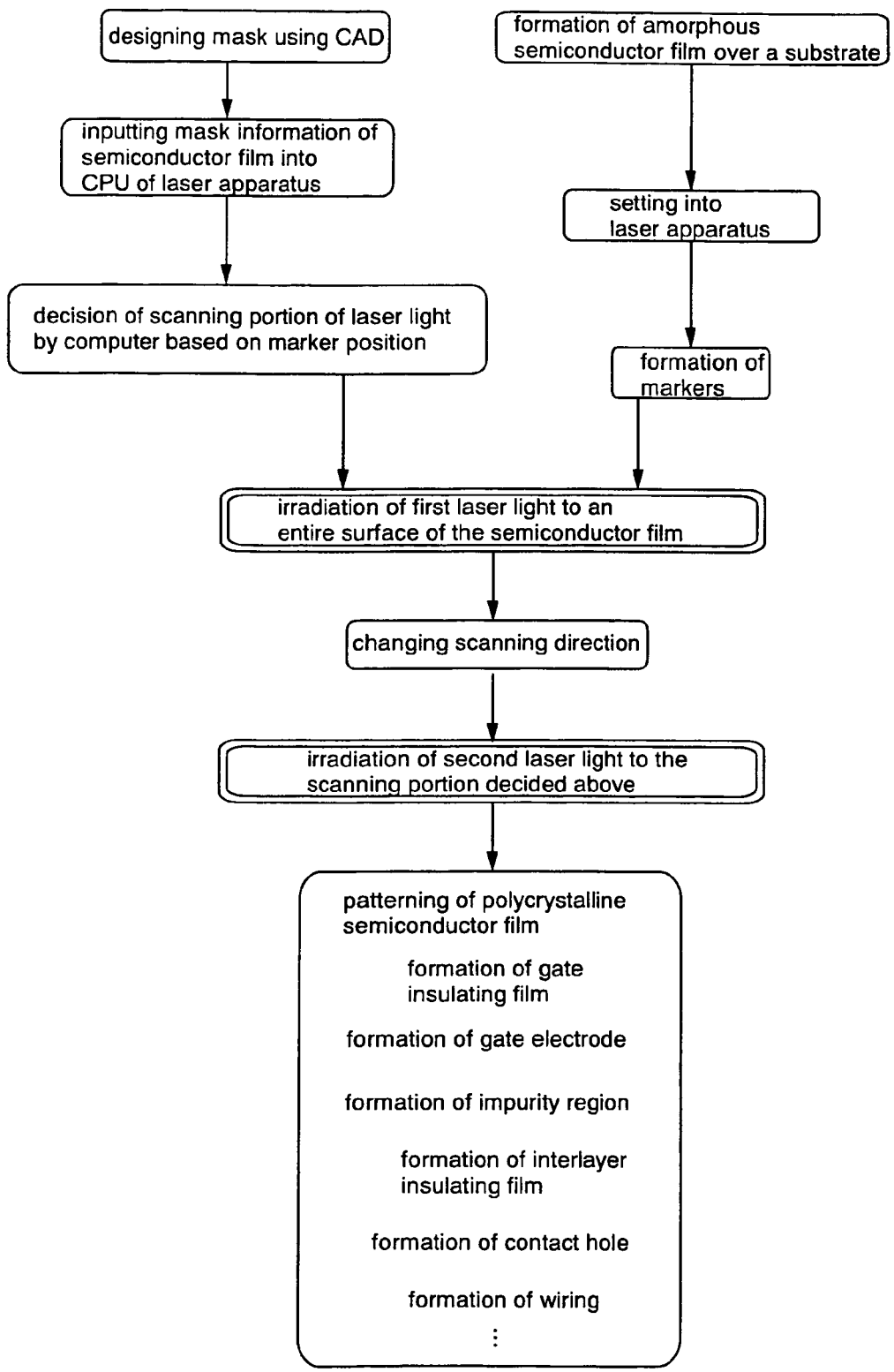
FIG. 17 shows a production flow of the present invention.

Next, a production flow in the case where the irradiation of the laser lights is performed twice is shown in FIG. 17 as a flowchart. First, there is performed the designing of a semiconductor device using CAD. Then, information concerning the shape of masks for patterning the designed semiconductor film is inputted into the computer possessed by the laser irradiation apparatus. On the other hand, after an amorphous semiconductor film is formed on a substrate, the substrate, on which the amorphous semiconductor film has been formed, is placed in the laser irradiation apparatus. Then, markers are formed on the surface of the semiconductor film using a laser.

On the basis of the mask information inputted by the computer, each portion to be scanned with the laser lights during the first and second laser light irradiation operations is determined with reference to the positions of the markers. Note that the portion to be scanned with the laser lights during the second laser light irradiation operation varies depending on an angle between the scanning direction of the first laser light irradiation operation and the scanning direction of the second laser light irradiation operation. It does not matter whether the angle between the scanning direction of the first laser light irradiation operation and the scanning direction of the second laser light irradiation operation is presorted in a memory or the like or is manually inputted as occasion demands. Then, with reference to the formed markers, the laser lights are irradiated onto the portion to be scanned with the laser lights during the first laser light irradiation operation, thereby partially crystallizing the semiconductor film.

Next, the scanning direction of the laser lights is changed by a predetermined value using the first means, the direction of the slit is also changed in accordance with the changing of the scanning direction, and there is performed the second laser light irradiation operation. In this manner, the semiconductor film is partially crystallized.

Then, after the irradiation of the laser lights, a polycrystalline semiconductor film obtained by the irradiation of the laser lights is patterned and etched, thereby forming island-like semiconductor films. Following this, there is performed a step for producing TFTs from these island-like semiconductor films. The concrete step for producing the TFTs varies depending on the shape of the TFTs. Representatively, however, gate insulating films are formed and impurity regions are formed in the island-like semiconductor films. Then, interlayer insulating films are formed so as to cover the gate insulating films and gate electrodes, and contact holes are established in the interlayer insulating films. In this manner, there are obtained exposed parts of the impurity regions. Then, wiring is formed on the interlayer insulating films so as to contact the impurity regions through the contact holes.

Figure 18:
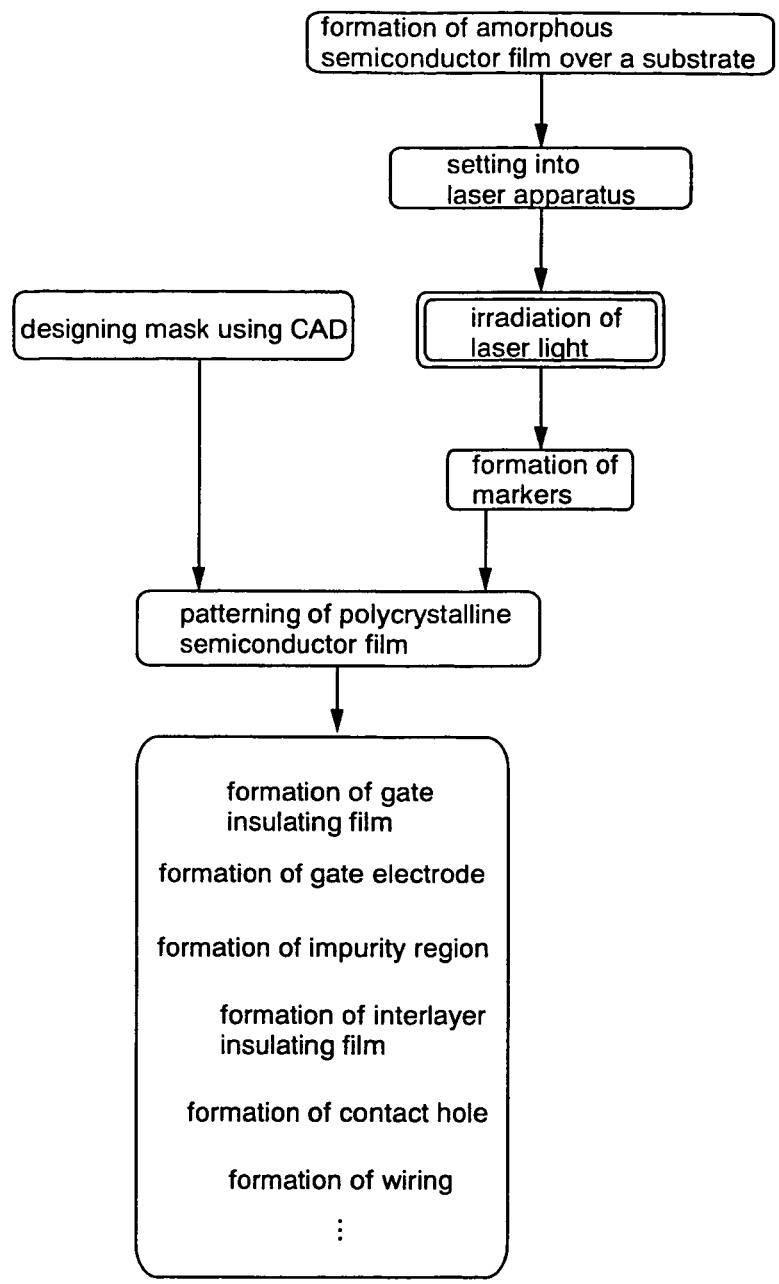
FIG. 18 shows a conventional production flow.

It should be noted here that as a comparison example, a conventional flow for producing a semiconductor device is shown in FIG. 18 as a flowchart. As shown in FIG. 18, the designing of masks for a semiconductor device is performed using CAD. On the other hand, an amorphous semiconductor film is formed on a substrate and the substrate, on which the amorphous semiconductor film has been formed, is placed in a laser irradiation apparatus. Then, laser lights are scanned and irradiated onto the entire surface of the amorphous semiconductor film, thereby crystallizing the entire surface of the amorphous semiconductor film. Then, markers are formed in a polycrystalline semiconductor film obtained through the crystallization and island-like semiconductor films are formed by patterning the polycrystalline semiconductor film with reference to the markers. Then, TFTs are produced using the island-like semiconductor films.

As described above, in contrast to a conventional case such as the case shown in FIG. 18, in the present invention, markers are formed using a laser light prior to the crystallization of an amorphous semiconductor film. Then, laser lights are scanned in accordance with information concerning masks for patterning the semiconductor film.

With the construction described above, it becomes possible to save a time taken to irradiate the laser lights onto each portion to be removed through patterning after the crystallization of the semiconductor film, which makes it possible to shorten a time taken to irradiate the laser lights and also to improve the speed at which a substrate is processed.

It should be noted here that there may be included a step for crystallizing the semiconductor film using a catalyst. In the case where a catalytic element is used, it is preferable that there is used the technique disclosed in JP 07-130652 A or JP 08-78329 A.

If a step whereby a catalyst is used for crystallizing a semiconductor film is included, it includes a step whereby an amorphous semiconductor film is formed and then crystallized using Ni (NiSPC). For instance, in the case where there is used the technique disclosed in JP 07-130652 A, a nickel-containing layer is formed by applying a nickel acetate solution containing 10 ppm nickel on a weight basis onto the amorphous semiconductor film. Then, after a dehydrogenation step is performed for one hour at 500° C., crystallization is performed by performing heat treatment for 4 to 12 hours at 500 to 650° C. (for eight hours at 550° C., for instance). Note that, as to a usable catalytic element, an element such as germanium (Ge), iron (Fe), palladium (Pd), tin (Sn), lead (Pd), cobalt (Co), platinum (Pt), copper (Cu), or gold (Au) may be used in addition to nickel (Ni).

Also, the crystallinity of the semiconductor film crystallized by NiSPC is further enhanced using the irradiation of laser lights. A polycrystalline semiconductor film obtained by the laser light irradiation contains a catalytic element and there is performed a step (gettering) for removing the catalytic element from the crystalline semiconductor film after the laser light irradiation. It is possible to use the technique disclosed in JP 10-135468 A or JP 10-135469 A to perform the gettering.

In more detail, phosphorus is added to a part of the polycrystalline semiconductor film obtained after the laser irradiation and heat treatment is performed in a nitrogen atmosphere for 5 to 24 hours at 550 to 800° C. (for 12 hours at 600° C., for instance). As a result of this processing, the region of the polycrystalline semiconductor film, in which there has been added the phosphorus, functions as a gettering site and it becomes possible to segregate the phosphorus existing in the polycrystalline semiconductor film in the region in which the phosphorus has been added. Following this, by removing the region of the polycrystalline semiconductor film, in which the phosphorus has been added, through patterning, it is possible to obtain island-like semiconductor films in which the density of the catalytic element is reduced to $1\times10^{17}$ atoms/cm$^3$ or below, preferably, around $1\times10^{16}$ atms/cm$^3$.

As described above, according to the present invention, laser lights are not scanned and irradiated on the entire surface of the semiconductor film but are scanned so that it is possible to crystallize at least each indispensable portion to a minimum. With the construction described above, it becomes possible to save on time taken to irradiate the laser lights onto each portion to be removed through patterning after the crystallization of the semiconductor film and to significantly shorten a time taken to process one substrate.

EMBODIMENTS

Hereinafter, there will be described embodiments of the present invention.

Embodiment 1

The crystalline semiconductor film formed by irradiation of laser light comprises aggregations of a plurality of crystal grains. The crystal grains have random positions and sizes and hence, it is difficult to form a crystalline semiconductor film with specified position and size of crystal grains. Accordingly, the active layers formed by patterning the crystalline semiconductor film into the islands may contain grain interfaces (grain boundaries).

Unlike crystal grains, the grain boundaries contains therein an infinite number of recombination centers and trapping centers associated with amorphous structure and crystal defects. It is known that carriers trapped in the trapping centers increase the potential of the grain boundaries, which form barriers against carriers, so that the carriers are reduced in current transportability. Therefore, the grain boundaries present in the active layer of a TFT, or particularly in the channel forming region, will exert serious effects on the TFT characteristics, such as a significant decrease in the mobility of the TFT, or an increased OFF current due to current flow through the grain boundaries. Furthermore, a plurality of TFTs, fabricated based on the premise that the same characteristics can be obtained, will encounter varied characteristics due to the presence of the grain boundaries in the active layers.

The reason why the laser irradiation on the semiconductor film produces crystal grains of random sizes at random positions is as follows. That is, a certain length of time is taken before the formation of solid-phase nuclei takes place in a semiconductor film completely molten by the laser irradiation. With the passage of time, an infinite number of crystal nuclei occur in the fully molten region and crystals grow from the respective nuclei. Since the crystal nuclei occur at random positions, an irregular distribution of the crystal nuclei results. The crystal grains grow to collide with one another, where the crystal grow process terminates. Consequently, the crystal grains have random positions and sizes.

On the other hand, there has been proposed a method wherein the crystalline semiconductor film is formed by locally melting the semiconductor film instead of melting the whole semiconductor film. In this case, the laser irradiation produces a portion where the semiconductor film is completely molten and a portion where a solid-phase semiconductor region is present, the solid-phase semiconductor region acting as the crystal nuclei from which grains start growing. Nucleation in the completely molten region requires a certain length of time. During the lapse of time until the occurrence of nucleation in the completely molten region, the grains grow from the solid-phase semiconductor region, as the crystal nuclei, in a horizontal direction (hereinafter referred to as "lateral direction") with respect to the surface of the semiconductor film. Accordingly, the grains grow in lengths no less than dozens times the thickness of the semiconductor film. After the lapse of some time, crystal grains in the completely molten region also start crystallizing and collide with the grains growing from the nuclei, where the lateral crystal grow terminates. Hereinafter, this phenomenon will be referred to as "superlateral growth".

The superlateral growth process provides relatively larger crystal grains, correspondingly reducing the number of grain boundaries. Unfortunately, laser light for effecting the superlateral growth is quite limited in the range of energy. In addition, it is difficult to control the location where large grains are formed. Furthermore, other regions than the large grains are minor crystal regions containing an infinite number of nuclei or amorphous regions and hence, irregular crystal sizes result.

It is contemplated that a location- and direction-controlled grain growth process is practicable if laser light in such an energy range as to completely melt the semiconductor film is used and a lateral temperature gradient can be controlled. A variety of attempts have been made to realize this process.

For instance, James. S. Im et al at Colombia University have proposed Sequential Lateral Solidification method (hereinafter referred to as SLS method) for effecting the superlateral growth at arbitrary locations. The SLS process is arranged such that crystallization is performed by translating a slit mask by a distance of superlateral growth (about 0.75 µm) at each shot of the laser light.

This embodiment illustrates an example where the SLS process is applied to the invention.

Firstly, a first laser light is irradiated on a semiconductor film. In this case, a pulse oscillation type laser and a continuous wave type laser are both usable. The first laser light is irradiated exclusively on an area defined by a mask. Although the energy density of the first laser light varies depending upon the thickness of the semiconductor film, the first laser light may have such a degree of energy density as to enhance the crystallinity of the area defined by the mask.

Next, the scanning direction is changed and a second laser light is irradiated on the area defined by the mask. The second laser light is emitted from the pulse oscillation type laser and is irradiated at such an energy density as to melt a local portion of the area defined by the mask to the full depth of the semiconductor film.

Figure 19A:
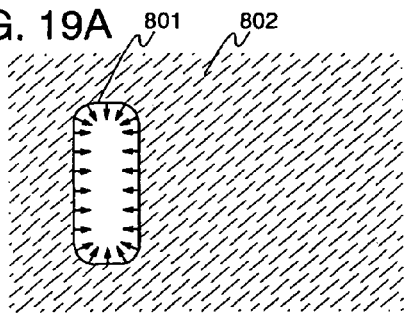
FIGS. 19A to 19E illustrate a mechanism of crystallization using an SLS method.

FIG. 19A schematically shows a state of the semiconductor film immediately after a first shot of the second laser light. A semiconductor film 802 is equivalent to the area enhanced in crystallinity by the irradiation of the first laser light. The irradiation of the second laser light locally melts the semiconductor film 802 to the full depth thereof at the portion thereof under a beam spot 801.

At this time, the semiconductor film 802 is fully molten at its portion under the beam spot 801 whereas a portion out of the beam spot is not molten or molten at much lower temperature than the beam spot portion. Therefore, an edge of the beam spot portion forms seed grains, which grow laterally from the edge of the beam spot portion toward center as indicated by arrows in the figure.

As the crystal growth proceeds with time, the grains collide with grains from seed grains produced in the fully molten portion or with the growing seed grains on the opposite side so that the grain growth stops at a central portion 803 of the beam spot. FIG. 19B schematically shows a state of the semiconductor film at the termination of the crystal growth. The semiconductor film has an irregular surface at the central portion 803 of the beam spot, where a greater number of fine crystals are present than in the other portion or the crystal grains collide with one another.

Next, a second shot of the second laser light is applied. The second shot is applied to place slightly shifted from the beam spot of the first shot. FIG. 19C schematically shows a state of the semiconductor film immediately after the second shot. In FIG. 19C, a beam spot of the second shot is shifted from the portion 801 under the beam spot of the first shot to a degree that the beam spot of the second shot covers the central portion 803 formed by the first shot.

At this time, a portion under a beam spot 804 of the second shot is fully molten whereas a portion out of the beam spot is not molten or molten at much lower temperature than the beam spot portion. Therefore, an edge of the beam spot portion forms seed grains, which grow laterally from the edge of the beam spot portion toward center as indicated by arrows in the figure. At this time, out of the portion 801 crystallized by the first shot, a part unirradiated by the beam spot of the second shot forms seed grains so that the laterally grown grains due to the first shot further grow along the scanning direction.

As the crystal growth proceeds with time, the grains collide with grains from seed grains produced in the fully molten portion or with the growing seed grains on the opposite side so that the grain growth stops at a central portion 805 of the beam spot of the second shot. FIG. 19D schematically shows a state of the semiconductor film at the termination of the crystal growth. The semiconductor film has an irregular surface at the central portion 805 of the beam spot, where a greater number of fine crystals are present than in the other portion or the crystal grains collide with one another.

Figure 19E:
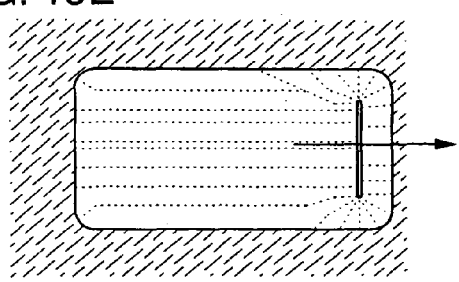
Figure 19B:
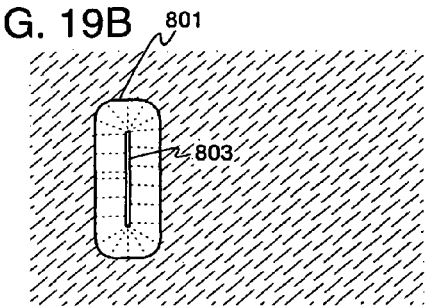
Figure 19C:
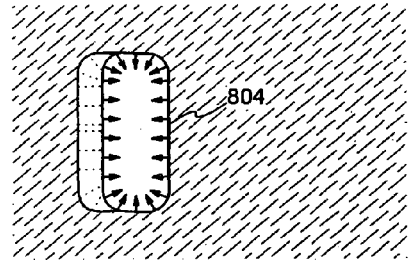
Figure 19D:
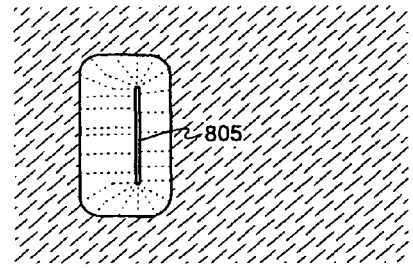

In a similar manner, a third shot and the subsequent shots are applied as slightly shifting beam spots thereby accomplishing the crystal growth extending in parallel with the scanning direction, as shown in FIG. 19E.

According to the above arrangement, the local crystallization can be accomplished while controlling the location and size of the crystal grains.

Next, description is made on another embodiment than that of FIG. 19, which applies the SLS process to the invention.

Firstly, a first laser light is irradiated on a semiconductor film. In this case, a pulse oscillation type laser and a continuous wave type laser are both usable. The first laser light is irradiated exclusively on an area defined by a mask. Although the energy density of the first laser light varies depending upon the thickness of the semiconductor film, the first laser light may have such a degree of energy density as to enhance the crystallinity of the area defined by the mask.

Next, the scanning direction is changed and a second laser light is irradiated on the area defined by the mask. The second laser light is emitted from the pulse oscillation type laser and irradiated at such an energy density as to melt a local portion of the area defined by the mask to the full depth of the semiconductor film.

Figure 20A:
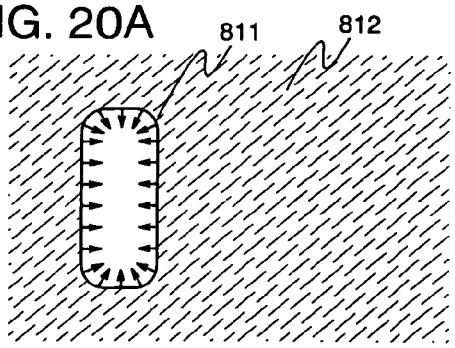
FIGS. 20A to 20E illustrate a mechanism of crystallization using an SLS method.

FIG. 20A schematically shows a state of the semiconductor film immediately after the first shot of the second laser light. A semiconductor film 812 is equivalent to the area enhanced in crystallinity by the irradiation of the first laser light. The irradiation of the second laser light locally melts the semiconductor film 812 to the full depth thereof at the portion thereof under a beam spot 811. An edge of the beam spot portion forms seed grains, which grow laterally from the edge of the beam spot portion toward center as indicated by arrows in the figure.

As the crystal growth proceeds with time, the grains collide with grains from seed grains produced in the fully molten portion or with the growing seed grains on the opposite side so that the grain growth stops at a central portion 813 of the beam spot. FIG. 20B schematically shows a state of the semiconductor film at the termination of the crystal growth. The semiconductor film has an irregular surface at the central portion 813 of the beam spot, where a greater number of fine crystals are present than in the other portion or the crystal grains collide with one another.

Next, a second shot of the second laser light is applied. The second shot is applied to place slightly shifted from the beam spot of the first shot. FIG. 20C schematically shows a state of the semiconductor film immediately after the second shot. A beam spot of the second shot is shifted from the portion 811 under the beam spot of the first shot. In FIG. 20C, a beam spot of the second shot does not cover the central portion 813 formed by the first shot, shifted therefrom to a degree that the beam spot of the second shot overlaps a part of the beam spot of the first shot.

An edge of the portion under the beam spot of the second shot forms seed grains, which grow laterally from the edge of the beam spot portion toward center as indicated by arrows in the figure. At this time, out of the portion 811 crystallized by the first shot, a part unirradiated by the second shot forms seed grains so that the laterally grown grains due to the first shot further grow along the scanning direction.

As the crystal growth proceeds with time, the grains collide with grains from seed grains produced in the fully molten portion or with the growing seed grains on the opposite side so that the grain growth stops at a central portion 815 of the beam spot of the second shot. FIG. 20D schematically shows a state of the semiconductor film at the termination of the crystal growth. The semiconductor film has an irregular surface at the central portion 815 of the beam spot, where a greater number of fine crystals are present than in the other portion or the crystal grains collide with one another.

Figure 20E:
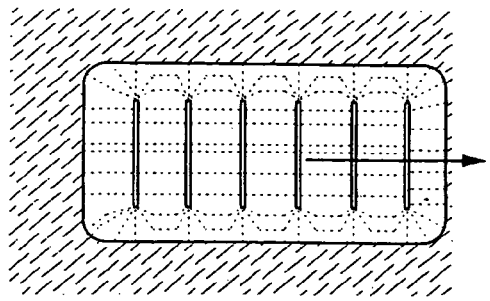
Figure 20B:
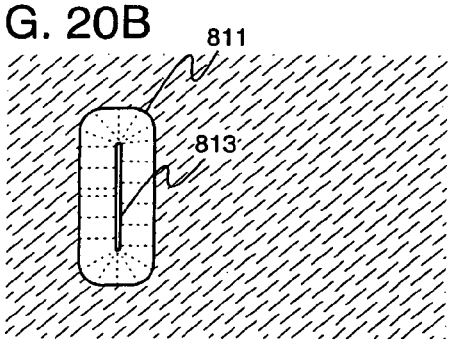
Figure 20C:
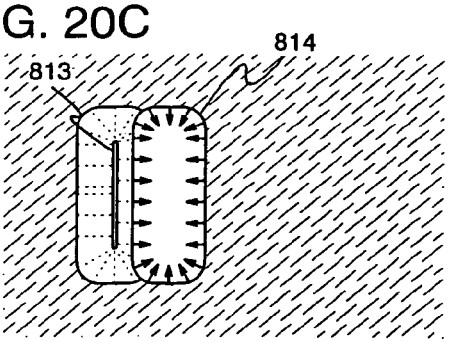
Figure 20D:
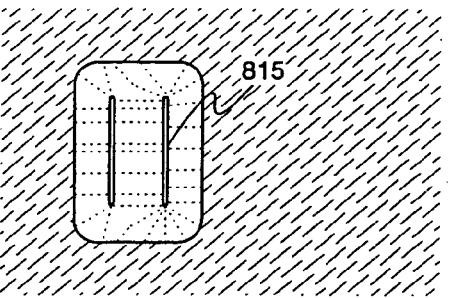

In a similar manner, a third shot and the subsequent shots are applied as slightly shifting beam spots thereby accomplishing the crystal growth extending in parallel with the scanning direction, as shown in FIG. 20E. According to the above arrangement, the local crystallization can be accomplished while controlling the location and size of the crystal grains.

The central portions of the beam spots remain in the crystals formed by the irradiation method shown in FIG. 20. Since the center of the beam spot does not present a favorable crystallinity, it is preferred to lay out the active layers in a manner to preclude the beam spot centers from the channel forming regions or more preferably from the active layers.

In the both laser irradiation methods shown in FIGS. 19 and 20, the channel forming regions contain a reduced number of grain boundaries if the active layers are laid out in a manner that the crystal grains grow in parallel with the direction of carrier movement in the channel forming regions. This leads to an increased carrier mobility and a decreased OFF current. If, on the other hand, the active layers are laid out in a manner that the crystal grains grow in an angled direction relative to the direction of carrier movement in the channel forming regions rather than in parallel therewith, the channel forming regions contain an increased number of grain boundaries. According to a comparison among plural active layers, however, the individual active layers have a smaller difference percentage of the total grain boundaries in the channel forming region, leading to decreased variations of the mobility and OFF current of the resultant TFTs.

Although the embodiment uses the SLS process in the radiation of the second laser light, the embodiment is not limited to this arrangement. For instance, a first laser irradiation may be performed for crystallization using the SLS process, and a second laser irradiation may be performed using a pulse oscillation laser thereby eliminating defects in the crystal grains formed by the first laser irradiation and further enhancing crystallinity. The pulse oscillation laser generally has a higher energy density than a continuous wave laser and provides a relatively larger beam spot, thus reducing the processing time per substrate and achieving a higher processing efficiency.

In this embodiment, an example that the laser light is irradiated twice, however, the laser light may be irradiated only once.

It is noted that the embodiment may employ a mask for shaping the beam spot of the laser light in order to define a region for nucleation. Usable lasers include, but not limited to, pulse oscillation type excimer lasers, YLF lasers and the like.

Embodiment 2

In this embodiment, description is made on an optical system for overlapping beam spot.

Figure 21A:
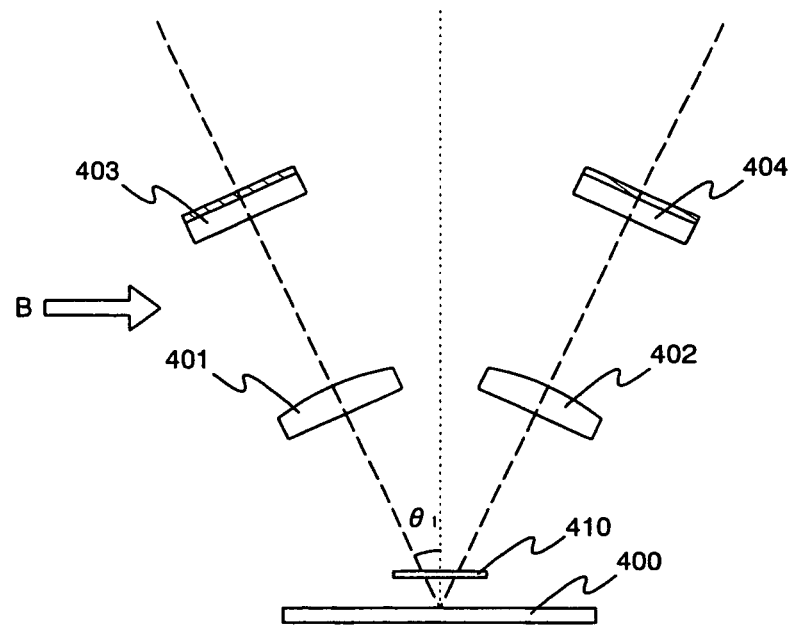
FIGS. 21A and 21B show each an optical system of the laser irradiation apparatus.
Figure 21B:
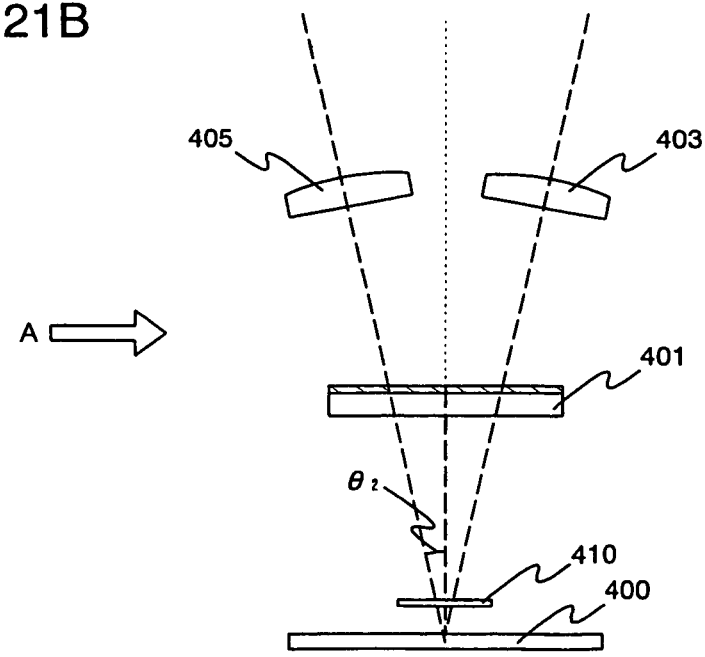

FIGS. 21A and 21B illustrate exemplary optical systems according to the embodiment. FIG. 21A shows a side view an optical system of the laser irradiation equipment of the present invention. FIG. 21B shows a side view that is viewed along the direction of the arrow B in the FIG. 21A. FIG. 21A shows a side view that is viewed along the direction of the arrow A in FIG. 21B.

FIG. 21 shows an optical system which is adopted synthesize the four beam spots into a single beam spot. In this embodiment, the number of beam spot for synthesizing is not limited to this, the number may range between 2 and 8 (inclusive).

Figure 22:
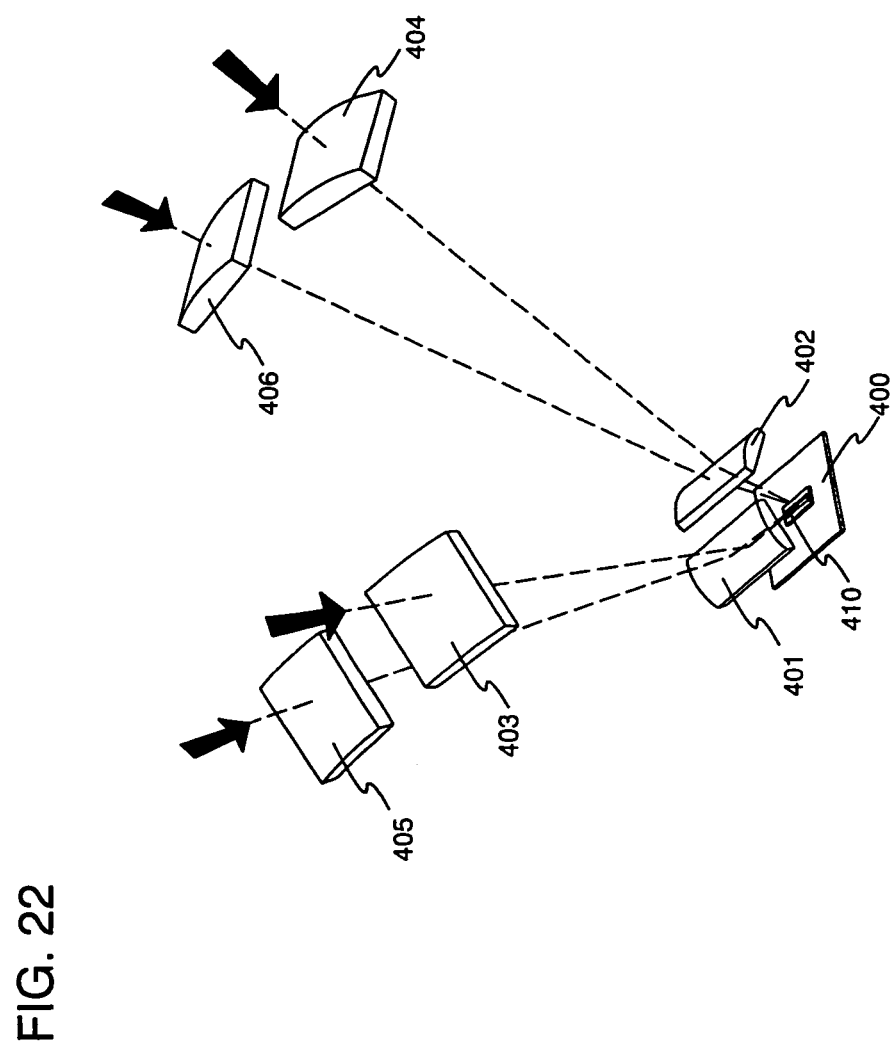
FIG. 22 shows an optical system of the laser irradiation apparatus.

Reference numerals 401 to 405 are cylindrical lenses, not shown in FIG. 21. The optical system of this embodiment includes six cylindrical lenses. Reference numeral 410 is a slit. FIG. 22 shows a vertical view of optical system shown in FIG. 21. Laser beam pass through the respective cylindrical lenses 403 to 406 from the different laser oscillation devices.

The laser beams shaped by the cylindrical lenses 403, 405 enter the cylindrical lens 401. The entered laser beams are shaped by the cylindrical lenses, and enter to the slit 410 to be shaped again and impinge upon the irradiation object 400. On the other hand, the laser beams shaped by the cylindrical lenses 404, 406 enter the cylindrical lens 402. The entered laser beams are shaped by the cylindrical lenses, and enter to the slit 410 to be shaped again and impinge upon the irradiation object 400.

The beam spots of the laser beams on the irradiation object 400 are partially superpositioned on each other so as to be synthesized into a single beam spot.

A focal length of the cylindrical lenses 401, 402 closest to the irradiation object 400 is defined to be 20 mm, and a focal length of the cylindrical lenses 403 to 406 is defined to be 150 mm. In this embodiment, the cylindrical lenses 401, 402 are so positioned as to apply the laser beams to the irradiation object 400 at an incidence angle of 25° (an incident angle $\theta_1$), whereas the cylindrical lenses 403 to 406 are so positioned as to apply the laser beams to the cylindrical lenses 401, 402 at an incidence angle of 10° (an incident angle $\theta_2$).

A focal length and incidence angle of each lens may properly be defined by the designer. Further, the number of cylindrical lenses is not limited to this and the optical system used is not limited to cylindrical lenses. It is sufficient that in the present invention, there is used an optical system that is capable of processing the beam spot of a laser light oscillated from each laser oscillation apparatus so that there is obtained a shape and energy density suited for the crystallization of a semiconductor film and of synthesizing the beam spots of all laser lights into single beam spot by having the beam spots overlap each other.

It should be noted here that in this embodiment, there has been described an example where four beam spots are synthesized. In this case, there are provided four cylindrical lenses, which respectively correspond to four laser oscillation apparatuses, and two cylindrical lenses that correspond to the four cylindrical lenses. In the case where beam spots, whose number is n (n=2, 4, 6, or 8), are combined, there are provided n cylindrical lenses, which respectively correspond to n laser oscillation apparatuses, and n/2 cylindrical lenses that correspond to the n cylindrical lenses. In the case where beam spots, whose number is n (n=3, 5, or 7), are combined, there are provided n cylindrical lenses, which respectively correspond to n laser oscillation apparatuses, and (n+1)/2 cylindrical lenses that correspond to the n cylindrical lenses.

Next, a description is made on an optical system of the laser irradiation equipment of the present invention using eight laser oscillation devices.

Figure 23:
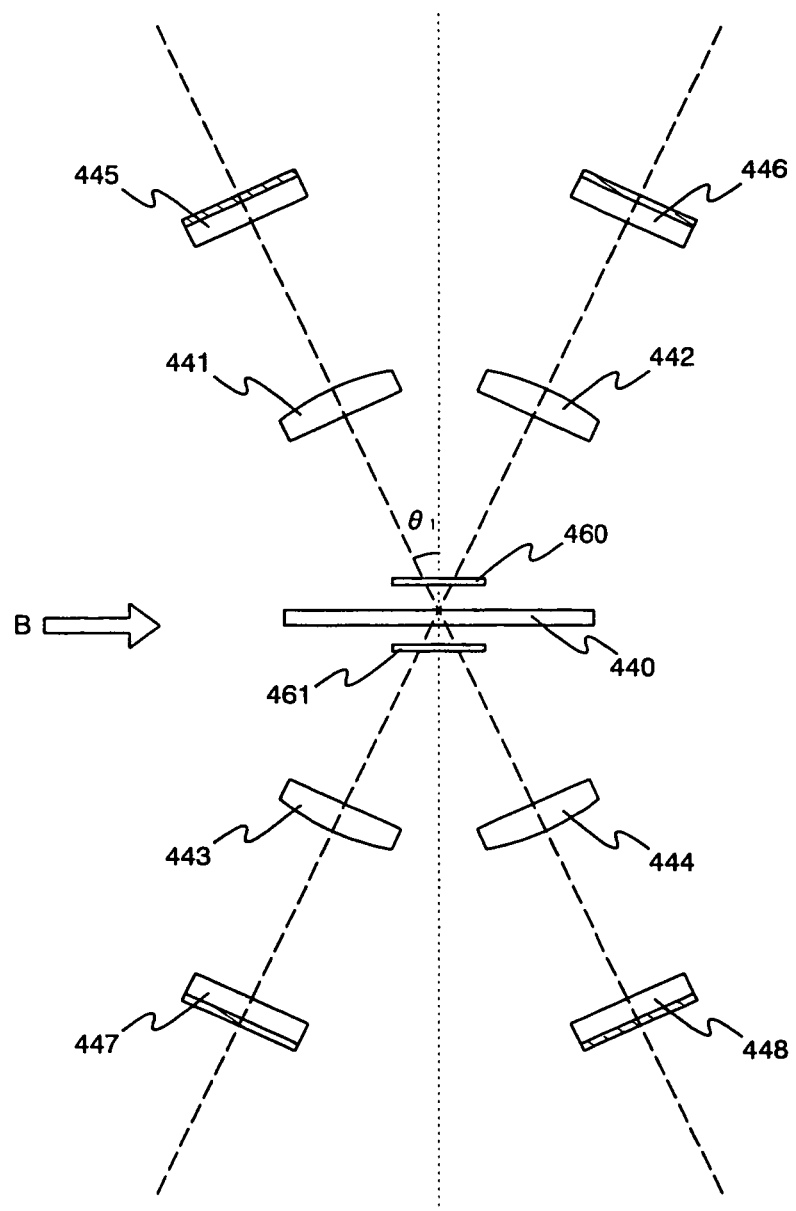
FIG. 23 shows an optical system of the laser irradiation apparatus.
Figure 24:
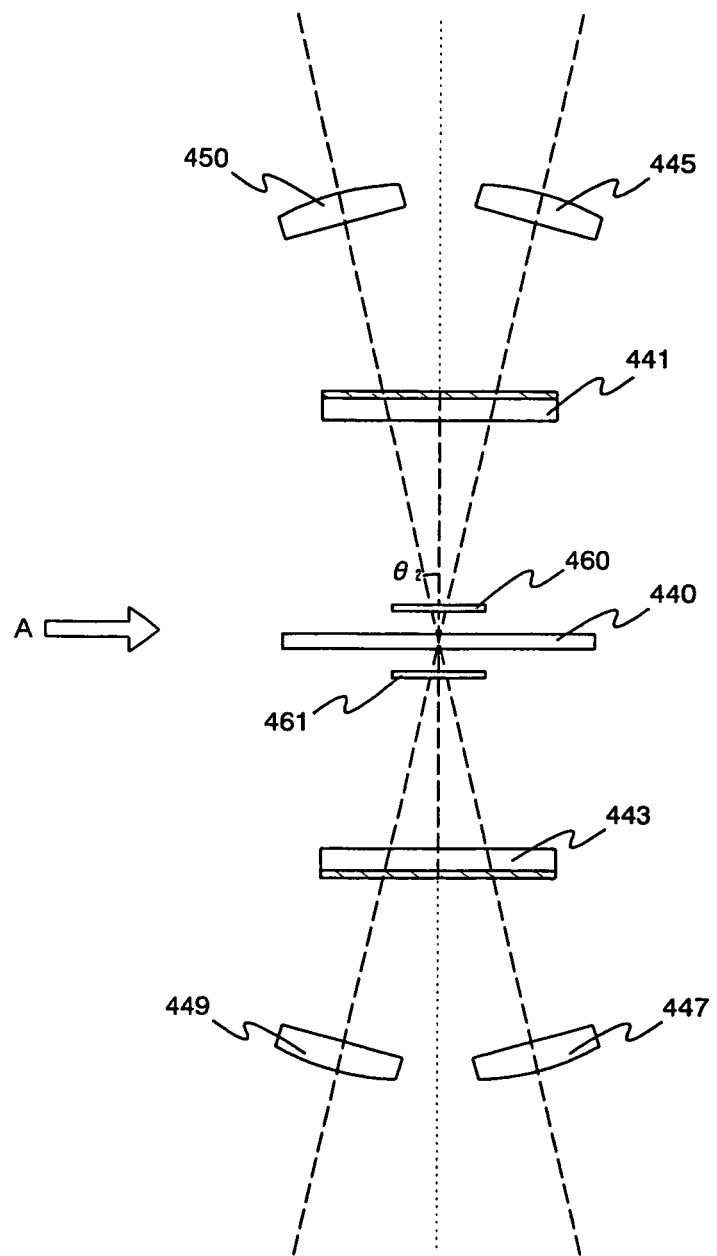
FIG. 24 shows an optical system of the laser irradiation apparatus.

FIGS. 23, 24 illustrate exemplary optical systems according to the embodiment. FIG. 23 shows a side view an optical system of the laser irradiation equipment of the present invention. FIG. 24 shows a side view that is viewed along the direction of the arrow B in the FIG. 23. FIG. 23 shows a side view that is viewed along the direction of the arrow A in FIG. 24.

FIGS. 23, 24 show an optical system which is adopted synthesize the eight beam spots into a single beam spot. In this embodiment, the number of beam spot for synthesizing is not limited to this, the number may range between 2 and 8 (inclusive).

Figure 25:
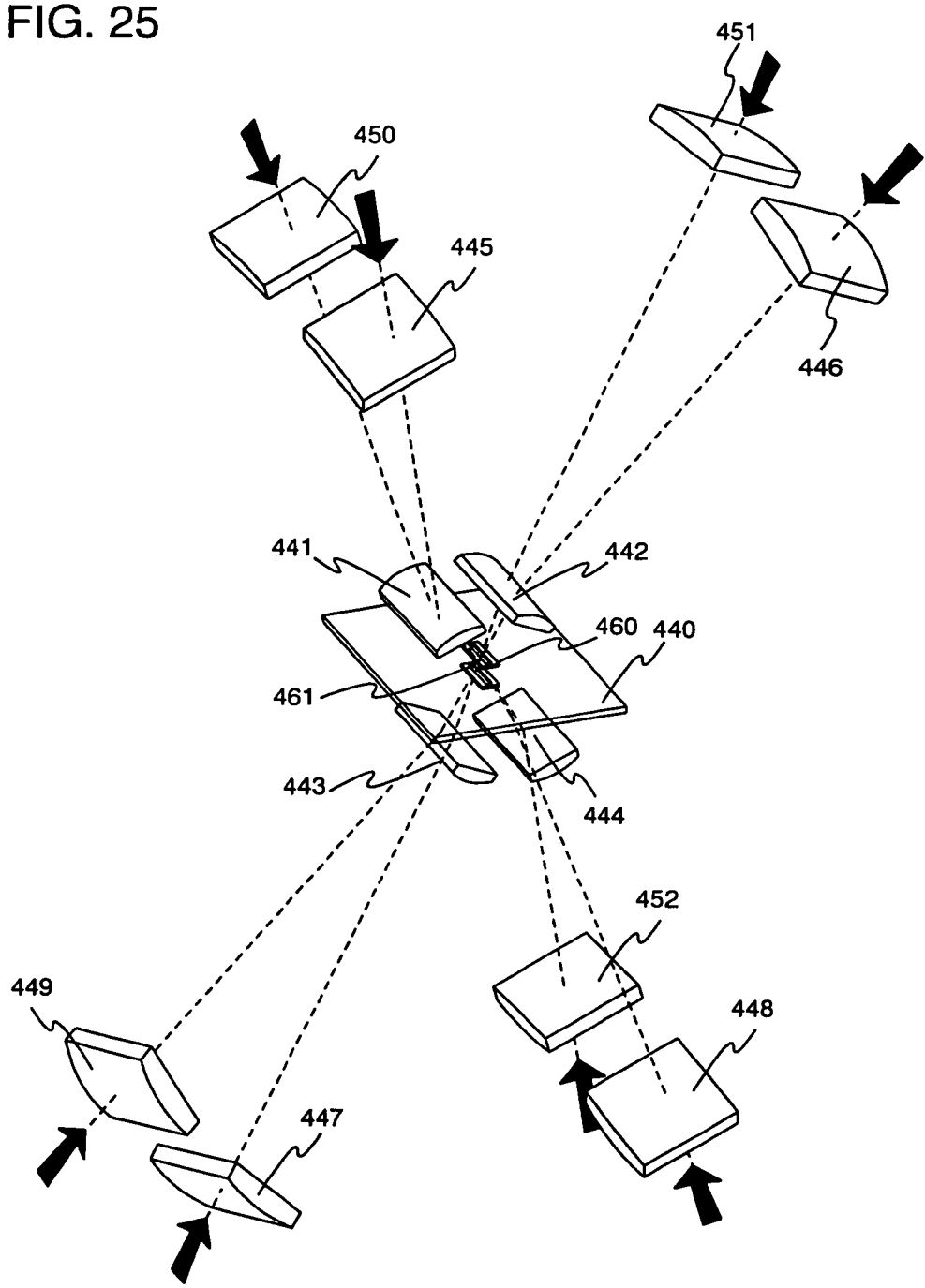
FIG. 25 shows an optical system of the laser irradiation apparatus.

Reference numerals 441 to 450 are cylindrical lenses, not shown in FIGS. 23, 24. The optical system of this embodiment includes twelve cylindrical lenses 441 to 452. Reference numerals 460, 461 are slits. FIG. 25 shows a vertical view of optical system shown in FIGS. 23, 24. Laser beams pass through the respective cylindrical lenses 441 to 444 from the different laser oscillation devices.

The laser beams shaped by the cylindrical lenses 450, 445 enter the cylindrical lens 441. The entered laser beams are shaped by the cylindrical lens 441, and enter to the slit 460 to be shaped again and impinge upon the irradiation object 440. The laser beams shaped by the cylindrical 451, 446 enter the cylindrical lens 442. The entered laser beams are shaped by the cylindrical lens 442, and enter to the slit 460 to be shaped again and impinge upon the irradiation object 440. The laser beams shaped by the cylindrical lenses 449, 447 enter the cylindrical lens 443. The entered laser beams are shaped by the cylindrical lens 443, and enter to the slit 461 to be shaped again and impinge upon the irradiation object 440. The laser beams shaped by the cylindrical lenses 452, 448 enter the cylindrical lens 444. The entered laser beams are shaped by the cylindrical lens 444, and enter to the slit 461 to be shaped again and impinge upon the irradiation object 440.

The beam spots of the laser beams on the irradiation object 440 are partially superpositioned on each other so as to be synthesized into a single beam spot.

A focal length of the cylindrical lenses 441 to 444 closest to the irradiation object 440 is defined to be 20 mm, and a focal length of the cylindrical lenses 445 to 452 is defined to be 150 mm. In this embodiment, the cylindrical lenses 441 to 444 are so positioned as to apply the laser beams to the irradiation object 440 at an incidence angle of 25° (an incident angle $\theta_1$), whereas the cylindrical lenses 445 to 452 are so positioned as to apply the laser beams to the cylindrical lenses 441 to 444 at an incidence angle of 10° (an incident angle $\theta_2$).

A focal length and incidence angle of each lens may properly be defined by the designer. Further, the number of cylindrical lenses is not limited to this and the optical system for using is not limited to cylindrical lenses. It is sufficient that in the present invention, there is used an optical system that is capable of processing the beam spot of a laser light oscillated from each laser oscillation apparatus so that there is obtained a shape and energy density suited for the crystallization of a semiconductor film and of synthesizing the beam spots of all laser lights into single beam spot by having the beam spots overlap each other.

In this embodiment, an example of synthesizing eight beam spots is described. In this case, there are eight cylindrical lenses corresponding to the respective eight laser oscillation devices, and four cylindrical lenses corresponding to the respective eight cylindrical lenses.

In a case where 5 or more beam spots are synthesized, it is preferred in the light of the location of the optical system or interference that the fifth or the subsequent laser beam may be irradiated from the opposite side of the substrate. Thus, the substrate must have light transmission.

To prevent the returning light from tracing back to the light path, it is preferable that the incident light to the substrate is kept more than 0°, no less than 90°.

Assumed that a plane perpendicular to an irradiation face and including either a shorter side or a longer side of say, a rectangular beam spot of each laser beam is defined as an incidence plane to be realized the uniform laser beam irradiation. It is desirable that the incidence angle $\theta$ of the laser beam satisfies $\theta \geq \arctan(W/2d)$ where W denotes a length of the shorter or longer side included in the incidence plane, and d denotes a thickness of the substrate disposed at the irradiation face and being transparent to the laser beam. This logic needs to be realized about each laser beam before synthesized. In a case where a path of a laser beam is out of the incidence plane, the incidence angle $\theta$ thereof is defined by that of a laser beam having its path on the incidence plane. Irradiating the laser beam at this incidence angle $\theta$ provides uniform laser radiation free from interference between light reflected by the surface of the substrate and light reflected by a back side of the substrate. The above logic is made with the proviso that the substrate has a reflectivity of 1. In reality, many of the substrates have reflectivities on the order of 1.5 so that a calculated value based on the reflectivity of 1.5 is greater than the angle determined by the above logic. However, the energy of the beam spot is attenuated at longitudinal opposite ends and hence, the effect of interference at the opposite end portions is insignificant. Thus, the above logical value provides an adequate effect to attenuate interference.

This embodiment may be implemented in combination with Embodiment 1.

Embodiment 3

In this embodiment, description is made on an example where the size of the laser beam spots is changed by changing the length of the slit in the course of laser irradiation using a plurality of laser oscillators.

The laser irradiation equipment provided at the semiconductor fabricating apparatus of the invention is arranged such that the computer determines an area to be scanned with the laser light based on the mask information inputted to the computer. The embodiment is further adapted to change the length of the beam spot according to the configuration of the mask.

Figure 26A:
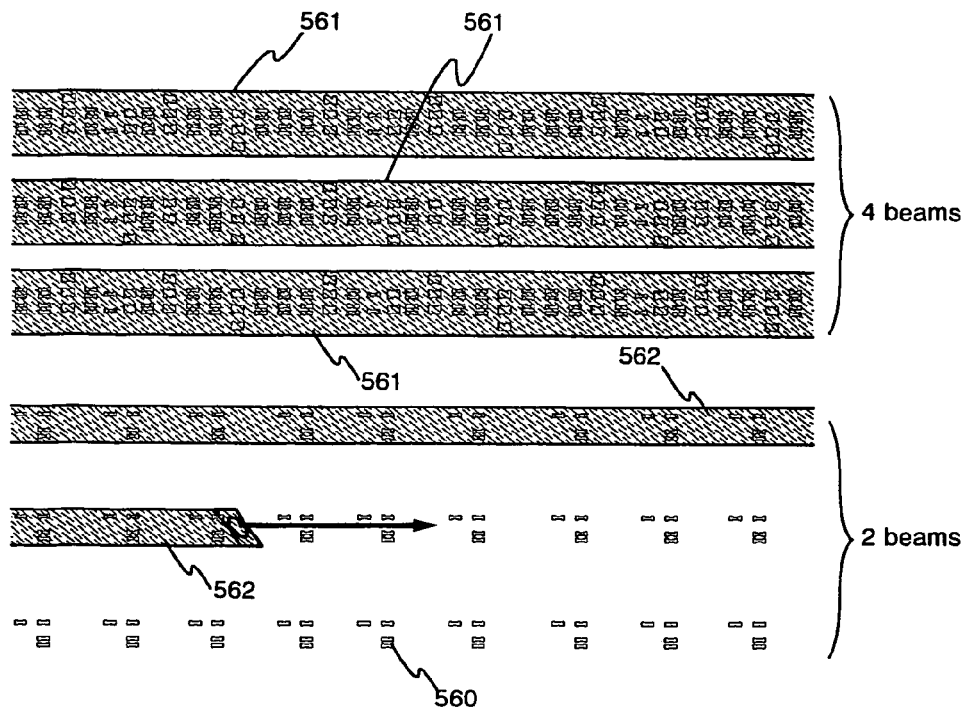
FIGS. 26A and 26B each show a positional relation between portions to be irradiated with laser lights and masks.

FIG. 26A shows an exemplary relation between a configuration of a mask used for patterning the semiconductor film and a length of the beam spot in a case where a single laser irradiation process is performed. A reference numeral 560 denotes a configuration of the mask used for patterning the semiconductor film. After crystallization by the laser irradiation, the semiconductor film is patterned using the mask.

Reference numerals 561, 562 denote areas irradiated with the laser light. The reference numerals 561, 562 denote the area scanned with a beam spot formed by synthesizing beam spots of laser beams outputted from four laser oscillators. The reference numeral 562 is controlled by the slit so as to have shorter length than that of the 561.

Figure 26B:
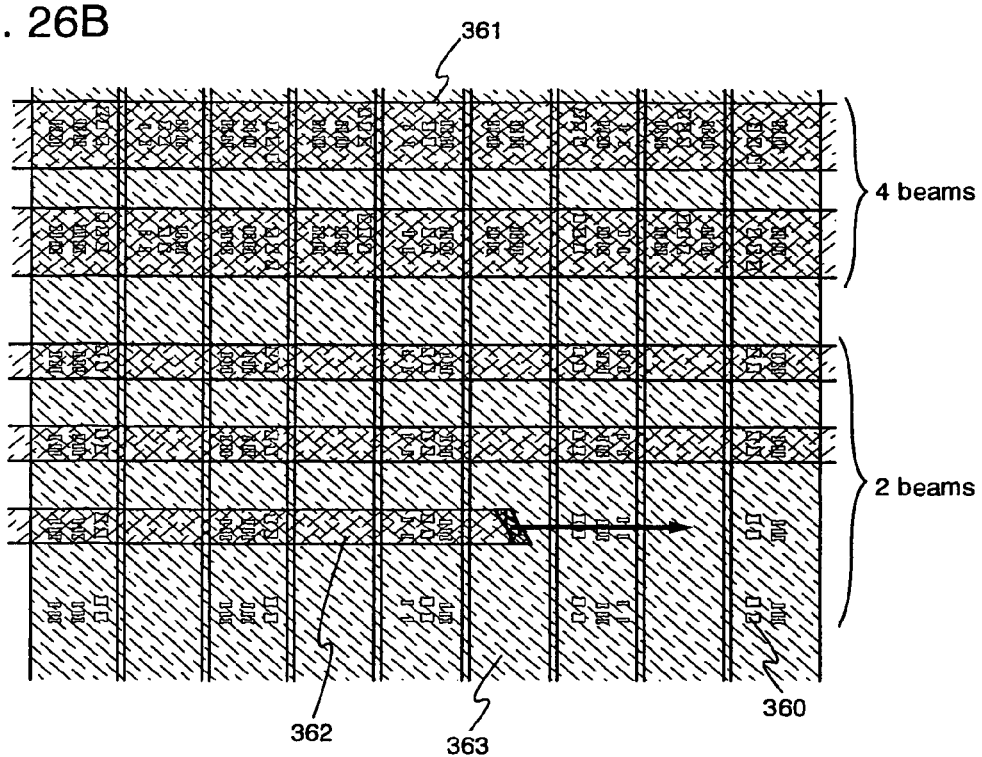

FIG. 26B shows an exemplary relation between a configuration of a mask used for patterning the semiconductor film and a length of the beam spot in a case where two laser irradiation processes are performed. A reference numeral 360 denotes a configuration of the mask used for patterning the semiconductor film. After crystallization by the two laser irradiation processes, the semiconductor film is patterned using the mask.

A reference numeral 363 denotes an area irradiated with a first laser light. Although the first laser light is irradiated on the overall surface of the semiconductor film according to this embodiment, the laser light may be locally irradiated such that at least a portion forming an active layer after patterning may be crystallized. It is critical that the portion forming the active layer after patterning is not overlapped by an edge of the beam spot.

Reference numerals 361, 362 denote areas irradiated with the second laser light. The reference numerals 361, 362 denote the area scanned with a beam spot formed by synthesizing beam spots of laser beams outputted from four laser oscillators. The reference numeral 362 is controlled by the slit so as to have shorter length than that of the 361.

In an alternative approach, the first laser light may be locally irradiated and the second laser light may be irradiated on the overall surface of the semiconductor film.

In the case exemplified by the embodiment, since the slit is used, the length of the beam spot is changed freely without stop the output of all laser oscillation apparatus, so that it can prevent the output from becoming unsteadily due to stop the output of the laser irradiation apparatus.

The above arrangement permits the path of the laser light to be changed in width and therefore, an edge of the laser light path is prevented from overlapping a semiconductor device obtained by patterning. Furthermore, the substrate may be further reduced in damage caused by the laser light irradiated on an unwanted portion thereof.

The embodiment may be implemented in combination with any one of Embodiments 1 and 2.

Embodiment 4

In this embodiment, description is made on an example where the laser light is selectively irradiated on a predetermined portion by operating an AO modulator for blocking the laser light by changing the direction of the laser light in the course of laser irradiation performed by a plurality of laser oscillators. In this embodiment, the laser light is blocked by means of the AO modulator, it is not limited to this, any means may be used as long as the laser light is blocked.

The laser irradiation equipment of the invention is arranged such that the computer determines an area to be scanned with the laser light based on the mask information inputted to the computer. The embodiment is further adapted to block the laser light by means of the AO modulator in order that the laser light is selectively irradiated on the portion to be scanned. In this case, the AO modulator may preferably be formed of a material capable of blocking the laser light and being less susceptible to deformation or damage caused by the laser light.

Figure 27A:
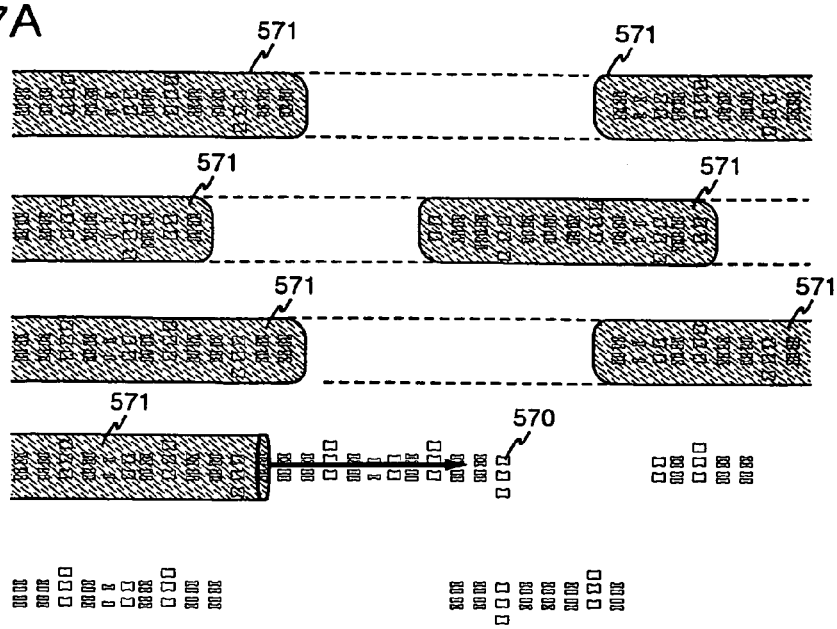
FIGS. 27A and 27B each show a positional relation between portions to be irradiated with laser lights and masks.

FIG. 27A shows an exemplary relation between a configuration of a mask used for patterning the semiconductor film and an area to be irradiated with the laser light. A reference numeral 570 denotes a configuration of the mask used for patterning the semiconductor film. After crystallization by the laser irradiation, the semiconductor film is patterned using the mask.

A reference numeral 571 denotes a portion irradiated with the laser light. A broken line denotes a portion where the laser light is blocked by the AO modulator. Thus, the embodiment is arranged such that the portion where crystallization is not required is not irradiated with the laser light or irradiated with light of a reduced energy density. Accordingly, the substrate may be further reduced in damage caused by the laser light irradiated on an unwanted portion thereof.

Figure 27B:
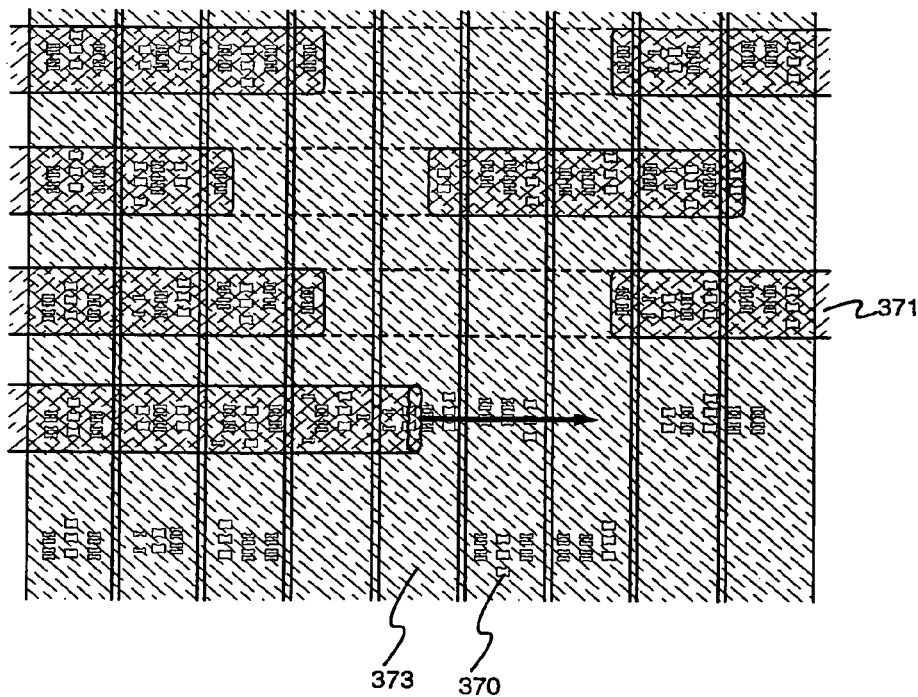

FIG. 27B shows an exemplary relation between a configuration of a mask used for patterning the semiconductor film and an area irradiated with the laser light in a case where two laser irradiation processes are performed. A reference numeral 370 denotes a configuration of the mask used for patterning the semiconductor film. After crystallization by the laser irradiations, the semiconductor film is patterned using the mask.

A reference numeral 373 denotes an area irradiated with a first laser light. Although the first laser light is irradiated on the overall surface of the semiconductor film in this embodiment, the laser light may be locally applied such that at least a portion forming an active layer after patterning may be crystallized. It is critical that the portion forming the active layer after patterning is not overlapped by an edge of the beam spot.

A reference numeral 371 denotes a portion irradiated with a second laser light. A broken line denotes a portion where the laser light is blocked by the shutter. Thus, the embodiment is arranged such that the portion where crystallization is not required is not irradiated with the laser light or irradiated with light of a reduced energy density. Accordingly, the substrate may be further reduced in damage caused by the laser light irradiated on an unwanted portion thereof.

In an alternative approach, the first laser light may be locally irradiated and the second laser light may be irradiated on the overall surface of the semiconductor film.

Next, description is made on a process for fabricating a semiconductor display unit including a pixel portion, signal line drive circuit and scanning line drive circuit, the process wherein the AO modulator is used for selectively subjecting the pixel portion, the signal line drive circuit and the scanning line drive circuit to a single laser irradiation process.

Figure 28A:
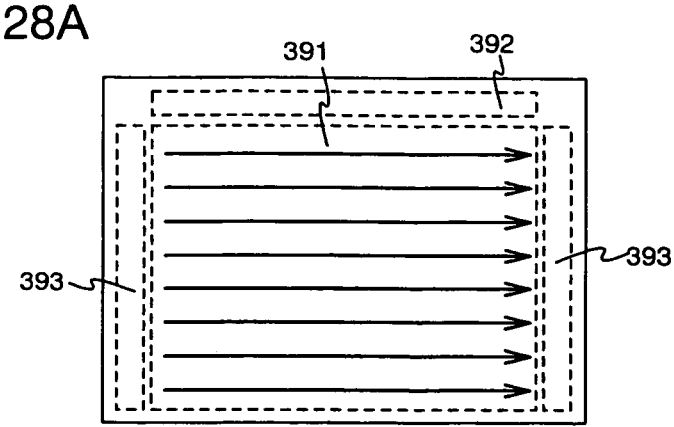
FIGS. 28A and 28B each show a direction in which laser lights move on an object to be processed.

As shown in FIG. 28A, the laser light is scanned along a direction of an arrow in the figure thereby exposing the signal line drive circuit 302 and the pixel portion 301 to the laser light. In this process, the laser light is not irradiated on the overall surface of the substrate. The shutter is used for blocking the laser light thereby obviating the light irradiation on the scanning line drive circuit 303.

Figure 28B:
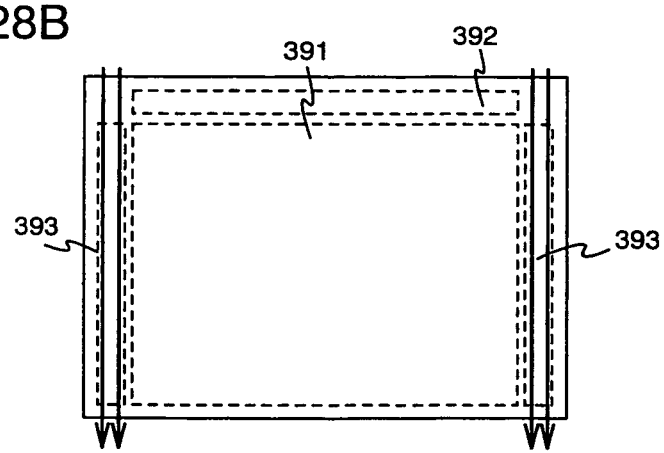

Next, as shown in FIG. 28B, the laser light is scanned along a direction of an arrow in the figure thereby exposing the scanning line drive circuit 393 to the laser light. In this process, the signal line drive circuit 392 and the pixel portion 391 are not exposed to the laser light.

Next, referring to FIG. 29, description is made on another example where the shutter is used for selectively subjecting the pixel portion, the signal line drive circuit and the scanning line drive circuit to a single laser irradiation process.

Figure 29A:
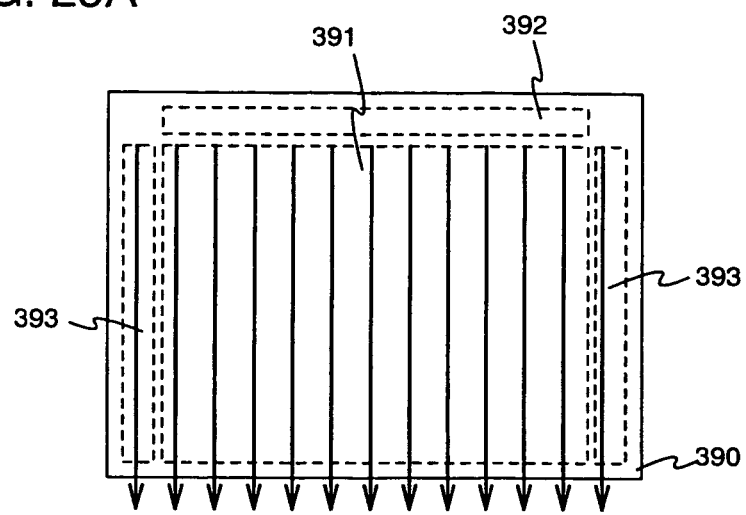
FIGS. 29A and 29B each show a direction in which laser lights move on an object to be processed.

As shown in FIG. 29A, the laser light is scanned along a direction of an arrow in the figure, thereby exposing a scanning line drive circuit 393 and a pixel portion 391 to the laser light. In this Process, the laser light is not irradiated on the overall surface of the substrate and the AO modulator is used for blocking the laser light thereby obviating the light irradiation on a signal line drive circuit 392.

Figure 29B:
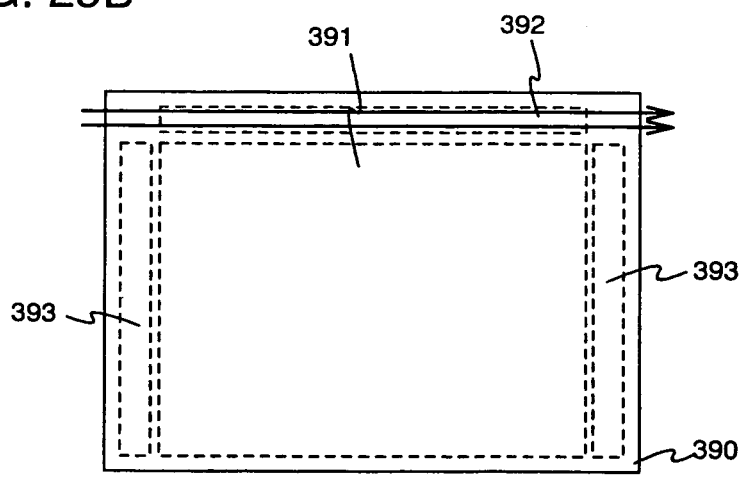

Next, as shown in FIG. 29B, the laser light is scanned along a direction of an arrow in the figure thereby exposing the signal line drive circuit 392 to the laser light. In this process, the signal line drive circuit 393 and the pixel portion 391 are not exposed to the laser light.

The AO modulator may be used in this manner for selectively irradiating the laser light so that the scanning direction of the laser light on each circuit may be changed according to the layout of the channel forming regions of the active layers in each circuit. This prevents double laser irradiation on the same circuit, thus negating the need for restrictions on the definition of the laser light path and on the layout of the active layers in order to prevent the edge of the second laser light from overlapping the laid out active layers.

Next, description is made on an example where a plurality of panels are formed from a large substrate and the AO modulator is used for selectively subjecting the pixel portion, the signal line drive circuit and the scanning line drive circuit to a single laser irradiation process.

Figure 30:
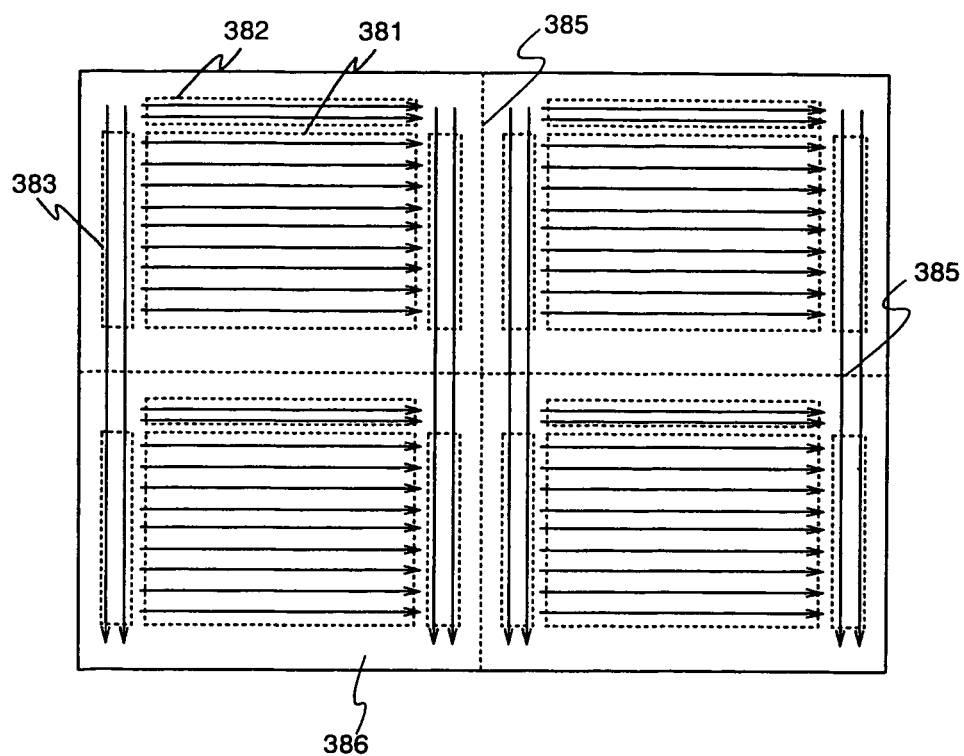
FIG. 30 shows a direction in which laser lights move on an object to be processed.

First, as shown in FIG. 30, the laser light is scanned along a direction of an arrow in the figure thereby exposing a signal line drive circuit 382 and a pixel portion 381 of each panel to the laser light. In this process, the laser light is not irradiated on the overall surface of the substrate and the shutter is used for blocking the laser light thereby obviating the light irradiation on a scanning line drive circuit 383.

Next, the laser light is scanned along a direction of an arrow in the figure, thereby exposing the scanning line drive circuit 383 to the laser light. In this process, the signal line drive circuit 382 and the pixel portion 381 are not exposed to the laser light. Incidentally, a reference numeral 385 denotes a scribe line on a substrate 386.

This embodiment may be implemented in combination with any one of Embodiments 1 to 3.

Embodiment 5

In this embodiment, there will be described an example of a marker provided on a marker forming portion 463.

Figure 31A:
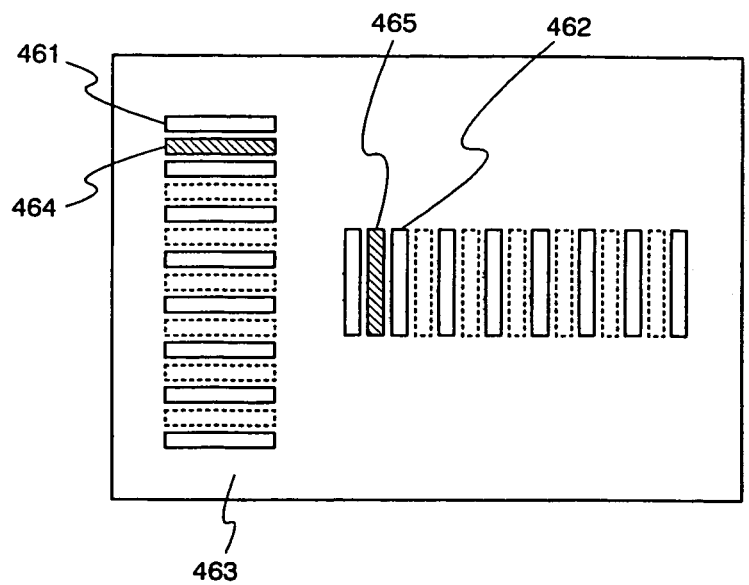
FIGS. 31A and 31B show a construction of markers.

FIG. 31A shows the top view of markers of this embodiment. Reference numerals 461 and 462 denote markers (hereinafter referred to as the reference markers) that will function as reference points formed in a semiconductor film, with each of the reference markers having a rectangular shape. All of the reference markers 461 are disposed so that long sides of the rectangles extend in the horizontal direction, with respective reference markers 461 being disposed in the vertical direction at regular intervals. All of the reference markers 462 are disposed so that long sides of the rectangles extend in the vertical direction, with respective reference markers 462 being disposed in the horizontal direction at regular intervals.

The reference markers 461 become reference points with reference to which there are determined the positions of the masks in the vertical direction, while the reference markers 462 become reference points with reference to which there are determined the positions of the masks in the horizontal direction. Reference numerals 464 and 465 denote markers for the masks for patterning the semiconductor film, with each of the markers having a rectangular shape. The positions of the masks for the semiconductor patterning are determined so that the long sides of the rectangular marker 464 are disposed in the horizontal direction and the long sides of the rectangular marker 465 are disposed in the vertical direction. In addition, the positions of the masks for the semiconductor patterning are determined so that the masks are precisely positioned at the center between two adjacent reference markers 461 that determine the markers 464 and are also precisely positioned at the center between two adjacent reference markers 462 that determine the markers 465.

Figure 31B:
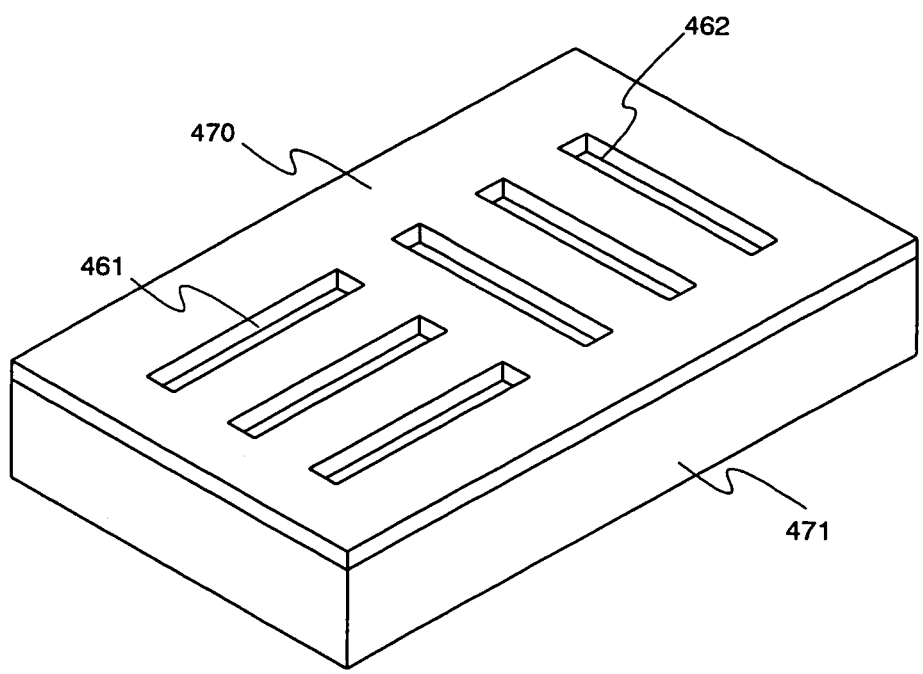

FIG. 31B is a perspective view of the reference markers formed in the semiconductor film. Parts of the semiconductor film 470 formed on the substrate 471 are cut away by a laser in a rectangular shape and the cut-away portions function as the reference markers 461 and 462.

It should be noted here that the markers described in this embodiment are just an example and the markers of the present invention are not limited to these markers. There occurs no problem so long as it is possible to form the markers of the present invention prior to the crystallization of the semiconductor film with the laser beams and also to use the markers even after the crystallization by the irradiation of the laser beams.

Figure 32:
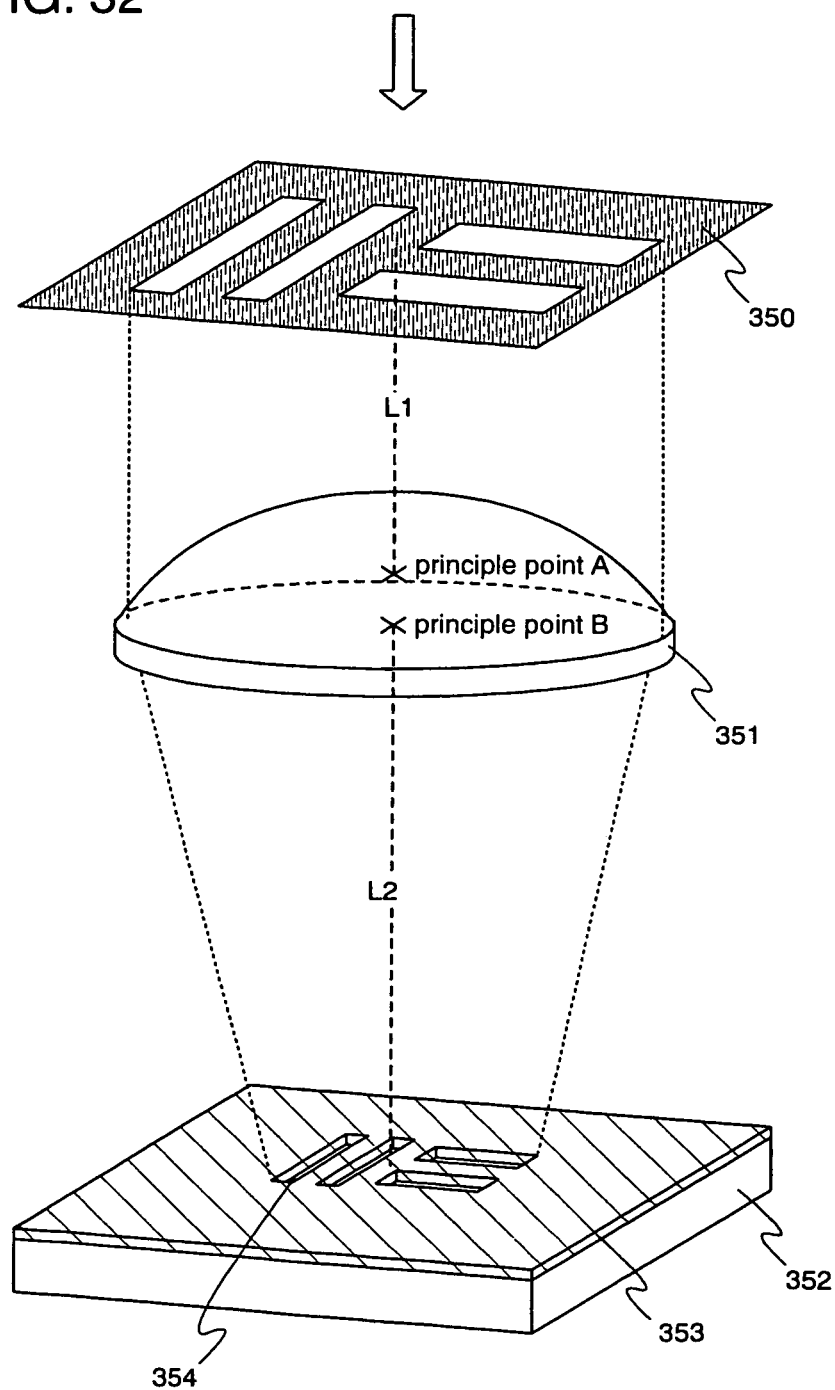
FIG. 32 shows the construction of an optical system for markers.

Next, an example is made on the structure of the optical system for forming marker included in the laser irradiation equipment of the present invention with reference to FIG. 32. In FIG. 32, reference numeral 350 is a reticule for forming the patterning of the marker. The laser beam through the reticule 350 is condensed at a convex lens 351, and irradiated to a semiconductor film 353 formed on a substrate 352. A portion of the semiconductor film where the laser beam is irradiated is removed, and an opening potion 354 is formed. The opening portion may be used as a marker.

The optical system for projecting the reticule pattern by reducing is not limited to the convex lens 351. Any can be used as long as it can reduce the reticule pattern. If the reticule pattern can be formed same order as that of the marker, the optical system for projecting the reticule pattern by reducing is not necessary.

Reference to FIG. 32, the lens 351 has two principle points. Distance of the principle point A closest to the reticule 350 and the reticule 350 is defined to be $L_1$, on the other hand, distance of the principle point B closest to the semiconductor film 353 and the semiconductor film 353 is defined to be $L_2$. Therefore, the formula for the focal length f of the lens 351 is the formula 1 as follows. As in the case that two principle points are identical, $L_1$ and $L_2$ can be defined.

$$1/f=1/L_1+1/L_2 \quad \text{[Formula 1]}$$

The formula for a pace of expansion is the formula 2 as follows.

$$M=L_2/L_1 \quad \text{[Formula 2]}$$

If the focal length f of the lens 351 is determined by using the formula 1 and formula 2, the pace of expansion M is determined.

It is possible to implement this embodiment in combination with Embodiments 1 to 4.

Embodiment 6

In this embodiment, a method of manufacturing an active matrix substrate when the semiconductor film is crystallized in the case that a laser beam is irradiated two times will be described with reference to FIGS. 33 to 36. A substrate on which a CMOS circuit, a driver circuit, and a pixel portion having a pixel TFT and a retention capacity are formed together is referred to as an active matrix substrate for convenience.

First of all, a substrate 600 formed of glass such as barium borosilicate glass and aluminum borosilicate glass is used in this embodiment. The substrate 600 may be a quartz substrate, a silicon substrate, a metal substrate or stainless substrate, which has an insulating film on the surface. The substrate 600 may be a plastic substrate having heat resistance, which withstands a processing temperature in this embodiment.

Figure 33A:
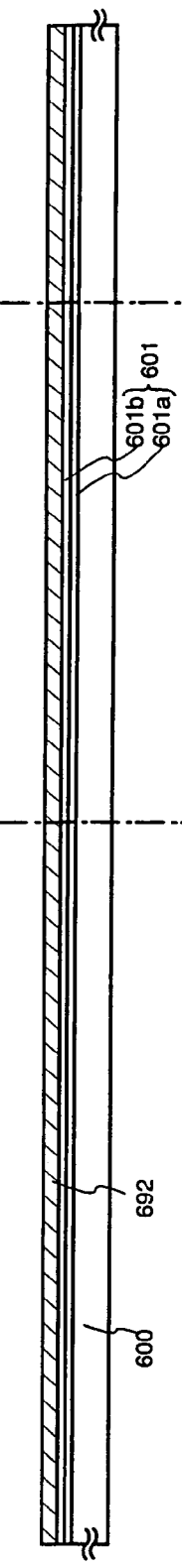
FIGS. 33A to 33C show a method of producing a semiconductor device using a laser irradiation apparatus of the present invention.

Next, a base film 601 comprising of a silicon oxide film, a silicon nitride film, or a silicon oxynitride film is formed on the base film 601 by publicly known method (such as the sputtering method, LPCVD method and plasma CVD method). In this embodiment, as a base film 601, two-layer base film 601a and 601b are used, however, a single layer of the insulating film or two or more laminated layers may also be used (FIG. 33A).

Figure 33B:
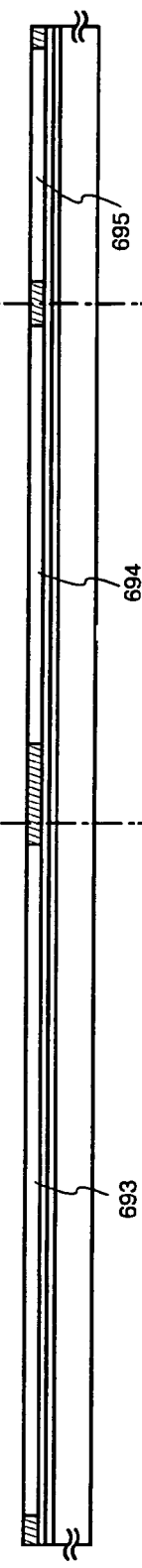

Next, an amorphous semiconductor film 692 is formed on the base film 601 by publicly known method (such as the sputtering method, LPCVD method and plasma CVD method) to have a thickness of 25 to 80 nm (preferably, 30 to 60 nm) (FIG. 33B). In this embodiment, an amorphous semiconductor film is formed. However, micro-crystalline semiconductor film and crystalline semiconductor film may be formed. In addition, a compound semiconductor film having an amorphous structure such as an amorphous silicon germanium film may be used.

The amorphous semiconductor film 692 is crystallized by using the laser crystallization. The laser crystallization is conducted by using the laser irradiation method of the present invention. In the present invention, the amorphous semiconductor film is irradiated the laser beam two times according to a mask information inputted into the computer of the laser apparatus. Of course, the crystallization may be conducted by using not only the laser crystallization, but also being combined with another known crystallization method (thermal crystallization method using RTA and an annealing furnace or using metal elements promoting crystallization).

When a crystallization of an amorphous semiconductor film is conducted, it is preferable that the second harmonic through the fourth harmonic of basic waves is applied by using the solid state laser which is capable of continuous oscillation in order to obtain a crystal in large grain size. Typically, it is preferable that the second harmonic (with a wavelength of 532 nm) or the third harmonic (with a wavelength of 355 nm) of an Nd YVO$_4$ laser (basic wave of 1064 nm) is applied. Specifically, laser beams emitted from the continuous oscillation type YVO$_4$ laser with 10 W output is converted into a harmonic by using the non-linear optical elements. Also, a method of emitting a harmonic by applying crystal of YVO$_4$ and the non-linear optical elements into a resonator. Then, more preferably, the laser beams are formed so as to have a rectangular shape or an elliptical shape by an optical system, thereby irradiating a substance to be treated. At this time, the energy density of approximately 0.01 to 100

MW/cm² (preferably 0.1 to 10 MW/cm²) is required. The semiconductor film is moved at approximately 10 to 2000 cm/s rate relatively corresponding to the laser beams so as to irradiate the semiconductor film.

Note that, for a two times laser irradiation, a gas laser or solid-state laser of continuous oscillation type or pulse oscillation type can be used. The gas laser such as an excimer laser, Ar laser, Kr laser and the solid-state laser such as YAG laser, $YVO_4$ laser, YLF laser, $YAlO_3$ laser, glass laser, ruby laser, alexandrite laser, Ti: sapphire laser, $Y_2O_3$ laser can be used as the laser beam. Also, crystals such as YAG laser, $YVO_4$ laser, YLF laser, $YAlO_3$ laser wherein Cr, Nd, Er, Ho, Ce, Co, Ti, Yb or Tm is doped can be used as the solid-state laser. A basic wave of the lasers is different depending on the materials of doping, therefore a laser beam having a basic wave of approximately 1 μm is obtained. A harmonic corresponding to the basic wave can be obtained by the using non-linear optical elements.

By the above-mentioned laser crystallization, the regions 693, 694, and 695 are formed that is increased the crystallinity by two times laser irradiation with respect to the amorphous semiconductor film (FIG. 33B).

Figure 33C:
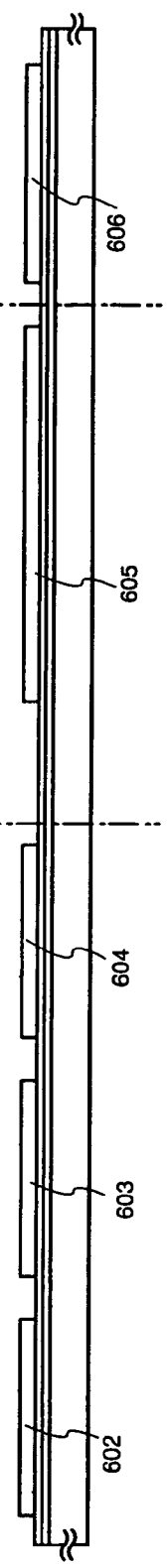

The island like semiconductor films 602 to 606 are formed from the crystallized regions 693, 694, and 695 by performing patterning processing the crystallized semiconductor film into desired shape that is increased the crystallinity in part (FIG. 33C).

After the island like semiconductor films 602 to 606 are formed, a small amount of impurity element (boron or phosphorus) may be doped in order to control a threshold value of the TFT.

Next, a gate insulating film 607 covering the island like semiconductor films 602 to 606 is formed. The gate insulating film 607 is formed by using an insulating film containing silicon with a thickness of 40 to 150 nm by using plasma CVD method or sputtering method. In this embodiment, a silicon oxynitride film (compositional ratio: Si=32%, O=59%, N=7% and H=2%) with a thickness of 110 nm is formed by the plasma CVD method. Notably, the gate insulating film is not limited to the silicon oxynitride film but an insulating film containing other silicon may be used as a single layer or as a laminated pad.

When a silicon oxide film is used, it is formed by mixing Tetraethyl Orthosilicate (IEOS) and $O_2$ by plasma CVD method, which is discharged under a condition with reaction pressure of 40 Pa, a substrate temperature of 300 to 400° C. and high frequency (13.56 MHz) power density of 0.5 to 0.8 W/cm². Thermal annealing at 400 to 500° C. thereafter can give good characteristics to the silicon oxide film produced in this way as a gate insulating film.

Next, a first conductive film 608, which is 20 to 100 nm in thickness, and a second conductive film 609, which is 100 to 400 nm in thickness, is stacked on the gate insulating film 607. In this embodiment, the first conductive film 608 formed by a TaN film with a thickness of 30 nm and the second conductive film 609 formed by a W film with a thickness of 370 nm are stacked. The TaN film is formed by using Ta target to perform sputtering in an atmosphere containing nitrogen. The W film is formed by using W target to perform sputtering. Alternatively, it can be formed by thermal CVD method using tungsten hexafluoride ($WF_6$). In both cases, the use of the gate electrode needs low resistance. Therefore, the resistivity of the W film is desirably 20 μΩcm or less. The low resistance of the W film can be achieved by increasing the size of the crystal grains. However, when the W film contains a large amount of impurity element such as oxygen, the crystallization is inhibited, which raises the resistance. Accordingly, in this embodiment, the W film is formed by the sputtering method using high purity (purity of 99.9999%) W target and by taking the prevention of intrusion of impurity from a vapor phase during the film forming into special consideration. Thus, the resistivity of 9 to 20 μΩcm can be achieved.

While, in this embodiment, the first conductive film 608 is TaN and the second conductive film 609 is W, they are not limited in particular. Both of them can be formed by an element selected from Ta, W, Ti, Mo, Al, Cu, Cr and Nd or an alloy material or a compound material mainly containing the element. Alternatively, a semiconductor film, such as a polycrystalline silicon film to which an impurity element such as phosphorus is doped, can be used. An AgPdCu alloy may be used. A combination of the first conductive film formed by a tantalum (Ta) film and the second conductive film formed by a W film, a combination of the first conductive film formed by a titan nitride (TiN) film and the second conductive film formed by a W film, a combination of the first conductive film formed by a tantalum nitride (TaN) film and the second conductive film formed by a W film, a combination of the first conductive film formed by a tantalum nitride (TaN) film and the second conductive film formed by an Al film, or a combination of the first conductive film formed by a tantalum nitride (TaN) film and the second conductive film formed by a Cu film is possible.

Further, the present invention is not limited to a two-layer structure. For example, a three-layer structure may be adopted in which a tungsten film, an alloy film of aluminum and silicon (Al—Si), and a titanium nitride film are sequentially laminated. Moreover, in case of a three-layer structure, tungsten nitride may be used in place of tungsten, an alloy film of aluminum and titanium (Al—Ti) may be used in place of the alloy film of aluminum and silicon (Al—Si), and a titanium film may be used in place of the titanium nitride film.

Note that, it is important that appropriate etching method or kinds of etchant is properly selected depending on the materials of a conductive film.

Next, masks 610 to 615 made of resist using photolithography method are formed, and first etching processing is performed thereon in order to form electrodes and wires. The first etching processing is performed under first and second etching conditions (FIG. 34B). The first etching condition in this embodiment is to use Inductively Coupled Plasma (ICP) etching and to use $CF_4$ and $Cl_2$ and $O_2$ as an etching gas, whose amount of gases are 25/25/10 (sccm), respectively. 500 W of RF (13.56 MHz) power was supplied to a coil type electrode by 1 Pa pressure in order to generate plasma and then to perform etching. 150 W of RF (13.56 MHz) power was also supplied to a substrate side (test sample stage) and substantially negative self-bias voltage was applied. The W film was etched under the first etching condition so as to obtain the end of the first conductive layer in a tapered form.

After that, the first etching condition is shifted to the second etching condition without removing the masks 610 to 615 made of resist. Then, $CF_4$ and $Cl_2$ are used as etching gases. The ratio of the amounts of flowing gasses is 30/30 (sccm). 500 W of RF (13.56 MHz) power is supplied to a coil type electrode by 1 Pa pressure in order to generate plasma and then to perform etching for amount 30 seconds. 20 W of RF (1356 MHz) power is also supplied to a substrate side (test sample stage) and substantially negative self-bias voltage is applied. Under the second etching condition where $CF_4$ and $Cl_2$ are mixed, both W film and TaN film were etched to the same degree. In order to etch without leaving a residue on the gate insulating film, the etching time may be increased 10 to 20% more.

In the first etching processing, when the shape of the mask made of resist is appropriate, the shape of the ends of the first and the second conductive layers are in the tapered form due to the effect of the bias voltage applied to the substrate side. The angle of the tapered portion is 15 to 45°. Thus, conductive layers 617 to 622 in a first form are formed which include the first conductive layers and the second conductive layers (first conductive layers 617a to 622a and second conductive layer 617b to 622b) through the first etching processing. In a gate insulating film 616, an area not covered by the conductive layers 617 to 622 in the first form is etched by about 20 to 50 nm so as to form a thinner area.

Next, second etching processing is performed without removing masks made of resist (FIG. 34C). Here, $CF_4$, $Cl_2$ and $O_2$ are used as an etching gas to etch the W film selectively. Then, second conductive layers 628b to 633b are formed by the second etching processing. On the other hand, the first conductive layers 617a to 622a are hardly etched, and conductive layers 628 to 633 in the second form are formed.

First doping processing is performed without removing masks made of resist and low density of impurity element, which gives n-type to the semiconductor film, is added. The doping processing may be performed by the ion-doping method or the ion-implanting method. The ion doping method is performed under a condition in the dose of $1\times10^{13}$ to $5\times10^{14}$ atoms/cm$^2$ and the accelerating voltage of 40 to 80 kV. In this embodiment, the ion doping method is performed under a condition in the dose of $1.5\times10^{13}$ atoms/cm$^2$ and the accelerating voltage of 60 kV. The n-type doping impurity element may be Group 15 elements, typically phosphorus (P) or arsenic (As). Here, phosphorus (P) is used. In this case, the conductive layers 628 to 633 function as masks for the n-type doping impurity element. Therefore, impurity areas 623 to 627 are formed in the self-alignment manner. An n-type doping impurity element in the density range of $1\times10^{18}$ to $1\times10^{20}$ atoms/cm$^3$ are added to the impurity areas 623 to 627.

When masks made of resist are removed, new masks 634a to 634c made of resist are formed. Then, second doping processing is performed by using higher accelerating voltage than that used in the first doping processing. The ion doping method is performed under a condition in the dose of $1\times10^{13}$ to $1\times10^{15}$ atoms/cm$^2$ and the accelerating voltage of 60 to 120 kV. In the doping processing, the second conductive layers 628b to 632b are used as masks against the impurity element. Doping is performed such that the impurity element can be added to the semiconductor film at the bottom of the tapered portion of the first conductive layer. Then, third doping processing is performed by having lower accelerating voltage than that in the second doping processing to obtain a condition shown in FIG. 35A. The ion doping method is performed under a condition in the dose of $1\times10^{15}$ to $1\times10^{17}$ atoms/cm$^2$ and the accelerating voltage of 50 to 100 kV. Through the second doping processing and the third doping processing, an n-type doping impurity element in the density range of $1\times10^{18}$ to $5\times10^{19}$ atoms/cm$^3$ is added to the low density impurity areas 636, 642 and 648, which overlap with the first conductive layer. An n-type doping impurity element in the density range of $1\times10^{19}$ to $5\times10^{21}$ atoms/cm$^3$ is added to the high density impurity areas 635, 641, 644 and 647.

With proper accelerating voltage, the low density impurity area and the high density impurity area can be formed by performing the second doping processing and the third doping processing once.

Next, after removing masks made of resist, new masks 650a to 650c made of resist are formed to perform the fourth doping processing. Through the fourth doping processing, impurity areas 653, 654, 659 and 660, to which an impurity element doping a conductive type opposite to the one conductive type is added, in a semiconductor layer, which is an active layer of a p-channel type TFT. Second conductive layers 628a to 632a are used as mask against the impurity element, and the impurity element giving p-type is added so as to form impurity areas in the self-alignment manner. In this embodiment, the impurity areas 653, 654, 659 and 660 are formed by applying ion-doping method using diborane ($B_2H_6$) (FIG. 35B). During the fourth doping processing, the semiconductor layer forming the n-channel TFT is covered by masks 650a to 650c made of resist. Thorough the first to the third doping processing, phosphorus of different densities is added to each of the impurity areas 653, 654, 659 and 660. Doping processing is performed such that the density of p-type doping impurity element can be $1\times10^{19}$ to $5\times10^{21}$ atoms/cm$^3$ in both areas. Thus, no problems are caused when they function as the source region and the drain region of the p-channel TFT.

Impurity areas are formed in the island like semiconductor layers, respectively, through the processes above.

Next, the masks 650a to 650c made of resist are removed and a first interlayer insulating film 661 is formed thereon. The first interlayer insulating film 661 may be an insulating film with a thickness of 100 to 200 nm containing silicon, which is formed by plasma CVD method or sputtering method. In this embodiment, silicon oxynitride film with a thickness of 150 nm is formed by plasma CVD method. The first interlayer insulating film 661 is not limited to the silicon oxynitride film but may be the other insulating film containing silicon in a single layer or in a laminated pad.

Next, as shown in FIG. 35C, activation processing is performed by using laser irradiation method. When a laser annealing method is used, the laser used in the crystallization can be used. When the activation processing is performed, the moving speed is same as the crystallization, and an energy density of about 0.01 to 100 MW/cm$^2$ (preferably, 0.01 to 100 MW/cm$^2$) is required. Also, a continuous oscillation laser may be used in the case the crystallization is performed and a pulse oscillation laser may be used in the case the activation is performed.

Also, the activation processing may be conducted before the first interlayer insulating film is formed.

After the heating processing (thermal processing at 300 to 550° C. for 1 to 12 hours) is performed, hydrogenation can be performed. This process terminates the dangling bond of the semiconductor layer with hydrogen contained in the first interlayer insulating film 661. Alternatively, the hydrogenation may be plasma hydrogenation (using hydrogen excited by plasma) or heating processing in an atmosphere containing 3 to 100% of hydrogen at 300 to 650° C. for 1 to 12 hours. In this case, the semiconductor film may be hydrogenated irrespective of an existence of the first interlayer insulating film.

Next, a second interlayer insulating film 662 formed by an inorganic insulating material or an organic insulator material is formed on the first interlayer insulating film 661. In this embodiment, an acrylic resin film us formed to have a thickness of 1.6 μm. Subsequently, the third interlayer insulating film 672 is formed to contact with the second interlayer insulating film 662 after the second interlayer insulating film is formed.

Figure 36:
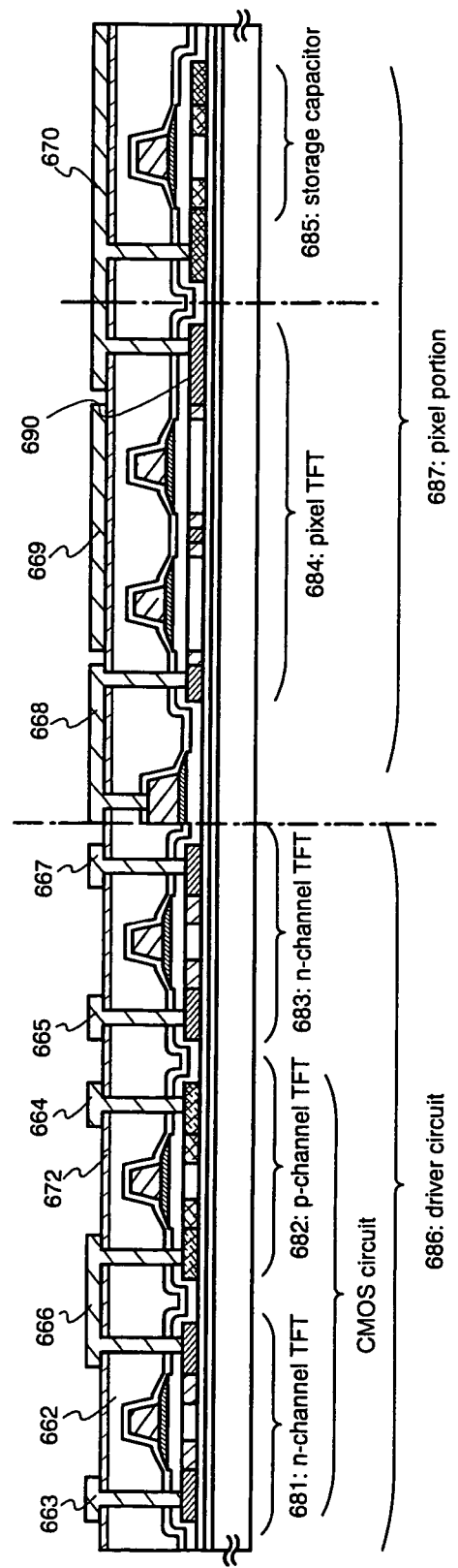
FIG. 36 also shows the method of producing the semiconductor device using the laser irradiation apparatus of the present invention.

Wirings 664 to 668 electrically connecting to impurity areas, respectively, are formed in a driver circuit 686. These wirings are formed by patterning a film laminating a Ti film with a thickness of 50 nm and an alloy film (alloy film of Al and Ti) with a thickness of 500 nm. It is not limited to the two-layer structure but may be a one-layer structure or a laminate pad including three or more layers. The materials of the wirings are not limited to Al and Ti. For example, the wiring can be formed by forming Al or Cu on a TaN film and then by patterning the laminate film in which a Ti film is formed (FIG. 36).

In a pixel portion 687, a pixel electrode 670, a gate wiring 669 and a connecting electrode 668 are formed. Source wirings (a laminate of layers 643a and 643b) are electrically connected with a pixel TFT by the connecting electrode 668. The gate wiring 669 is electrically connected with a gate electrode of the TFT pixel 684. A pixel electrode 670 is electrically connected with a drain region 690 of the pixel TFT. Furthermore, the pixel electrode 670 is electrically connected with an island-like semiconductor film 685 functioning as one electrode forming a storage capacitor. In the present invention, the pixel electrode and the connection electrode are made from same materials, however, a material having excellent reflectivity such as a film mainly containing Al or Ag or the laminate film is used for the pixel electrode 670.

In this way, the driver circuit 686 having a CMOS circuit including an n-channel TFT 681 and a p-channel TFT 682 and a n-channel TFT 683, and the pixel portion 687 having the pixel TFT 684 and the retention capacitor 685 can be formed on the same substrate. Thus, an active matrix substrate is completed.

The n-channel TFT 681 of the driver circuit 686 has a channel forming region 637, a low density impurity area 636 overlapping with the first conductive layer 628a, which constructs a part of the gate electrode (GOLD (Gate Overlapped LDD) area), and a high density impurity area 652 functioning as the source region or the drain region are implanted. The p-type channel TFT 682 forming a CMOS circuit together with the n-channel TFT 681, which are connected by an electrode 666, has a channel forming region 640, a high density impurity area 653 functioning as the source region or the drain region, and an impurity area 654 to which a p-type doping impurity element are implanted. The n-channel TFT 683 has a channel forming region 643, a low density impurity area 642 overlapping with the first conductive layer 630a, which constructs a part of the gate electrode, (GOLD area), and a high density impurity area 656 functioning as the source region or the drain region.

The pixel TFT 684 of the pixel portion has a channel forming region 646, a low density impurity area 645 formed outside of the gate electrode (LDD region) and a high density impurity area 658 functioning as the source region or the drain region. An n-type doping impurity element and a p-type doping impurity element are added to a semiconductor layer functioning as one electrode of the storage capacitor 685. The storage capacitor 685 is formed by an electrode (a laminate of layers 632a and 632b) and a semiconductor layer by using the insulating film 616 as a dielectric.

The pixel structure in this embodiment is arranged such that light can be blocked in a space between pixel electrodes and the ends of the pixel electrodes can overlap with the source wiring without using the black matrix.

This embodiment can be implemented by combining with Embodiments 1 to 5.

Embodiment 7

Figure 37:
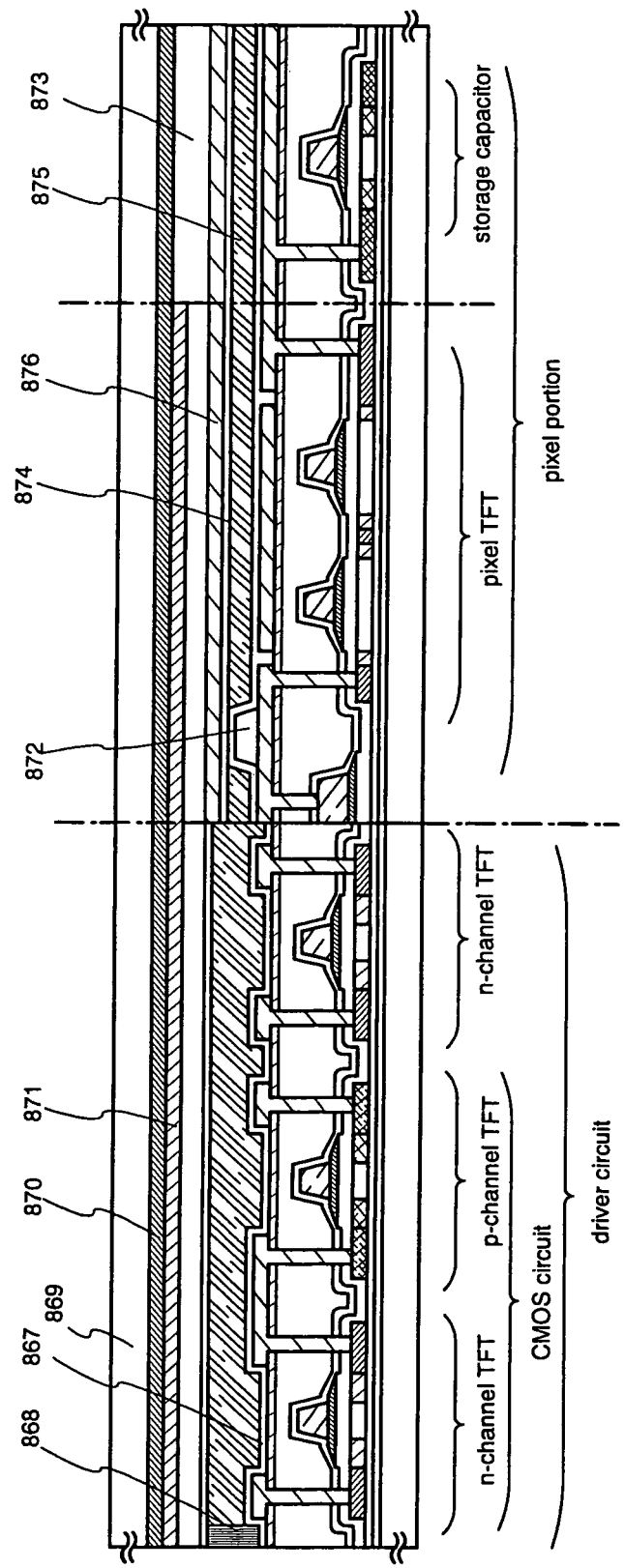
FIG. 37 shows a liquid crystal display apparatus produced using a laser irradiation apparatus of the present invention.

This embodiment explains, below, a process to manufacture a reflection type liquid crystal display device from the active matrix substrate made in Embodiment 6, using FIG. 37.

First, after obtaining an active matrix substrate in the state of FIG. 36 according to Embodiment 6, an alignment film 867 is formed at least on the pixel electrodes 670 on the active matrix substrate of FIG. 36 and subjected to a rubbing process. Incidentally, in this embodiment, prior to forming an alignment film 867, an organic resin film such as an acryl resin film is patterned to form columnar spacers 872 in a desired position to support the substrates with spacing. Meanwhile, spherical spacers, in place of the columnar spacers, may be distributed over the entire surface of the substrate.

Then, a counter substrate 869 is prepared. Then, coloring layers 870, 871 and a planarizing film 873 are formed on a counter substrate 869. A shade portion is formed by overlapping a red coloring layer 870 and a blue coloring layer 871 together. Meanwhile, the shade portion may be formed by partly overlapping a red coloring layer and a green coloring layer.

In this embodiment is used a substrate shown in Embodiment 6. There is a need to shade at least the gap between the gate wiring 669 and the pixel electrode 670, the gap between the gate wiring 669 and the connecting electrode 668, and the gap between the connecting electrode 668 and the pixel electrode 670. In this embodiment were bonded together the substrates by arranging the coloring layers so that the shielding portion having a lamination of coloring layers is overlapped with the to-be-shielding portion.

In this manner, the gaps between the pixels are shaded by the shielding portion having a lamination of coloring layers without forming a shielding layer such as a black mask, thereby enabling to reduce the number of processes.

Then, a counter electrode 876 of a transparent conductive film is formed on the planarizing film 873 at least in the pixel portion. An alignment film 874 is formed over the entire surface of the counter substrate and subjected to a rubbing process.

Then, the active matrix substrate formed with the pixel portion and driver circuit and the counter substrate are bonded together by a seal member 868. The seal member 868 is mixed with filler so that the filler and the columnar spacers bond together the two substrates through an even spacing. Thereafter, a liquid crystal material 875 is poured between the substrates, and completely sealed by a sealant (not shown). The liquid crystal material 875 may be a known liquid crystal material. In this manner, completed is a reflection type liquid crystal display device shown in FIG. 37. If necessary, the active matrix substrate or counter substrate is divided into a desired shape. Furthermore, a polarizing plate (not shown) is bonded only on the counter substrate. Then, an FPC is bonded by a known technique.

The liquid crystal display device manufactured as above comprises TFT manufactured by a semiconductor film, wherein a laser beam having a periodic or uniform energy distribution is irradiated and a crystal grain with a large grain size is formed. Thus, the liquid crystal display device ensures a good operational characteristic and high reliability. The liquid crystal display device can be used as a display portion for an electronic appliance in various kinds.

Incidentally, this embodiment can be implemented by combining with Embodiments 1 to 6.

Embodiment 8

This embodiment explains an example of manufacturing a light emitting device by using a method of manufacturing TFT when an active matrix substrate is fabricated in the Embodiment 6. In this specification, the light-emitting device refers, generally, to the display panel having light-emitting elements formed on a substrate sealed between the substrate and a cover member, and the display module having TFTs or the like mounted on the display panel. Incidentally, the light emitting element has a layer including an organic compound that electroluminescence caused is obtained by applying an electric field (light emitting layer), an anode layer and a cathode layer. Meanwhile, the electroluminescence in compound includes the light emission upon returning from the singlet-excited state to the ground state (fluorescent light) and the light emission upon returning from the triplet-excited state to the ground state (phosphorous light), including any or both of light emission.

Note that, all the layers that are provided between an anode and a cathode in a light emitting element are defined as an organic light emitting layer in this specification. Specifically, the organic light emitting layer includes a light emitting layer, a hole injection layer, an electron injection layer, a hole transporting layer, an electron transporting layer, etc. A basic structure of a light emitting element is a laminate of an anode layer, a light emitting layer, and a cathode layer layered in this order. The basic structure can be modified into a laminate of an anode layer, a hole injection layer, a light emitting layer, and a cathode layer layered in this order, or a laminate of an anode layer, a hole injection layer, a light emitting layer, an electron transporting layer, and a cathode layered in this order.

The light emitting element used in this embodiment comprising the hole injection layer, the electron injection layer, the hole transporting layer, and the electron transporting layer may be solely formed by inorganic compounds, or materials mixed with organic compounds and inorganic compounds. The light emitting element may be formed by mixture of these layers.

Figure 38A:
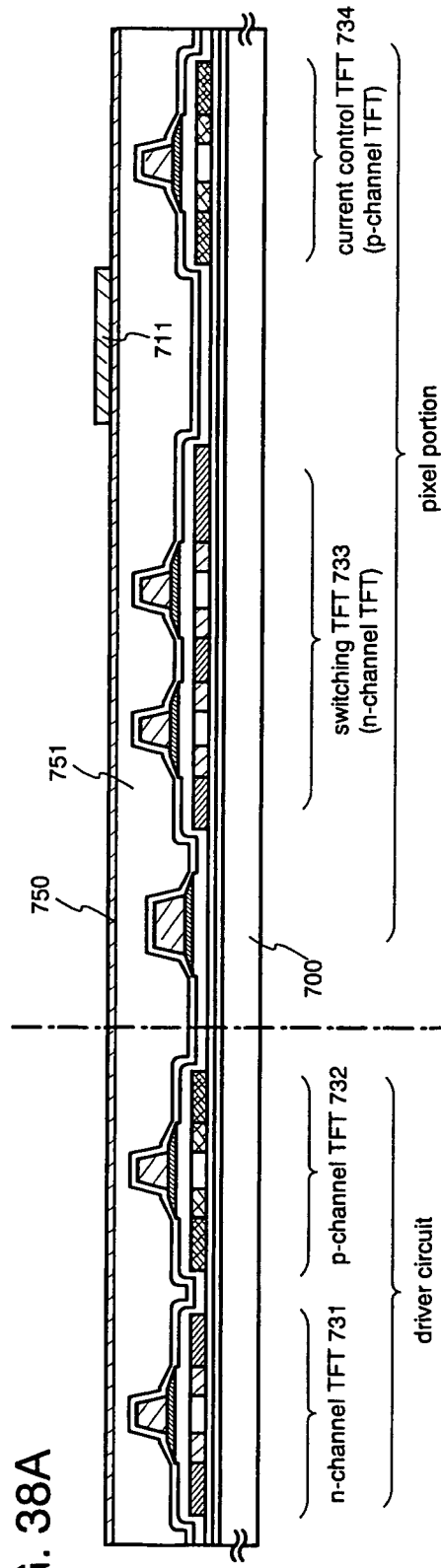
FIGS. 38A and 38B shows a method of producing a light-emitting apparatus using a laser irradiation apparatus of the present invention.

FIG. 38A is a sectional view of a light-emitting device of this embodiment manufactured up through the third interlayer insulating film 750. In FIG. 38A, the switching TFT 733 and the current controlling TFT 734 provided on the substrate 700 is formed by using the manufacturing method in Embodiment 6. Incidentally, although this embodiment is of a double gate structure formed with two channel forming regions, it is possible to use a single gate structure formed with one channel forming region or a triple gate structure formed with three channel forming regions. In this embodiment, the current controlling TFT 734 has a single gate structure in which one channel formation region is formed, however the current controlling TFT may also have a structure in which two channel formation region are formed.

The n-channel TFT 731 and the p-channel TFT 732 in the driver circuit provided on the substrate 700 is formed by using the manufacturing method in Embodiment 6. Incidentally, although this embodiment is of a single gate structure, it is possible to use a double gate structure or a triple gate structure.

In the case of the light-emitting device, the third interlayer insulating film 750 is effective to prevent water contained in the second interlayer insulating film 751 from penetrating into the organic light emitting layer. If the second interlayer insulating film 751 has organic resin material, providing the third interlayer insulating film 750 is effective because the organic resin materials contain water a lot.

Completed the manufacture process up through the step of forming the third interlayer insulating film in Embodiment 6, the pixel electrode 711 is formed on the third interlayer insulating film 750.

Meanwhile, reference numeral 711 is a pixel electrode (anode of a light-emitting element) formed by a transparent conductive film. As the transparent conductive film can be used a compound of indium oxide and tin oxide, a compound of indium oxide and zinc oxide, zinc oxide, tin oxide or indium oxide. A transparent conductive film added with gallium may also be used. The pixel electrode 711 is formed on a planar third interlayer insulating film 750 prior to forming the wirings. In this embodiment, it is very important, to planarize the step due to the TFT by using a the second interlayer insulating film 751 made of resin. A light emitting layer to be formed later, because being extremely thin, possibly causes poor light emission due to the presence of a step. Accordingly, it is desired to provide planarization prior to forming a pixel electrode so that a light emitting layer can be formed as planar as possible.

Figure 38B:
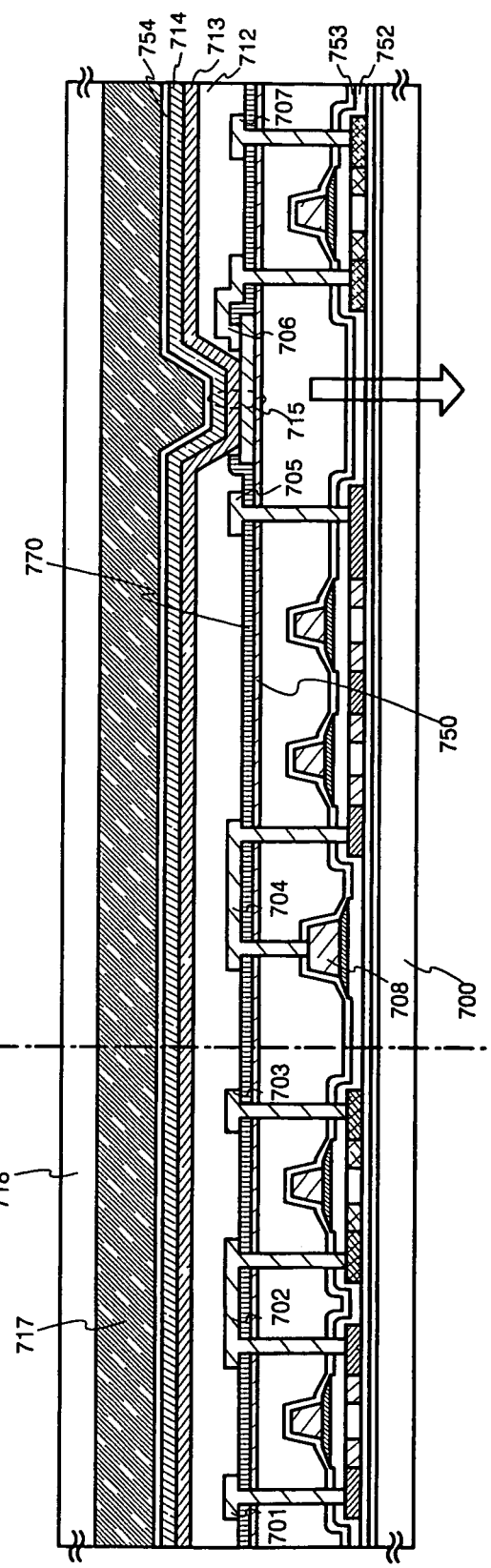

Next, as shown in FIG. 38B, the resin film which distributed black dye, carbon, or black pigment is deposited, so that the third layer insulating film 750 may be covered, and the shielding film 770 is deposited by forming a opening portion in the portion which serves as a light emitting element. In addition, as materials for resin, although polyimide, polyamide, acrylics, BCB (benzocyclobutene), and the like are mentioned typically, it is not limited to the above-mentioned material. Moreover, it is also possible to use materials that is mixed black dye, carbon, or black pigments with silicon, silicon oxide, silicon oxynitride, and the like as a material of a cover film other than organic resin. The shielding film 770 is effective in the external light reflected in wires 701 to 707 preventing going into an observer's eyes.

After the pixel electrode 711 is formed, contact holes are formed in the gate insulating film 752, the first interlayer insulating film 753, the second interlayer insulating film 751, the third interlayer insulating film 750, the shielding film 770 respectively. The conductive film is formed to overlap the pixel electrode 711 on the shielding film 770. Wirings 701 to 707 are formed connected electrically to each impurity region of TFT by etching the conductive film. Note that a lamination film of a 50 nm thick Ti film and a 500 nm thick alloy film (Al and Ti alloy film) is patterned in order to form the wirings. There are no limitations regarding the two layer structure, of course, and a single layer structure or a laminate structure having three or more layers may also be used. Further, the wiring material is not limited to Al and Ti. For example, a lamination film, in which Al or Cu is formed on a TaN film, and then a Ti film is formed, may be patterned, forming the wirings (FIG. 38A).

The wiring 707 is a source wiring (corresponding to the current supply line) of the current controlling TFT 734. Reference numeral 706 is an electrode that connects electrically the drain region of the current controlling TFT 734 with the pixel electrode 711.

After forming wires 701 to 707, the bank 712 is formed that is made from resin materials. The bank 712 is formed to expose a portion of the pixel electrode 711 by patterning the acrylic film having 1 to 2 μm in thickness or polyimide film.

A light emitting layer 713 is formed on the pixel electrode 711. Incidentally, although FIG. 38B shows only one pixel, this embodiment separately forms light emitting layers correspondingly to the respective colors of R (red), G (green) and B (blue). Meanwhile, in this embodiment is formed a low molecular weight organic light-emitting material by the deposition method. Specifically, this is a lamination structure having a copper phthalocyanine (CuPc) film provided with a thickness of 20 nm as a hole injecting layer and a tris-8-qyuinolinolato aluminum complex ($Alq_3$) film provided thereon with a thickness of 70 nm as a light emitting layer. The color of emission light can be controlled by adding a fluorescent pigment, such as quinacridone, perylene or DCM1, to $Alq_3$.

However, the foregoing example is an example of organic light-emitting material to be used for a light emitting layer and not necessarily limited to this. It is satisfactory to form a light emitting layer (layer for light emission and carrier movement therefore) by freely combining a light emitting layer, a charge transporting layer and a charge injection layer. For example, although in this embodiment was shown the example in which a low molecular weight organic light-emitting material is used for a light emitting layer, it is possible to use an intermediate molecular weight organic light-emitting material or high molecular weight organic light-emitting material. In this specification, an intermediate molecular weight organic light-emitting material is defined that an aggregate of an organic compound which does not have subliming property or dissolving property (preferably, an aggregate which has molecularity of 10 or less), or an organic compound which has a molecular chain length of 5 μm of less (preferably 50 nm or less). As an example of using high molecular electroluminescent emitting material, the laminated pad can be made polythiophene (PEDOT) films with a thickness of 20 nm is provided by spin coating method as a hole injection layer, and paraphenylene-vinylene (PPV) films with a thickness of 100 nm is provided thereon as a light emitting layer. The light emitting wave length can be selected from red through blue by using π-conjugated system high molecular of PPV. The inorganic material such as a silicon carbide can be used as a charge transporting layer and a charge injection layer. These organic light-emitting material and inorganic light-emitting material are formed by using known materials.

Next, a cathode 714 of a conductive film is provided on the light emitting layer 713. In this embodiment, as the conductive film is used an alloy film of aluminum and lithium. A known MgAg film (alloy film of magnesium and silver) may be used. As the cathode material may be used a conductive film of an element belonging to the periodic-table group 1 or 2, or a conductive film added with such an element.

A light-emitting element 715 is completed at a time having formed up to the cathode 714. Incidentally, the light-emitting element 715 herein refers to a diode formed with a pixel electrode (anode) 711, a light emitting layer 713 and a cathode 714.

It is effective to provide a protective film 754 in such a manner to completely cover the light-emitting element 715. The protective film 754 is formed by an insulating film including a carbon film, a silicon nitride film or a silicon oxynitride film, and used is an insulating film in a single layer or a combined lamination.

In such a case, it is preferred to use a film favorable in coverage as a protective film 754. It is effective to use a carbon film, particularly DLC (diamond-like carbon) film The DLC film, capable of being deposited in a temperature range of from room temperature to 100° C. or less, can be easily deposited over the light emitting layer 713 low in heat resistance. Meanwhile, the DLC film, having a high blocking effect to oxygen, can suppress the light emitting layer 713 from oxidizing. Consequently, prevented is the problem of oxidation in the light emitting layer 713 during the following seal process.

In this embodiment, the light emitting layer 713 is overlapped completely with a inorganic insulating film having high barrier property such as a carbon film, a silicon nitride, a silicon oxynitride, aluminum nitride, or aluminum oxynitride, so that it can prevent effectively the deterioration of the light emitting layer due to water and oxygen from penetrating thereof into the light emitting layer.

Furthermore, it is preferable to use the silicon nitride film formed by sputtering method using silicon as a target for the third interlayer insulating film 750, the passivation film 712, the protective film 754 that the penetration of impurities into the light emitting layer is prevented effectively. The deposition condition may be appropriately selected, preferably, nitride ($N_2$) or a mixed gas of nitride and argon are used for sputtering gas, and sputtering is performed by applying a high frequency electric. The substrate temperature may be set as room temperature, and heating means are unnecessary to be used. If the organic insulating film and the organic compound layer are formed already, it is preferable that the deposition is conducted without heating the substrate. However, to remove completely absorbed water or occluded water, it is preferable to perform dehydration by heating for several minutes to hours in vacuum at about 50 to 100° C.

The silicon nitride film formed by sputtering method at the condition: at room temperature using silicon as a target; applying 13.56 MHz high frequency electric; and using nitride gas is characterized in that not only the absorption peak of N—H association and Si—H association are not observed but also the absorption peak of Si—O in the infrared absorption spectrum. The oxide density and the hydrogen density is not more than 1 atomic %. Thus, it can prevent more effectively impurities such as oxygen and water more effectively from penetrating into the light emitting layer.

Furthermore, a seal member 717 is provided to overlap the light emitting layer 715 to bond a cover member 718. For the seal member 717 used may be an ultraviolet curable resin. It is effective to provide therein a substance having a hygroscopic effect or an antioxidant effect. Meanwhile, in this embodiment, for the cover member 718 used is a glass substrate, quartz substrate or plastic substrate (including a plastic film) having carbon films (preferably diamond-like carbon films) formed on the both surfaces thereof.

Thus, completed is a light-emitting device having a structure as shown in FIG. 38B. Incidentally, it is effective to continuously carry out, without release to the air, the process to form a protective film after forming a passivation film 712 by using a deposition apparatus of a multi-chamber scheme (or in-line scheme). In addition, with further development it is possible to continuously carry out the process up to bonding a cover member 718, without release to the air.

In this manner, n-channel TFTs 731, 732, a switching TFT (n-channel TFT) 703 and a current control TFT (p-channel TFT) 734 are formed on the substrate 700.

The shielding film 770 is formed between the third interlayer insulating film 750 and the bank 712 in this embodiment, however the present invention is not limited thereto. It is noted that the shielding film 770 is provided at the position that enables the shielding film 770 to prevent the external light reflected in wires 701 to 707 preventing going into an observer's eyes. For example, in the case that the light from the light emitting element 715 is emitted to the substrate 700, the shielding film may be provided between the first interlayer insulating film 753 and the second interlayer insulating film 751. As in the case with this, the shielding film has a opening portion so as to pass the light from the light emitting element.

Furthermore, as was explained using FIG. 38, by providing an impurity region overlapped with the gate electrode through an insulating film, it is possible to form an n-channel TFT resistive to the deterioration resulting from hot-carrier effect. Consequently, a reliable light emitting device can be realized.

Meanwhile, this embodiment shows only the configuration of the pixel portion and driver circuit. However, according to the manufacturing process in this embodiment, besides there, it is possible to form logic circuits such as a signal division circuit, a D/A converter, an operation amplifier, a γ-correction circuit on a same insulator. Furthermore, a memory or microprocessor can be formed.

The light emitting device manufactured, wherein a laser beam having a periodic or uniform energy distribution is irradiated and a crystal grain with a large grain size is formed. Thus, the light emitting device ensures a good operational characteristic and high reliability. The light emitting device can be used as a display portion for an electronic appliance in various kinds.

Figure 48:
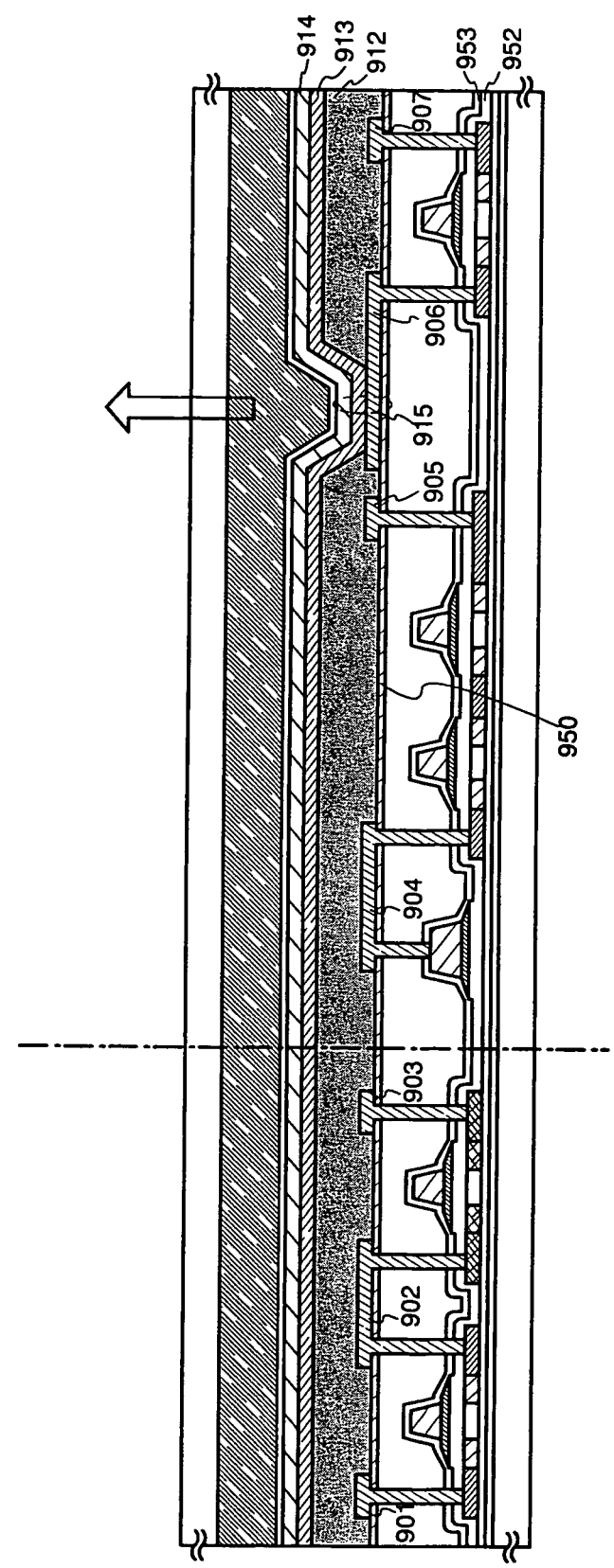
FIG. 48 is a cross-sectional view of a light-emitting apparatus using a laser irradiation apparatus of the present invention.

Although the light from the light emitting element is emitted in the direction of TFT, the light emitting element may face to the reverse direction. In this case, resin that is a mixed with a black die, carbon, or black pigments may be used for forming the bank. FIG. 48 shows a cross-sectional view of the light emitting device in which the light from the light emitting element is emitted to the reverse direction to the TFT.

FIG. 48 shows that the contact hole is formed to the gate insulating film 952, the first interlayer insulating film 953, the second interlayer insulating film 951, and the third interlayer insulating film 950. After the conductive film is formed on the third interlayer insulating film 950, the wires 901 to 907 that are connected electrically to impurity regions of each TFT by etching the conductive film. These wires are formed by patterning an aluminum alloy film (aluminum film contains 1 wt % titanium) having 300 nm in thickness. There is not limited to the single layer structure, the double layer structure may also be used. As materials for forming the wires, there is not limited to Al and Ti. A portion of the wiring 906 doubles as the pixel electrode.

After forming the wires 901 to 907, the bank 912 is formed made from the resin material. The bank 912 is formed to expose a portion of the pixel electrode 906 by patterning the resin having 1 to 2 μm in thickness mixed with a black dye, carbon, or black pigments. As materials for resin, although polyimide, polyamide, acrylics, BCB (benzocyclobutene), and the like are mentioned typically, it is not limited to the above-mentioned material.

The light emitting layer 913 is formed on the pixel electrode 906. An opposed electrode (an anode of the light emitting element) made from the transparent conductive film is formed to cover the light emitting layer 913. As the transparent conductive film can be used a compound of indium oxide and tin oxide, a compound of indium oxide and zinc oxide, zinc oxide, tin oxide or indium oxide. A transparent conductive film added with gallium may also be used.

The light emitting element 915 is formed by the pixel electrode 906, the light emitting layer 913, and the opposed electrode 914.

The shielding film 970 is effective in the external light reflected in wires 901 to 907 preventing going into an observer's eyes.

Incidentally, this embodiment can be implemented by combining any one of Embodiments 1 to 6.

Embodiment 9

Figure 39:
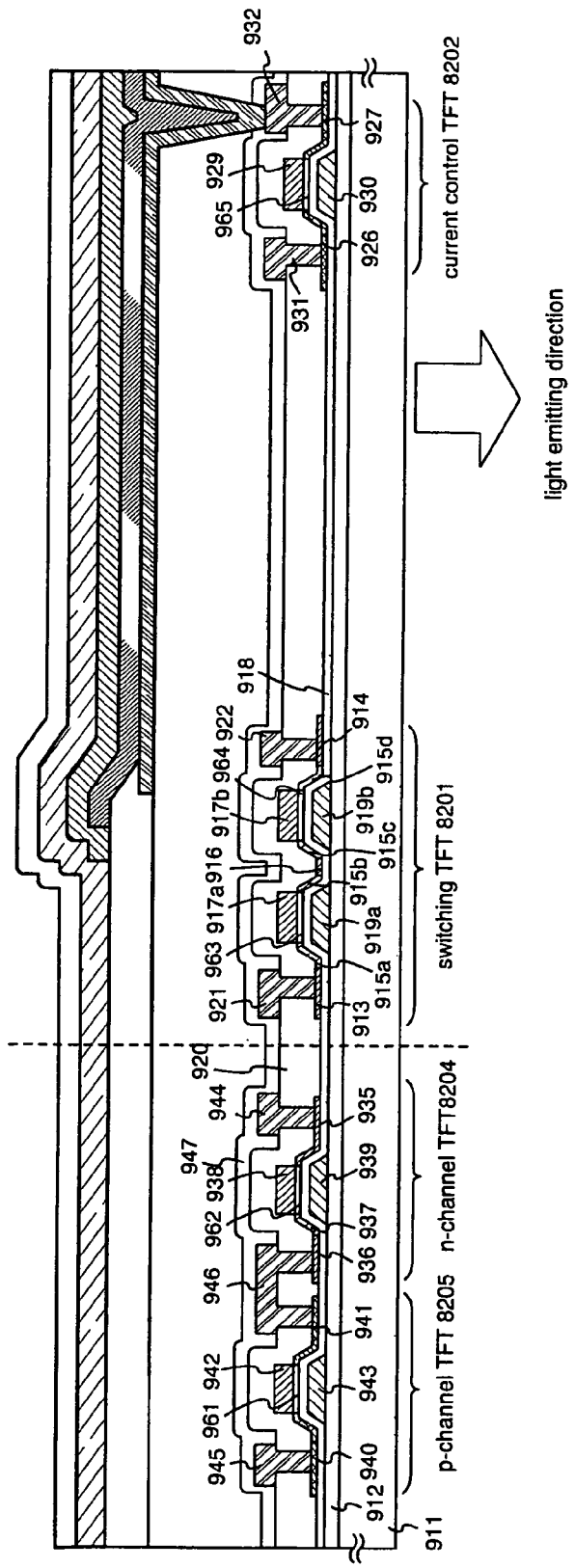
FIG. 39 is a cross-sectional view of a light-emitting apparatus produced using a laser irradiation apparatus of the present invention.

This embodiment describes a pixel configuration of a light emitting device that is one of a semiconductor device of the present invention. FIG. 39 shows a cross-sectional view of a pixel of the light emitting device of this embodiment.

Reference numeral 911 denotes a substrate and reference numeral 912 denotes an insulating film which becomes a base (hereafter referred to as a base film) in FIG. 39. A light transmitting substrate, typically a glass substrate, a quartz substrate, a glass ceramic substrate, or a crystalline glass substrate can be used as the substrate 911. However, the substrate used must be one able to withstand the highest process temperature during the manufacturing processes.

Reference numeral 8201 denotes a switching TFT, reference numeral 8202 denotes a current controlling TFT, and both are formed by n-channel TFT and p-channel TFTs respectively. When the direction of light emitted from the light emitting layer is toward bottom of the substrate (surface where TFTs and the organic light emitting layer are not formed), the above structure is preferable. However, the present invention is not limited to this structure. The switching TFT and the current controlling TFT may be either n-channel TFTs or p-channel TFTs.

The switching TFT 8201 has an active layer containing a source region 913, a drain region 914, LDD regions 915a to 915d, a separation region 916, and an active layer including channel forming regions 917a and 917b, a gate insulating film 918, gate electrodes 919a and 919b, a first interlayer insulating film 920, a source signal line 921 and a drain wiring 922. Note that the gate insulating film 918 and the first interlayer insulating film 920 may be common among all TFTs on the substrate, or may differ depending upon the circuit or the element.

Furthermore, the switching TFT 8201 shown in FIG. 39 is electrically connected to the gate electrodes 917a and 917b, becoming namely a double gate structure. Not only the double gate structure, but also a multi gate structure (a structure containing an active layer having two or more channel forming regions connected in series) such as a triple gate structure, may of course also be used.

The multi gate structure is extremely effective in reducing the off current, and provided that the off current of the switching TFT is sufficiently lowered, a capacitor connected to the gate electrode of the current controlling TFT 8202 can be have its capacitance reduced to the minimum necessary. Namely, the surface area of the capacitor can be made smaller, and therefore using the multi gate structure is effective in expanding the effective light emitting surface area of the light emitting elements.

In addition, the LDD regions 915a to 915d are formed so as not to overlap the gate electrodes 919a and 919b through the gate insulating film 918 in the switching TFT 8201. This type of structure is extremely effective in reducing the off current. Furthermore, the length (width) of the LDD regions 915a to 915d may be set from 0.5 to 3.5 μm, typically between 2.0 and 2.5 μm. Further, when using a multi gate structure having two or more gate electrodes, the separation region 916 (a region to which the same impurity element, at the same concentration, as that added to the source region or the drain region, is added) is effective in reducing the off current.

Next, the current controlling TFT 8202 is formed having an active layer containing a source region 926, a drain region 927, and a channel forming region 965; the gate insulating film 918; a gate electrode 930, the first interlayer insulating film 920; a source wiring 931; and a drain wiring 932. The current controlling TFT 8202 is a p-channel TFT in this embodiment.

Further, the drain region 914 of the switching TFT 8201 is connected to the gate electrode 930 of the current controlling TFT 8202. Although not shown in the figure, specifically the gate electrode 930 of the current controlling TFT 8202 is electrically connected to the drain region 914 of the switching TFT 8201 through the drain wiring (also referred to as a connection wiring) 922. The gate electrode 930 is a single gate structure in this embodiment, however, the multi gate structure can be also applied. The source wiring 931 of the current controlling TFT, 8202 is connected to an power source supply line (not shown in the figure).

The structures of the TFTs formed within the pixel are explained above, but a driver circuit is also formed simultaneously at this point. A CMOS circuit, which becomes a basic unit for forming the driver circuit, is shown in FIG. 39.

A TFT having a structure in which hot carrier injection is reduced without an excessive drop in the operating speed is used as an n-channel TFT 8204 of the CMOS circuit in FIG. 39. Note that the term driver circuit indicates a source signal line driver circuit and a gate signal line driver circuit here. It is also possible to form other logic circuit (such as a level shifter, an A/D converter, and a signal division circuit).

An active layer of the n-channel TFT 8204 of the CMOS circuit contains a source region 935, a drain region 936, an LDD region 937, and a channel forming region 962. The LDD region 937 overlaps with a gate electrode 939 through the gate insulating film 918.

Formation of the LDD region 937 on only the drain region 936 side is so as not to have drop the operating speed. Further, it is not necessary to be very concerned about the off current with the n-channel TFT 8204, and it is good to place more importance on the operating speed. Thus, it is desirable that the LDD region 937 is made to completely overlap the gate electrode to decrease a resistance component to a minimum. It is therefore preferable to eliminate so-called offset.

Furthermore, there is almost no need to be concerned with degradation of a p-channel TFT 8205 of the CMOS circuit, due to hot carrier injection, and therefore no LDD region need be formed in particular. Its active layer therefore contains a source region 940, a drain region 941, and a channel forming region 961, and a gate insulating film 918 and a gate electrode 943 are formed on the active layer. It is also possible, of course, to take measures against hot carrier injection by forming an LDD region similar to that of the n-channel TFT 8204.

The references numeral 961 to 965 are masks to form the channel forming regions 942, 938, 917a, 917b and 929.

Further, the n-channel TFT 8204 and the p-channel TFT 8205 have source wirings 944 and 945, respectively, on their source regions, through the first interlayer insulating film 920. In addition, the drain regions of the n-channel TFT 8204 and the p-channel TFT 8205 are mutually connected electrically by a drain wiring 946.

Next, there will be described a semiconductor fabricating device of the present invention that uses the forming of a semiconductor film, the crystallization of an activation layer, the activation, or the step using laser annealing.

Figure 40:
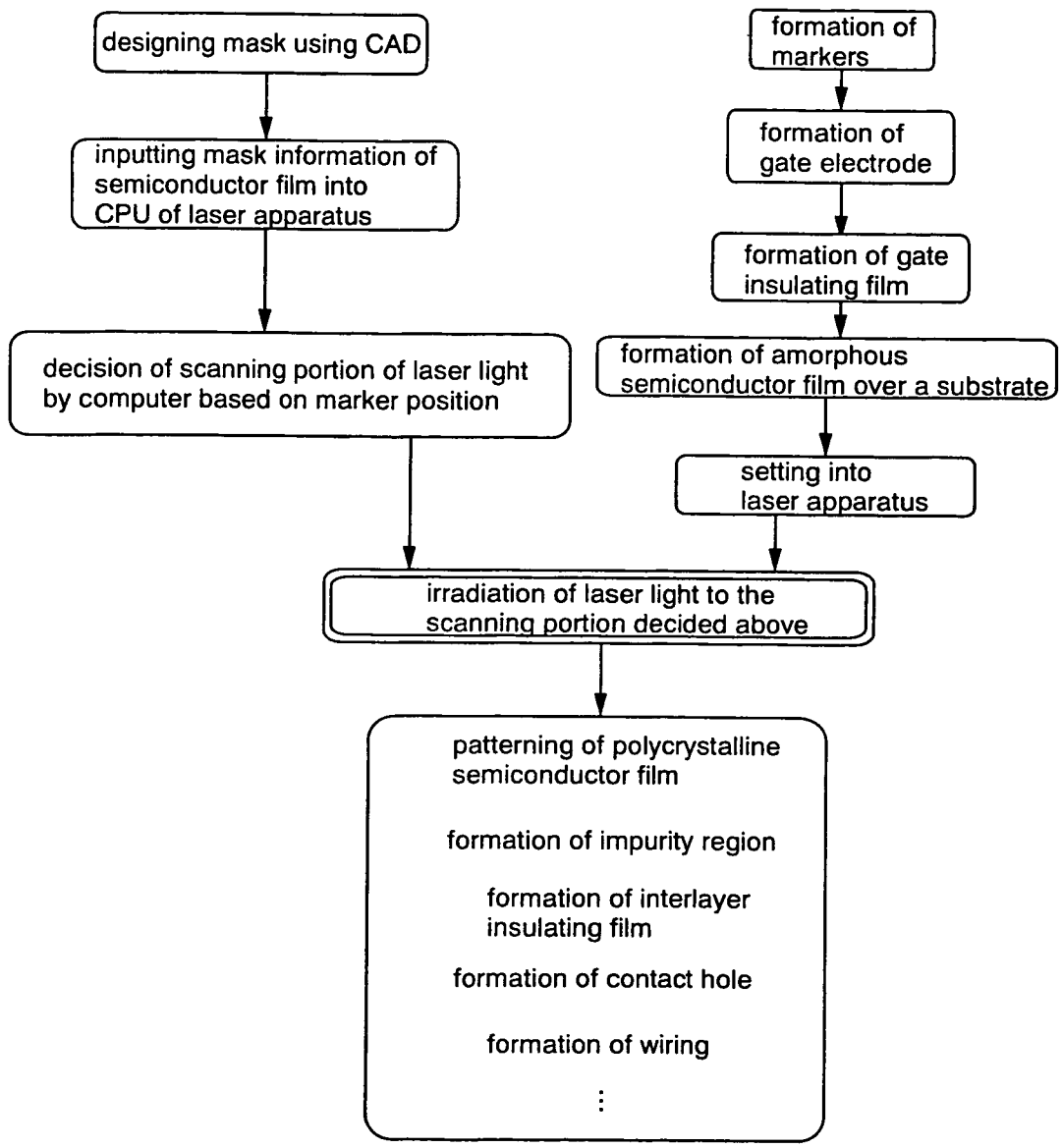
FIG. 40 shows a production flow of the present invention.

A manufacturing flow of the light emitting device of the present invention is shown in FIG. 40 as a flowchart. First, there is performed the designing of a semiconductor device using CAD. Then, information concerning the shape of each designed mask for patterning a semiconductor film is inputted into a computer possessed by the laser apparatus.

On the other hand, the gate electrode is formed according to the marker formed on the substrate. The gate insulating film is formed to cover the gate electrode, and the amorphous semiconductor film is formed to contact with the gate insulating film. After an amorphous semiconductor film is formed on a substrate, the substrate, on which the amorphous semiconductor film has been formed, is set in the laser apparatus.

On the basis of inputted information concerning the masks, the computer determines each portion to be scanned with laser lights with reference to the positions of the markers. Then, with reference to the formed markers, the laser lights are irradiated onto the portion to be scanned with the laser lights, thereby partially crystallizing the semiconductor film.

Then, after the irradiation of the laser beams, a polycrystalline semiconductor film obtained by the irradiation of the laser beams is patterned and etched, thereby forming island-like semiconductor films. The timing of patterning of the polycrystalline semiconductor film is possible to change appropriately according to the TFT design. Following this, there is performed a step for manufacturing a TFT from these island-like semiconductor films. The concrete step for manufacturing the TFT differs depending on the shape of the TFT. Representatively, however, a gate insulating film is formed and an impurity region is formed in the island-like semiconductor films. Then, an interlayer insulating film is formed so as to cover the island-like semiconductor film, and a contact hole is established in the interlayer insulating film. In this manner, there is obtained an exposed part of the impurity region. Then, wiring is formed on the interlayer insulating film so as to contact the impurity region through the contact hole.

The semiconductor fabricating device may be used to conduct not only steps from forming of the amorphous semiconductor film to the crystallization of the laser beam, but also steps from forming of the gate insulating film to the crystallization by the laser beam without exposing to the atmosphere in succession, or adding another steps in succession.

The structure of this embodiment may be implemented by combining freely with Embodiments 1 to 8.

Embodiment 10

Figure 41:
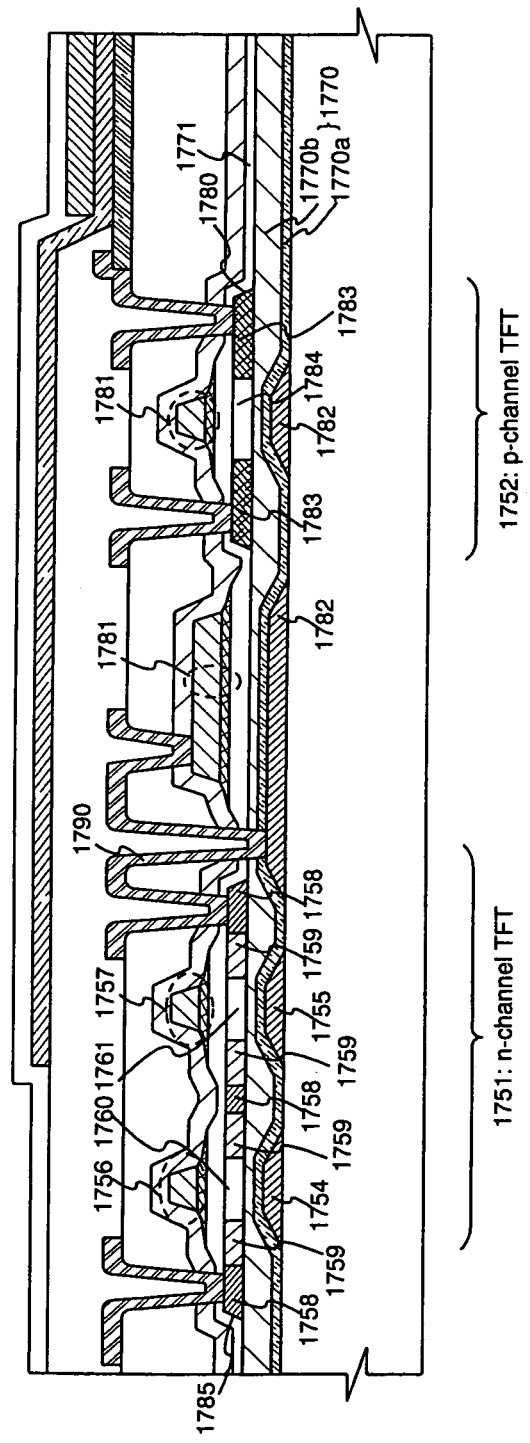
FIG. 41 shows a method of producing a light-emitting apparatus using a laser irradiation apparatus of the present invention.

In this embodiment, description is made on a construction of a pixel of a light emitting device fabricated by the semiconductor fabricating apparatus of the invention. FIG. 41 is a sectional view showing a pixel of the light emitting device according to the embodiment.

A reference numeral 1751 denotes an n-channel TFT whereas a numeral 1752 denotes a p-channel TFT. The n-channel TFT 1751 includes a semiconductor film 1753, a first insulating film 1770, first electrodes 1754, 1755, a second insulating film 1771, and second electrodes 1756, 1757. The semiconductor film 1753 includes a one-conductive type impurity region of a first concentration 1758, a one-conductive type impurity region of a second concentration 1759, and channel forming regions 1760, 1761.

The first electrodes 1754, 1755 and the channel forming regions 1760, 1761 are in stacked relation with the first insulating film 1770 interposed therebetween. The second electrodes 1756, 1757 and the channel forming regions 1760, 1761 are in stacked relation with the second insulating film 1771 interposed therebetween.

The p-channel TFT 1752 includes a semiconductor film 1780, the first insulating film 1770, a first electrode 1782, the second insulating film 1771, and a second electrode 1781. The semiconductor film 1780 includes a one-conductive type impurity region of a third concentration 1783, and a channel forming region 1784.

The first electrode 1782 and the channel forming region 1784 are in stacked relation with the first insulating film 1770 interposed therebetween. The second electrode 1781 and the channel forming region 1784 are in stacked relation with the second insulating film 1771 interposed therebetween.

The first electrode 1782 and the second electrode 1781 are electrically interconnected via a wiring 1790.

The semiconductor fabricating apparatus of the invention may be used in the steps of forming, crystallizing and activating the semiconductor films 1785, 1780 and other processes using laser annealing.

According to the embodiment, the TFT (the n-channel TFT 1751 in this embodiment), used as a switching device, applies a constant voltage to the first electrode. The application of the constant voltage to the first electrode is effective to reduce the variations of threshold as compared with an arrangement including a single electrode and to reduce OFF current.

In the TFT (the p-channel TFT 1752 in this embodiment) conducting a greater current than the TFT used as the switching device, the first electrode and the second electrode are electrically interconnected. The application of the same voltage to the first and second electrodes provides quick propagation of a depletion layer just as in a semiconductor film decreased in thickness, thus resulting in a decreased subthreshold voltage swing and an enhanced field effect mobility. Therefore, the TFT achieves a greater on current than a TFT including a single electrode. Hence, the use of the TFT of this structure in a drive circuit leads to a decreased drive voltage. Furthermore, the achievement of the increased on current permits the size reduction (channel width, in particular) of the TFT. This leads to an increased packaging density.

Figure 42:
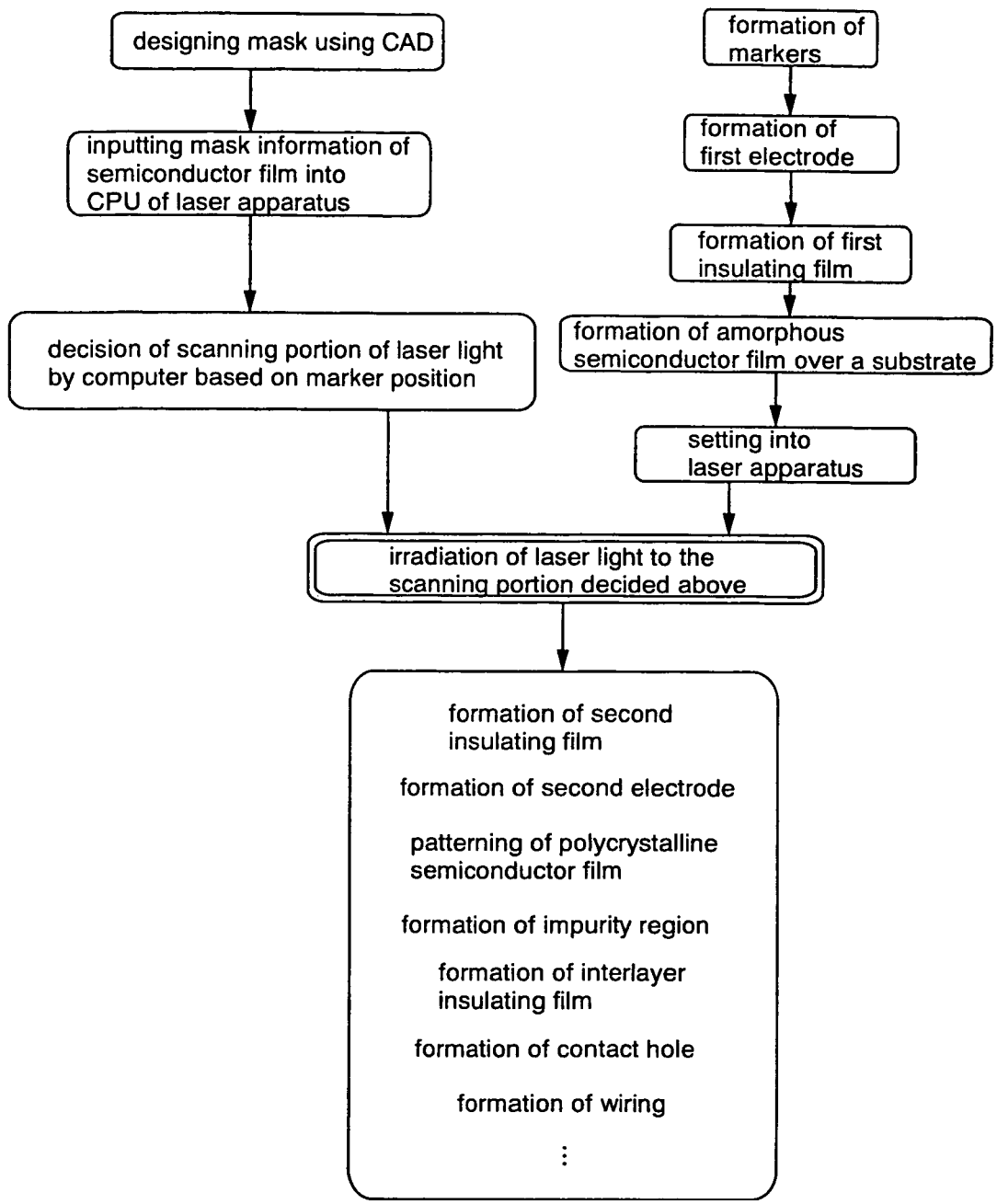
FIG. 42 shows a production flow of the present invention.

FIG. 42 is a flow chart showing the steps of fabricating a light emitting device according to the invention. First, a semiconductor device is designed by means of a CAD. Then, information indicative of a configuration of a patterning mask for the designed semiconductor film is inputted to the computer of the laser irradiation equipment.

On the other hand, first electrodes are formed based on markers formed on the substrate. In this process, the first electrodes may be formed in parallel with the markers. Subsequently, a first insulating film is formed in a manner to cover the first electrodes. Then an amorphous semiconductor film is formed in contacting relation with the first insulating film. After the formation of the amorphous semiconductor film on the substrate, the substrate formed with the amorphous semiconductor film is loaded on the laser irradiation equipment.

According to the mask information inputted to the computer, the computer defines an area to be scanned with the laser light with reference to the position of the markers. With reference to the formed markers, the laser light is irradiated on the area to be scanned for local crystallization of the semiconductor film.

The laser irradiation is followed by sequential formation of a second insulating film and second electrodes. The polycrystalline semiconductor film formed by the laser irradiation is patterned and etched thereby forming semiconductor film islands. A timing at which the polycrystalline semiconductor film is patterned may properly be changed according to the TFT design. In the subsequent steps, TFTs are formed from the semiconductor film islands. Although specific steps may vary depending upon the configurations of the TFTs, the steps typically include: forming impurity regions in the semiconductor film islands; forming an interlayer insulating film in a manner to cover the second insulating film and the second electrodes; forming contact holes in the interlayer insulating film for partially exposing the impurity regions; and laying a wiring on the interlayer insulating film in a manner to establish contact with the impurity regions via the contact holes.

Instead of being used only for the formation of the amorphous semiconductor film and the irradiation of the laser light for crystallization, the semiconductor fabricating apparatus of the invention may be used in the process between the formation of the first insulating film and the formation of the second insulating film such that these steps may be sequentially performed without exposure to the atmosphere. Furthermore, the inventive apparatus may be operated for sequential performance of the above steps and other steps.

It is noted that this embodiment may be implemented in combination with any one of Embodiments 1 to 9.

Embodiment 11

This embodiment illustrates an example where the semiconductor device of the invention is used for forming a drive circuit (signal line drive circuit or scanning line drive circuit) which is mounted on a pixel portion formed from an amorphous semiconductor film by way of TAB or COG.

Figure 43A:
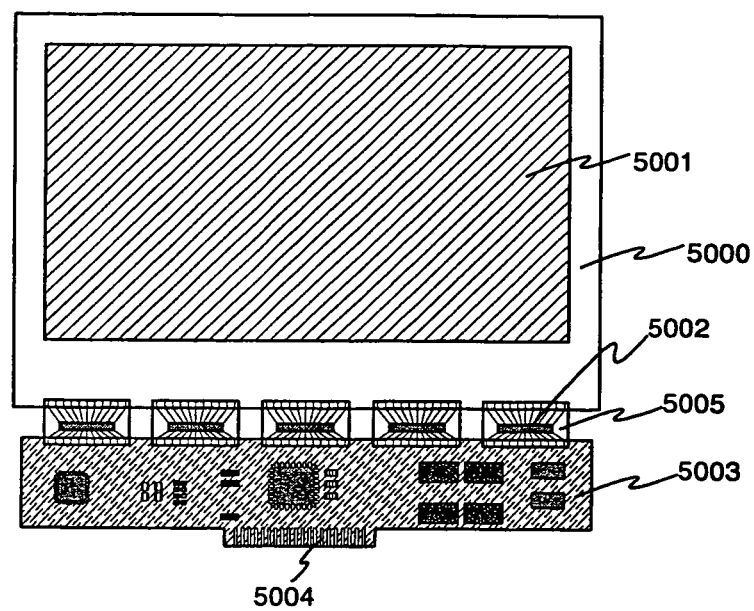
FIGS. 43A and 43B each show a state where a driving circuit is implemented on a panel.

FIG. 43A illustrates an example where a drive circuit is mounted on TAB, which is used for interconnecting a pixel portion and a printed wiring board formed with an external controller and the like. A pixel portion 5001 is formed on a glass substrate 5000 and is connected with a drive circuit 5002 via a TAB 5005, the drive circuit fabricated by the semiconductor fabricating apparatus of the invention. The drive circuit 5002 is also connected with a printed wiring board 5003 via the TAB 5005. The printed wiring board 5003 is provided with a terminal 5004 for connection with an external interface.

Figure 43B:
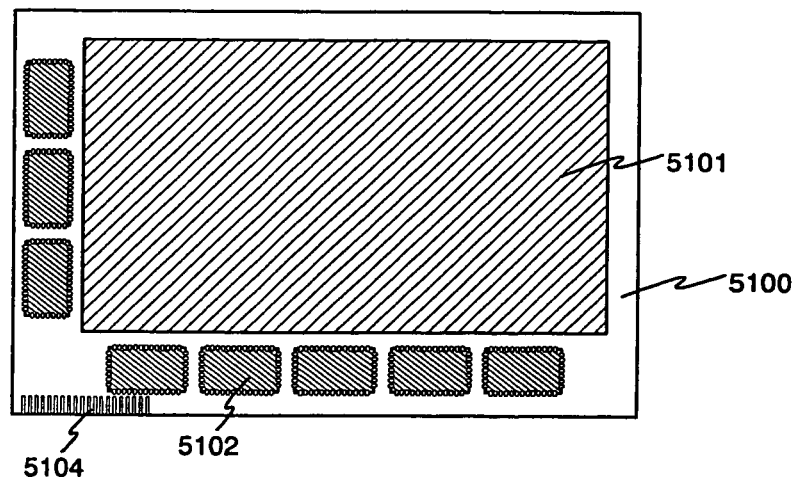

FIG. 43B illustrates an example where a drive circuit and a pixel portion are mounted by way of COG. A pixel portion 5101 is formed on a glass substrate 5100, on which a drive circuit 5102 fabricated by the semiconductor fabricating apparatus of the invention is mounted. The substrate 5100 is further provided with a terminal 5104 for connection with an external interface.

The TFT fabricated by the semiconductor fabricating apparatus of the invention is further enhanced in the crystallinity of the channel forming region and hence, is capable of high speed operation. Thus, the TFT is more suitable for forming the drive circuit required of a faster operation than the pixel portion. In addition, a higher yield can be achieved by separately fabricating the pixel portion and the drive circuit.

It is noted that this embodiment may be implemented in combination with any one of Embodiments 1 to 10.

Embodiment 12

In this embodiment, there will be described a relation between (i) the distance between the centers of respective laser beams and (ii) an energy density, in the case where the laser beams are made to overlap each other. Note that in order to make it easier to understand the explanation, a case where no slit is provided will be described.

Figure 45:
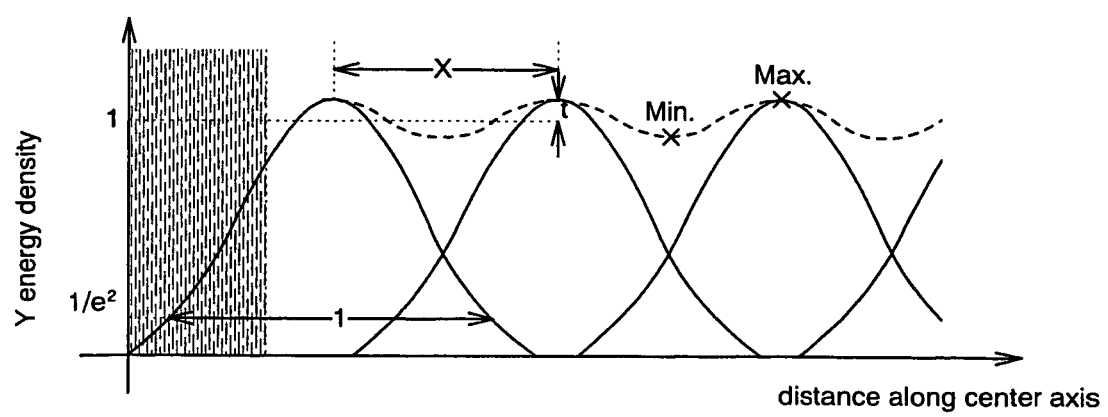
FIG. 45 shows a distribution of an energy density of beam spots made to overlap each other in the center axis direction.

In FIG. 45, the distribution of the energy density of each beam spot in the center axis direction is shown using a solid line and the distribution of the energy density of a beam spot obtained by synthesizing the beam spots is shown using a broken line. In general, the value of the energy density of a beam spot in the center axis direction is pursuant to the Gaussian distribution.

Figure 46:
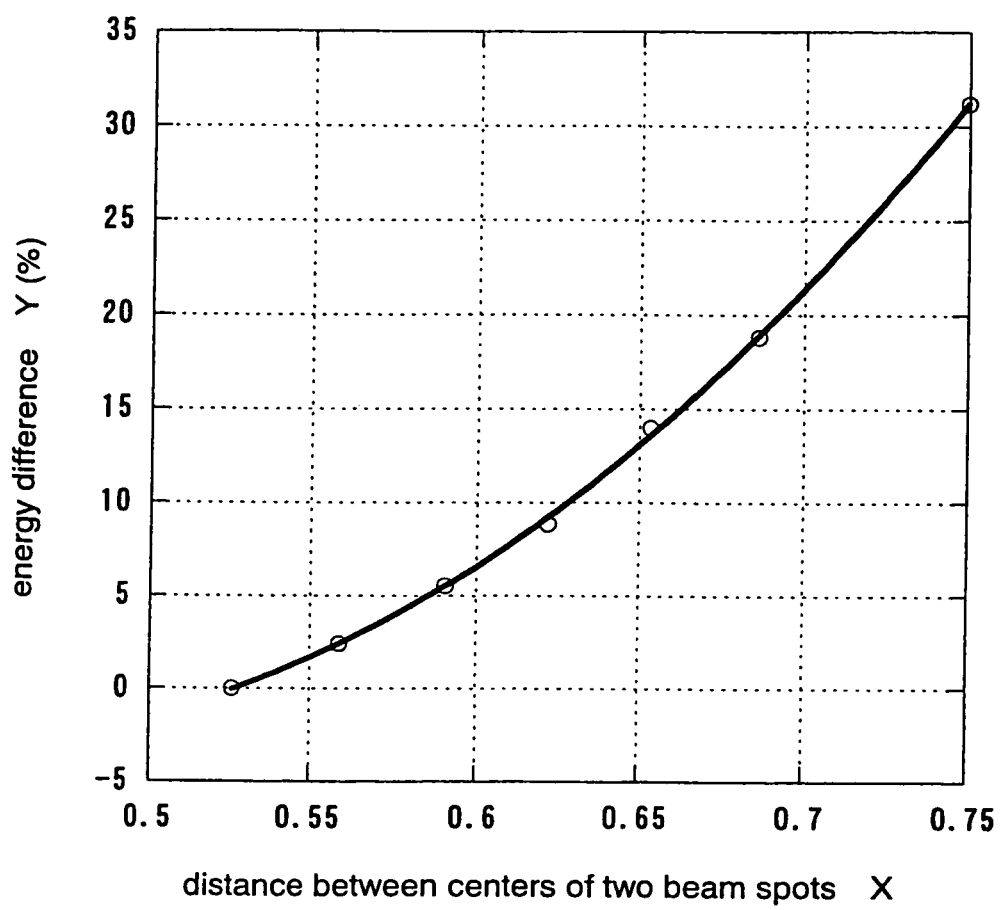
FIG. 46 shows a relation between the distance between centers of beam spots and an energy difference.

As to each beam spot before the synthesizing, it is assumed that the distance in the center axis direction at which an energy density of $1/e^2$ or higher of a peak value is satisfied is set as "1" and the distance between respective peaks is referred to as "X". Also, as to the laser beam after the synthesizing, peak values after the synthesizing and an increased amount of the peak values from the average value of valley values are referred to as "Y". A relation between "X" and "Y" obtained through a simulation is shown in FIG. 46. Note that in FIG. 46, "Y" is expressed on a percentage basis.

It is possible to express an energy difference Y in FIG. 46 using Formula 3 given below that is an approximate expression.

$$Y = 60 - 293X + 340X^2 \quad (X \text{ is larger one of two solutions}) \quad \text{[Formula 3]}$$

It can be seen from Formula 3 that in the case where it is desired to set the energy difference at around 5%, for instance, it is sufficient that "X" is set almost equal to 0.584. It is ideal that "Y" becomes equal to zero. In this case, however, the lengths of beam spots are shortened, so that it is preferable that "X" is determined with consideration given to the balance with throughput.

Figure 47:
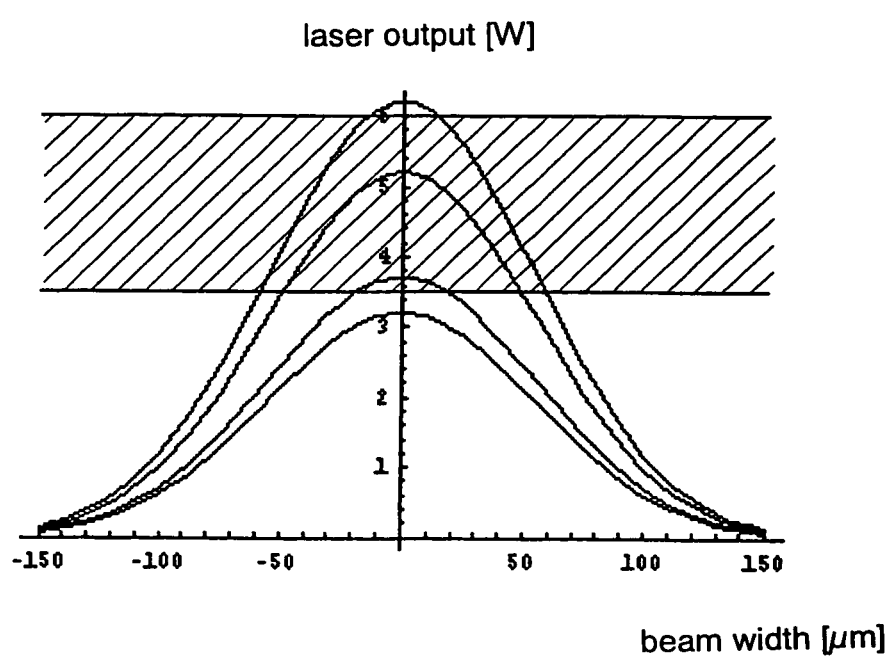
FIG. 47 shows the distribution of an output energy of a beam spot in the center axis direction.

Next, there will be described a permissible range of "Y". In FIG. 47, there is shown the distribution of the output (W) of a $YVO_4$ laser with respect to its beam width in the center axis direction in the case where its beam spot has an elliptic shape. The region specified by sloped lines is a range of the output energy that is necessary to obtain favorable crystallinity and it can be seen that it is sufficient that the output energy of synthesized laser lights falls within a range of from 3.5 to 6 W.

When the maximum value and the minimum value of the output energy of the beam spot after the synthesizing barely fall within the output energy range that is necessary to obtain the favorable crystallinity, the energy difference Y, with which it is possible to obtain the favorable crystallinity, is maximized. As a result, in the case shown in FIG. 47, the energy difference Y becomes ±26.3% and it can be seen that the favorable crystallinity is obtained if the energy difference "Y" falls within the range described above.

It should be noted here that the range of the output energy that is necessary to obtain the favorable crystallinity varies depending on the range of crystallinity that is judged as favorable. Also, the distribution of the output energy varies depending on the shape of the beam spot, so that the permissible range of the energy difference Y is not necessarily limited to the value described above. A designer is required to determine the range of the output energy that is necessary to obtain the favorable crystallinity as appropriate and to set the permissible range of the energy difference Y from the distribution of the output energy of a laser used.

It is possible to implement this embodiment in combination with the first to eleventh embodiments.

Embodiment 13

Given as embodiments of electric equipment employing a semiconductor device formed by the laser apparatus of the present invention is applied are: a video camera; a digital camera; a goggle type display (head mounted display); a navigation system; an audio reproducing device (car audio, an audio component, and the like); a laptop computer; a game machine; a portable information terminal (a mobile computer, a cellular phone, a portable game machine, an electronic book, etc.); and an image reproducing device equipped with a recording medium (specifically, a device equipped with a display device which can reproduce a recording medium such as a digital versatile disk (DVD), and can display the image). Specific examples of the electric equipment are shown in FIGS. 44A to 44H.

Figure 44A:
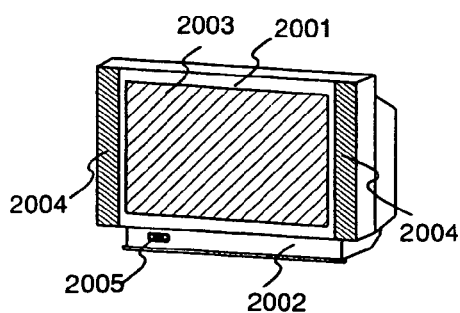
FIGS. 44A to 44H each show electronic equipment that use a semiconductor device of the present invention.

FIG. 44A shows a display device, which comprises a casing 2001, a supporting base 2002, a display portion 2003, speaker portions 2004, a video input terminal 2005, etc. The light emitting device formed by the present invention is applied can be used for the display portion 2003. The semiconductor device is self-luminous and does not need a backlight, so that it can make a thinner display portion than liquid display devices can. The term display device includes every display device for displaying information such as one for a personal computer, one for receiving TV broadcasting, and one for advertisement.

Figure 44B:
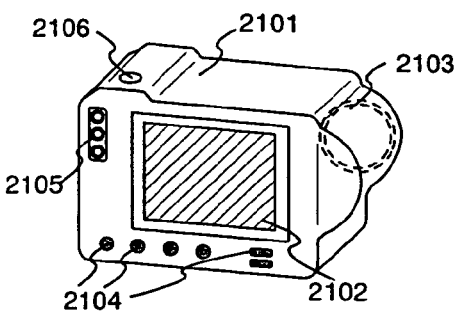

FIG. 44B shows a digital still camera, which comprises a main body 2101, a display portion 2102, an image receiving portion 2103, operation keys 2104, an external connection port 2105, a shutter 2106, etc. The light emitting device formed by the present invention is applied can be used for the display portion 2102, and other circuits.

Figure 44C:
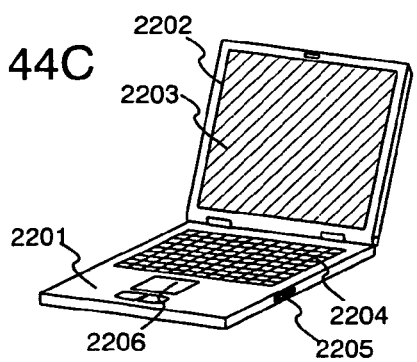

FIG. 44C shows a laptop computer, which comprises a main body 2201, a casing 2202, a display portion 2203, a keyboard 2204, an external connection port 2205, a pointing mouse 2206, etc. The light emitting device formed by the present invention is applied can be used for the display portion 2203, and other circuits.

Figure 44D:
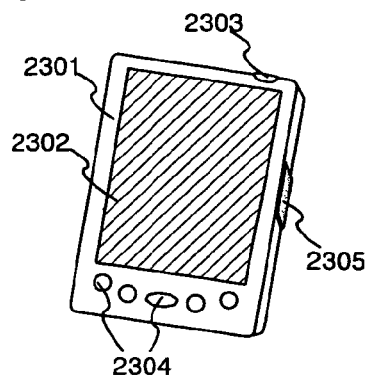

FIG. 44D shows a mobile computer, which comprises a main body 2301, a display portion 2302, a switch 2303, operation keys 2304, an infrared ray port 2305, etc. The light emitting device formed by the present invention is applied can be used for the display portion 2302, and other circuits.

Figure 44E:
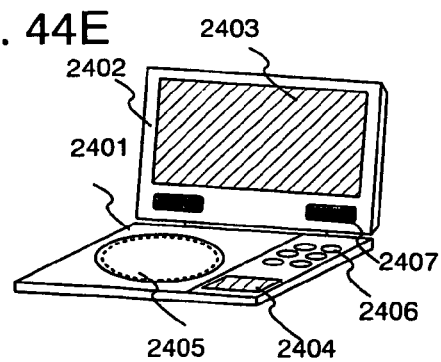

FIG. 44E shows a portable image reproducing device equipped with a recording medium (a DVD player, to be specific). The device comprises a main body 2401, a casing 2402, a display portion A 2403, a display portion B 2404, a recording medium (DVD or the like) reading portion 2405, operation keys 2406, speaker portions 2407, etc. The display portion A 2403 mainly displays image information whereas the display portion B 2404 mainly displays text information. The light emitting device formed by the present invention is applied can be used for the display portions A 2403 and B 2404, and other circuits. The term image reproducing device equipped with a recording medium includes domestic game machines.

Figure 44F:
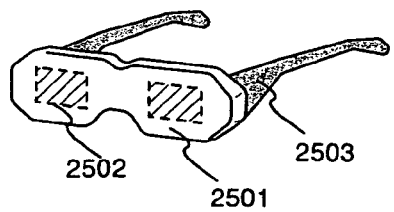

FIG. 44F shows a goggle type display (head mounted display), which comprises a main body 2501, display portions 2502, and arm portions 2503. The light emitting device formed by the present invention is applied can be used for the display portions 2502, and other circuits.

Figure 44G:
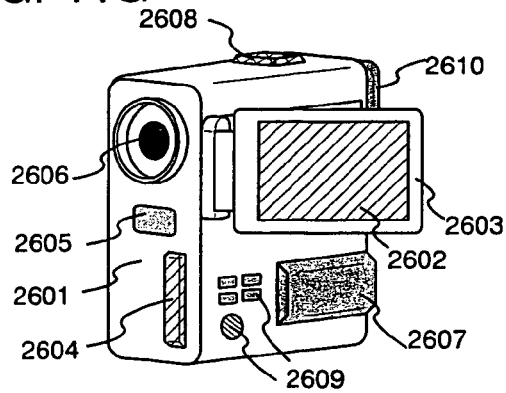

FIG. 44G shows a video camera, which comprises a main body 2601, a display portion 2602, a casing 2603, an external connection port 2604, a remote control receiving portion 2605, an image receiving portion 2606, a battery 2607, an audio input portion 2608, operation keys 2609, eyepiece portion 2610 etc. The light emitting device formed by the present invention is applied can be used for the display portion 2602, and other circuits.

Figure 44H:
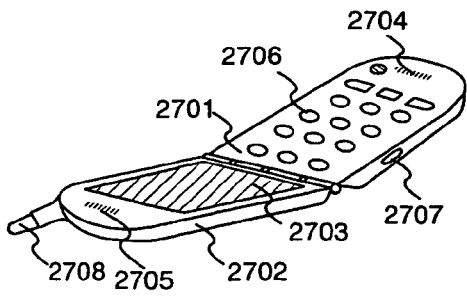

FIG. 44H shows a portable telephone, which comprises a main body 2701, a casing 2702, a display portion 2703, an audio input portion 2704, an audio output portion 2705, operation keys 2706, an external connection port 2707, an antenna 2708, etc. The light emitting device formed by the present invention is applied can be used for the display portion 2703, and other circuits. If the display portion 2703 displays white characters on a black background, power consumption of the cellular phone can be reduced.

The light emitting device can be used also in a front or rear projector besides above-mentioned electronic apparatuses.

As described above, the application range of the light emitting device to which the present invention is applied is very wide and electric equipment of every field can employ the device. The electric equipments in this embodiment may use any configuration of semiconductor devices shown in Embodiments 1 to 12.

Embodiment 14

The construction of a pixel of a light-emitting apparatus of the present invention will be described with reference to FIG. 49.

Figure 49:
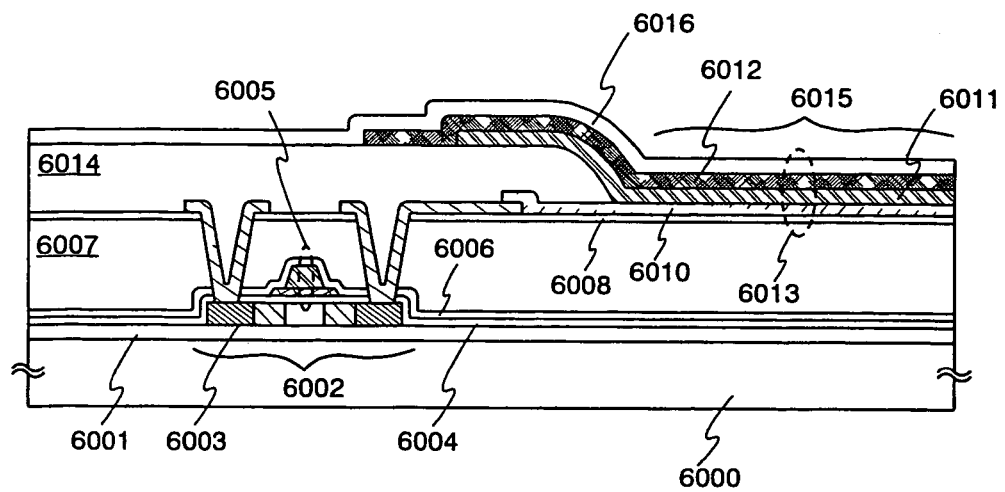
FIG. 49 is a cross-sectional view of a light-emitting apparatus produced using a laser apparatus of the present invention.

In FIG. 49, a base film 6001 is formed on a substrate 6000 and a transistor 6002 is formed on this base film 6001. The transistor 6002 includes an active layer 6003, a gate electrode 6005, and a gate insulating film 6004 sandwiched between the active layer 6003 and the gate electrode 6005.

It is preferable that a polycrystalline semiconductor film is used as the active layer 6003 and it is possible to form this polycrystalline semiconductor film using the laser irradiation apparatus of the present invention.

It should be noted here that the active layer may be formed using silicon germanium, in addition to silicon. In the case where the silicon germanium is used, it is preferable that the concentration of germanium is set at around 0.01 to 4.5 atomic %. Also, there may be used silicon to which carbon nitride has been added.

Also, it is possible to use a silicon oxide film, a silicon nitride film, or a silicon oxynitride film as the gate insulating film 6004. Also, it is possible to use a film obtained by laminating these films (a film obtained by laminating an SiN film on an $SiO_2$ film, for instance) as the gate insulating film. Also, when the $SiO_2$ film is used, TEOS (Tetraethyl Orthosilicate) is mixed with $O_2$ using a plasma CVD method and discharging is performed at an reaction pressure of 40 Pa, a substrate temperature of 300 to 400° C., a high frequency (13.56 MHz), and an electric power density of 0.5 to 0.8 $W/cm^2$, thereby forming a silicon oxide film. The silicon oxide film produced in this manner is converted into the gate insulating film through thermal annealing at 400 to 500° C. performed afterward. In this manner, it is possible to obtain favorable characteristics. Also, it is possible to use an aluminum nitride film as the gate insulating film. Aluminum nitride has relatively high heat conductivity and makes it possible to effectively diffuse heat generated by a TFT. Also, after a silicon oxide film, a silicon oxynitride film, or the like that does not contain aluminum is formed, an aluminum nitride film may be laminated on this film and a resultant film may be used as the gate insulating film. Also, an $SiO_2$ film formed with an RF sputtering method, whose target is Si, may be used as the gate insulating film.

Also, the gate electrode 6005 is formed using an element selected from the group consisting of Ta, W, Ti, Mo, Al, and Cu. Alternatively, the gate electrode 6005 is formed using an alloy material or a compound material whose main ingredient is the element described above. Also, there may be used a semiconductor film typified by a polycrystalline silicon film doped with an impurity element such as phosphorus. Also, in place of a single-layer conductive film, there may be used a conductive film obtained by laminating a plurality of layers.

For instance, it is preferable that a multi-layer conductive film is formed using a combination where a first conductive film is formed using tantalum nitride (TaN) and a second conductive film is formed using W, a combination where the first conductive film is formed using tantalum nitride (TaN) and the second conductive film is formed using Ti, a combination where the first conductive film is formed using tantalum nitride (TaN) and the second conductive film is formed using Al, or a combination where the first conductive film is formed using tantalum nitride (TaN) and the second conductive film is formed using Cu. Also, a semiconductor film typified by a polycrystalline silicon film doped with an impurity element, such as phosphorous, or an AgPdCu alloy may be used as the first conductive film and the second conductive film.

Also, the present invention is not limited to the two-layer construction and there may be used a three-layer construction where a tungsten film, an alloy (Al—Si) film of aluminum and silicon, and a titanium nitride film are laminated in succession, for instance. Also, in the case where the three-layer construction is used, a tungsten nitride film may be used in place of the tungsten film, an alloy film (Al—Ti) of aluminum and titanium may be used in place of the alloy (Al—Si) film of aluminum and silicon, and a titanium film may be used in place of the titanium nitride film.

It should be noted here that it is important that an optimum etching method and an optimum kind of etchant are selected as appropriate according to the materials of the conductive films.

Also, the transistor 6002 is covered with a first interlayer insulating film 6006, and a second interlayer insulating film 6007 and a third interlayer insulating film 6008 are laminated on the first interlayer insulating film 6006.

As the first interlayer insulating film 6006, it is possible to use a single-layer film that is a silicon oxide film, a silicon nitride film, or a silicon oxynitride film produced using a plasma CVD method or a sputtering method. Alternatively, it is possible to use a multi-layer film obtained by laminating them. Also, as the first interlayer insulating film 6006, there may be used a film obtained by laminating a silicon oxynitride film, in which the mole fraction of nitrogen is higher than that of oxygen, on a silicon oxynitride film in which the mole fraction of oxygen is higher than that of nitrogen.

It should be noted here that when a heating treatment (heat treatment at 300 to 550° C. for 1 to 12 hours) is performed after the formation of the first interlayer insulating film 6006, it becomes possible to terminate (hydrogenate) the dangling bonds of a semiconductor contained in the active layer 6003 with hydrogen contained in the first interlayer insulating film 6006.

Also, it is possible to use a non-photosensitive acrylic film as the second interlayer insulating film 6007.

As the third interlayer insulating film 6008, there is used a film that is resistant to permeating of a material (such as moisture or oxygen) which will accelerate the degradation of a light-emitting element, in comparison with other insulating films. Representatively, it is preferable that there is used a DLC film, a carbon nitride film, or a silicon nitride film formed using an RF sputtering method, for instance.

Also, in FIG. 49, reference numeral 6010 denotes an anode, numeral 6011 an electroluminescence layer, and numeral 6012 a cathode, with a portion in which the anode 6010, the electroluminescence layer 6011, and the cathode 6012 overlap each other corresponding to a light-emitting element 6013. The transistor 6002 is a driving transistor that controls a current supplied to the light-emitting element 6013 and is connected to the light-emitting element 6013 in series directly or via another circuit element.

The electroluminescence layer 6011 has a construction where a light-emitting layer is solely used or a construction where a plurality of layers including a light-emitting layer are laminated.

The anode 6010 is formed on the third interlayer insulating film 6008. Also, an organic resin film 6014 used as a partition wall is formed on the third interlayer insulating film 6008. The organic resin film 6014 has an opening portion 6015, and the anode 6010, the electroluminescence layer 6011, and the cathode 6012 are made to overlap each other in the opening portion, thereby forming the light-emitting element 6013.

In addition, a protective film 6016 is formed on the organic resin film 6014 and the cathode 6012. As this protective film 6016, like in the case of the third interlayer insulating film 6008, there is used a film that is resistant to the permeating of a material (such as moisture or oxygen) which will accelerate the degradation of the light-emitting element, in comparison with other insulating films. Representatively, it is preferable that there is used a DLC film, a carbon nitride film, or a silicon nitride film formed with an RF sputtering method, for instance. Also, as the protective film, there may be used a film obtained by laminating the aforementioned film that is resistant to the permeating of a material, such as moisture or oxygen, on a film that is less resistant to the permeating of the material such as moisture or oxygen in comparison with the resistant film.

Also, before the formation of the electroluminescence layer 6011, the organic resin film 6014 is heated under a vacuum atmosphere in order to remove adsorbed moisture, oxygen, or the like. In more detail, a heating treatment is performed under a vacuum atmosphere at 100 to 200° C. for around 0.5 to 1 hour. Preferably, the pressure is set at $3\times10^{-7}$ Torr or below and, if possible, it is the most preferable that the pressure is set at $3\times10^{-8}$ Torr or below. In addition, in the case where the electroluminescence layer is formed after the heating treatment is performed on the organic resin film under the vacuum atmosphere, it becomes possible to further enhance reliability by maintaining the organic resin film under the vacuum atmosphere until immediately before the formation of the electroluminescence layer.

Also, it is preferable that the end portions of the opening portion 6015 of the organic resin film 6014 are rounded off in order to prevent a situation where a hole is opened in the electroluminescence layer 6011, which has been formed so as to partially overlap the organic resin film 6014, at these end portions. In more detail, it is preferable that the radius of curvature of a curve drawn by the cross section of the organic resin film at the opening portion is around 0.2 to 2 μm.

With the construction described above, it becomes possible to obtain favorable coverage concerning the electroluminescence layer and the cathode formed in later steps and to prevent a situation where a short circuit between the anode 6010 and the cathode 6012 occurs in a hole formed in the electroluminescence layer 6011. Also, by alleviating the stress of the electroluminescence layer 6011, it becomes possible to reduce a defect called "shrinkage" whereby the area of a light-emitting region is reduced, and to enhance reliability.

It should be noted here that FIG. 49 shows an example where an acrylic resin film having positive type photosensitivity is used as the organic resin film 6014. There are two types of photosensitive organic resin: a positive type where each portion exposed with an energy line of light, an electron, or an ion will be removed; and a negative type where each exposed portion will be left. In the present invention, there may be used an organic resin film of the negative type. Also, the organic resin film 6014 may be formed using photosensitive polyimide.

In the case where the organic resin film 6014 is formed using acrylic of the negative type, the end portions of the opening portion 6015 have a cross section with an S shape. It is preferable that the radius of curvature of a curve between the upper end portion and the lower end portion of the opening portion is set at 0.2 to 2 μm in this case.

It is possible to use a transparent conductive film as the anode 6010. In addition to ITO, there may be used a transparent conductive film produced by mixing 2 to 20% of zinc oxide (ZnO) to indium oxide. In FIG. 49, ITO is used as the anode 6010. This anode 6010 may be polished with a CMP method and be subjected to wiping/cleaning that uses a polyvinyl-alcohol-based porous body (Bellclean cleaning), thereby flattening the surface of the anode 6010. Also, after the polishing with the CMP method, the surface of the anode 6010 may be subjected to the irradiation of ultraviolet rays, oxygen plasma processing, or the like.

Also, it is possible to form the cathode 6012 using a publicly known another material so long as it is possible to obtain a conductive film with a small work function. For instance, it is preferable that there is used Ca, Al, CaF, MgAg, AlLi, or the like.

It should be noted here that FIG. 49 shows a construction where light emitted from the light-emitting element is irradiated on the substrate 6000 side, although the light-emitting device may have a construction where the light is directed toward a side opposite to the substrate.

Also, the transistor 6002 and the anode 6010 of the light-emitting element are connected to each other in FIG. 49, although the present invention is not limited to this construction. For instance, the transistor 6002 and the cathode 6001 of the light-emitting element may be connected to each other. In this case, the cathode is formed on the third interlayer insulating film 6008 using TiN or the like.

It should be noted here that it is preferable that in actual cases, after there is obtained a semiconductor device under the state shown in FIG. 49, this semiconductor device is further packaged (sealed) using a protective film (laminated film, ultraviolet curing resin film, or the like) that is high in air tightness and achieves less degassing or using a translucent cover material, thereby preventing the exposure to the outside air. When doing so, if the inside of the cover material is placed under an inert atmosphere or a hygroscopic material (barium oxide, for instance) is provided inside thereof, the reliability of an OLED is improved.

It should be noted here that the present invention is not limited to the production method described above and it is possible to perform the production with a publicly known method. Also, it is possible to freely combine this embodiment with the Embodiments 1 to 13.

In the present invention, laser lights are not scanned and irradiated onto the entire surface of a semiconductor film but are scanned so that at least each indispensable portion is crystallized to a minimum. With the construction described above, it becomes possible to save a time taken to irradiate the laser lights onto each portion to be removed through patterning after the crystallization of the semiconductor film, which makes it possible to significantly shorten a time taken to process one substrate.

Also, by having a plurality of laser lights overlap each other and having the laser lights complement each other in each portion having a low energy density, it becomes possible to enhance the crystallinity of a semiconductor film with efficiency in comparison with a case where the plurality of laser lights are not made to overlap each other and are used independently of each other.

It should be noted here that in the embodiments described above, there has been described a case where laser lights oscillated from a plurality of laser oscillation apparatuses are synthesized and used, although the present invention is not necessarily limited to this construction. It is possible to solely use one laser oscillation apparatus if the output energy of the laser oscillation apparatus is relatively high and it is possible to obtain an energy density having a desired value without reducing the area of its beam spot. Note that even in this case, by using the slit, it becomes possible to shield each portion of the laser light where the energy density is low, and to control the width of the beam spot in accordance with pattern information.

What is claimed is:

1. A manufacturing method for a semiconductor device comprising:
    forming a semiconductor film over a substrate;
    outputting a plurality of laser lights from a plurality of laser oscillation apparatuses;
    forming a first beam spot by partially overlapping beam spots of the plurality of laser lights;
    controlling a width of a slit by a computer;

cutting a low energy density of the first beam spot by the slit;
scanning the semiconductor film with the first beam spot in a first direction;
scanning the semiconductor film with a second beam spot in a second direction after the scanning in the first direction, and
wherein the first direction is set perpendicular to the second direction,
wherein the first direction is set parallel to a direction in which carriers move in channel formation regions in a thin film transistors, and
wherein the first beam spot is scanned after cutting the low energy density of the first beam spot to a region of the semiconductor film determined by a pattern information.

2. A manufacturing method for a semiconductor device according to claim 1, wherein the first beam spots of the plurality of laser lights are partially overlapped so that centers of the first beam spots draws a straight line on the semiconductor film.

3. A manufacturing method for a semiconductor device according to claim 1, wherein cutting the low energy density of first beam spot by the slit is performed after the overlapping.

4. A manufacturing method for a semiconductor device according to claim 1, wherein the laser oscillation apparatuses use at least one kind of laser selected from the group consisting of a YAG laser, a YVO$_4$ laser, a YLF laser, a YAlO$_3$ laser, a glass laser, a ruby laser, an alexandrite laser, a Ti:sapphire laser, and a Y$_2$O$_3$ laser.

5. A manufacturing method for a semiconductor device according to claim 1, further comprising synchronizing the slit and the plurality of laser oscillation apparatuses.

6. A manufacturing method for a semiconductor device according to claim 1, wherein the laser lights are continuous-oscillation laser lights.

7. A manufacturing method for a semiconductor device according to claim 1, wherein the laser lights are the second harmonic.

8. A manufacturing method for a semiconductor device according to claim 1, wherein the scanning direction and the center axis of the first beam spot are set vertical to each other.

9. A manufacturing method for a semiconductor device comprising:
forming a semiconductor film over a substrate;
outputting a plurality of laser lights from a plurality of laser oscillation apparatuses;
forming a first beam spot by partially overlapping beam spots of the plurality of laser lights;
controlling a width of a slit by a computer;
cutting a low energy density of the first beam spot by the slit;
scanning the semiconductor film with the first beam spot in a first direction;
scanning the semiconductor film with a second beam spot in a second direction after the scanning in the first direction, and
enhancing crystallinity in a region determined by a pattern information by scanning the first beam spot on the region of the semiconductor film determined by the pattern information, and
wherein the first direction is set perpendicular to the second direction,
wherein the first direction is set parallel to a direction in which carriers move in channel formation regions in a thin film transistors, and
wherein the first beam spot is scanned after cutting the low energy density of the beam spot to a region of the semiconductor film determined by the pattern information.

10. A manufacturing method for a semiconductor device according to claim 9, wherein the first beam spots of the plurality of laser lights are partially overlapped so that centers of the first beam spots draws a straight line on the semiconductor film.

11. A manufacturing method for a semiconductor device according to claim 9, wherein cutting the low energy density of first beam spot by the slit is performed after the overlapping.

12. A manufacturing method for a semiconductor device according to claim 9, wherein the laser oscillation apparatuses use at least one kind of laser selected from the group consisting of a YAG laser, a YVO$_4$ laser, a YLF laser, a YAlO$_3$ laser, a glass laser, a ruby laser, an alexandrite laser, a Ti:sapphire laser, and a Y$_2$O$_3$ laser.

13. A manufacturing method for a semiconductor device according to claim 9, further comprising synchronizing the slit and the plurality of laser oscillation apparatuses.

14. A manufacturing method for a semiconductor device according to claim 9, wherein the laser lights are continuous-oscillation laser lights.

15. A manufacturing method for a semiconductor device according to claim 9, wherein the laser lights are the second harmonic.

16. A manufacturing method for a semiconductor device according to claim 9, wherein the scanning direction and the center axis of the first beam spot are set vertical to each other.

17. A manufacturing method for a semiconductor device comprising:
forming a semiconductor film over a substrate;
outputting a plurality of laser lights from a plurality of laser oscillation apparatuses;
forming a first beam spot by partially overlapping beam spots of the plurality of laser lights;
controlling a width of a slit by a computer;
cutting a low energy density of the first beam spot by the slit;
scanning the semiconductor film with the first beam spot in a first direction;
scanning the semiconductor film with a second beam spot in a second direction after the scanning in the first direction, and
enhancing crystallinity in a region determined by a pattern information by scanning the first beam spot on the region of the semiconductor film determined by the pattern information; and
forming an island-like semiconductor film having crystallinity by patterning the region, in which the crystallinity has been enhanced, using the pattern information, and
wherein the first direction is set perpendicular to the second direction,
wherein the first direction is set parallel to a direction in which carriers move in channel formation regions in a thin film transistors, and
wherein the beam spot is scanned after cutting the low energy density of the first beam spot to a region of the semiconductor film determined by the pattern information.

18. A manufacturing method for a semiconductor device according to claim 17, wherein the first beam spots of the plurality of laser lights are partially overlapped so that centers of the first beam spots draws a straight line on the semiconductor film.

19. A manufacturing method for a semiconductor device according to claim 17, wherein cutting the low energy density of first beam spot by the slit is performed after the overlapping.

20. A manufacturing method for a semiconductor device according to claim 17, wherein the laser oscillation apparatuses use at least one kind of laser selected from the group consisting of a YAG laser, a $YVO_4$ laser, a YLF laser, a $YAlO_3$ laser, a glass laser, a ruby laser, an alexandrite laser, a Ti:sapphire laser, and a $Y_2O_3$ laser.

21. A manufacturing method for a semiconductor device according to claim 17, further comprising synchronizing the slit and the plurality of laser oscillation apparatuses.

22. A manufacturing method for a semiconductor device according to claim 17, wherein the laser lights are continuous-oscillation laser lights.

23. A manufacturing method for a semiconductor device according to claim 17, wherein the laser lights are the second harmonic.

24. A manufacturing method for a semiconductor device according to claim 17, wherein the scanning direction and the center axis of the first beam spot are set vertical to each other.

25. A manufacturing method for a semiconductor device according to claim 1, wherein the semiconductor film is amorphous silicon film.

26. A manufacturing method for a semiconductor device according to claim 9, wherein the semiconductor film is amorphous silicon film.

27. A manufacturing method for a semiconductor device according to claim 17, wherein the semiconductor film is amorphous silicon film.

* * * * *